United States Patent
Moore et al.

(10) Patent No.: US 11,518,096 B2
(45) Date of Patent: Dec. 6, 2022

(54) THREE-DIMENSIONAL PRINTING WITH BUILD PLATES HAVING SURFACE TOPOLOGIES FOR INCREASING PERMEABILITY AND RELATED METHODS

(71) Applicant: Carbon, Inc., Redwood City, CA (US)

(72) Inventors: David Moore, San Carlos, CA (US); John R. Tumbleston, Menlo Park, CA (US); Edward T. Samulski, Chapel Hill, NC (US); Alexander Ermoshkin, Chapel Hill, NC (US); Jason P. Rolland, San Carlos, CA (US); Ariel M. Herrmann, San Francisco, CA (US); Bob E. Feller, Mountain View, CA (US)

(73) Assignee: Carbon, Inc., Redwood City, CA (US)

( * ) Notice: Subject to any disclaimer, the term of this patent is extended or adjusted under 35 U.S.C. 154(b) by 25 days.

(21) Appl. No.: 17/150,102

(22) Filed: Jan. 15, 2021

(65) Prior Publication Data

US 2021/0162665 A1    Jun. 3, 2021

Related U.S. Application Data

(63) Continuation of application No. 14/994,853, filed on Jan. 13, 2016, now abandoned.
(Continued)

(51) Int. Cl.
*B29C 64/245*    (2017.01)
*B29C 64/20*    (2017.01)
(Continued)

(52) U.S. Cl.
CPC ............ *B29C 64/245* (2017.08); *B29C 64/20* (2017.08); *B29C 64/124* (2017.08);
(Continued)

(58) Field of Classification Search
CPC ..... B29C 64/20; B29C 64/245; B29C 64/124; B29C 64/129; B29C 64/135; B33Y 30/00; G03F 7/70416
See application file for complete search history.

(56) References Cited

U.S. PATENT DOCUMENTS

| 4,133,310 | A | | 1/1979 | Lloyd et al. | |
|---|---|---|---|---|---|
| 5,122,441 | A | * | 6/1992 | Lawton | B29C 64/129 430/394 |

(Continued)

FOREIGN PATENT DOCUMENTS

| EP | 0484086 A1 | 5/1992 | |
|---|---|---|---|
| EP | 1134068 A2 | 9/2001 | |
| WO | WO-2014126834 A2 * | 8/2014 | ............... A61F 2/82 |

OTHER PUBLICATIONS

Avery-Dennison, "Pressure sensitive adhesives", 2011, all pages; https://label.averydennison.com/content/dam/averydennison/lpm-responsive/europe/english/documents/product-overviews/purpose/innovation/rc-na-purpose-innovation-adhesive-overview.pdf (Year: 2011).

(Continued)

*Primary Examiner* — Jerzi H Moreno Hernandez
(74) *Attorney, Agent, or Firm* — Myers Bigel, P.A.

(57) ABSTRACT

A build plate for a three-dimensional printer includes: a rigid, optically transparent, gas-impermeable planar base having an upper surface and a lower surface; and a flexible, optically transparent, gas-permeable sheet having an upper and lower surface, the sheet upper surface comprising a build surface for forming a three-dimensional object, the sheet lower surface positioned on the base upper surface. The build plate includes a gas flow enhancing feature configured to increase gas flow to the build surface.

22 Claims, 39 Drawing Sheets

Related U.S. Application Data

(60) Provisional application No. 62/205,181, filed on Aug. 14, 2015, provisional application No. 62/109,983, filed on Jan. 30, 2015, provisional application No. 62/110,014, filed on Jan. 30, 2015, provisional application No. 62/106,421, filed on Jan. 22, 2015, provisional application No. 62/102,861, filed on Jan. 13, 2015.

(51) Int. Cl.
  B29C 64/124 (2017.01)
  B33Y 30/00 (2015.01)
  B29C 35/08 (2006.01)
  G03F 7/20 (2006.01)

(52) U.S. Cl.
  CPC ....... *B29C 2035/0855* (2013.01); *B33Y 30/00* (2014.12); *G03F 7/70416* (2013.01)

(56) References Cited

U.S. PATENT DOCUMENTS

| | | |
|---|---|---|
| 5,294,487 A | 3/1994 | Ohashi et al. |
| 5,447,822 A | 9/1995 | Hull et al. |
| 5,529,473 A | 6/1996 | Lawton et al. |
| 5,545,367 A | 8/1996 | Bae et al. |
| 6,900,055 B1 | 5/2005 | Clayson et al. |
| 8,243,358 B2 * | 8/2012 | Wen ................ H01B 1/22 359/288 |
| 8,534,797 B2 | 9/2013 | Law et al. |
| 8,636,826 B2 | 1/2014 | Curello et al. |
| 9,120,270 B2 | 9/2015 | Chen et al. |
| 9,636,873 B2 | 5/2017 | Joyce |
| 9,782,934 B2 | 10/2017 | Willis et al. |
| 11,020,898 B2 * | 6/2021 | Moore ................ B29C 64/129 |
| 11,220,051 B2 * | 1/2022 | Feller ................ B29C 64/124 |
| 2002/0015610 A1 * | 2/2002 | Beehler ................ B41J 2/185 400/701 |
| 2007/0025878 A1 | 2/2007 | Abe et al. |
| 2007/0063389 A1 | 3/2007 | John |
| 2011/0089610 A1 | 4/2011 | El-Siblani et al. |
| 2012/0195994 A1 | 8/2012 | El-Siblani et al. |
| 2013/0037993 A1 | 2/2013 | Chen et al. |
| 2013/0089744 A1 | 4/2013 | McKnight et al. |
| 2013/0292862 A1 | 11/2013 | Joyce |
| 2013/0295212 A1 | 11/2013 | Chen et al. |
| 2014/0126205 A1 | 5/2014 | Davis et al. |
| 2014/0361463 A1 | 12/2014 | Desimone et al. |
| 2015/0034007 A1 | 2/2015 | Fischer et al. |
| 2015/0064298 A1 | 3/2015 | Syao |
| 2015/0102532 A1 * | 4/2015 | DeSimone ............ B29C 64/135 264/401 |
| 2015/0231831 A1 * | 8/2015 | El-Siblani ............. B33Y 30/00 425/150 |
| 2015/0360419 A1 * | 12/2015 | Willis ................ B29C 64/135 425/174.4 |
| 2016/0041135 A1 * | 2/2016 | Lannutti ............ G01N 31/225 436/136 |
| 2016/0193786 A1 | 7/2016 | Moore et al. |
| 2019/0193285 A1 | 6/2019 | Adachi |
| 2022/0016838 A1 * | 1/2022 | Feller ................ B29C 64/129 |

OTHER PUBLICATIONS

Gajasinghe, R.W.R.L., et al., "Experimental study of PDMS bonding to various substrates for monolithic microfluidic applications", 2014, Journal of Micromechanics and Microengineering 24.7: 075010, all pages. (Year: 2014); https://iopscience.iop.org/article/10,1088/0960-1317/24/7/075010/pdf.

\* cited by examiner

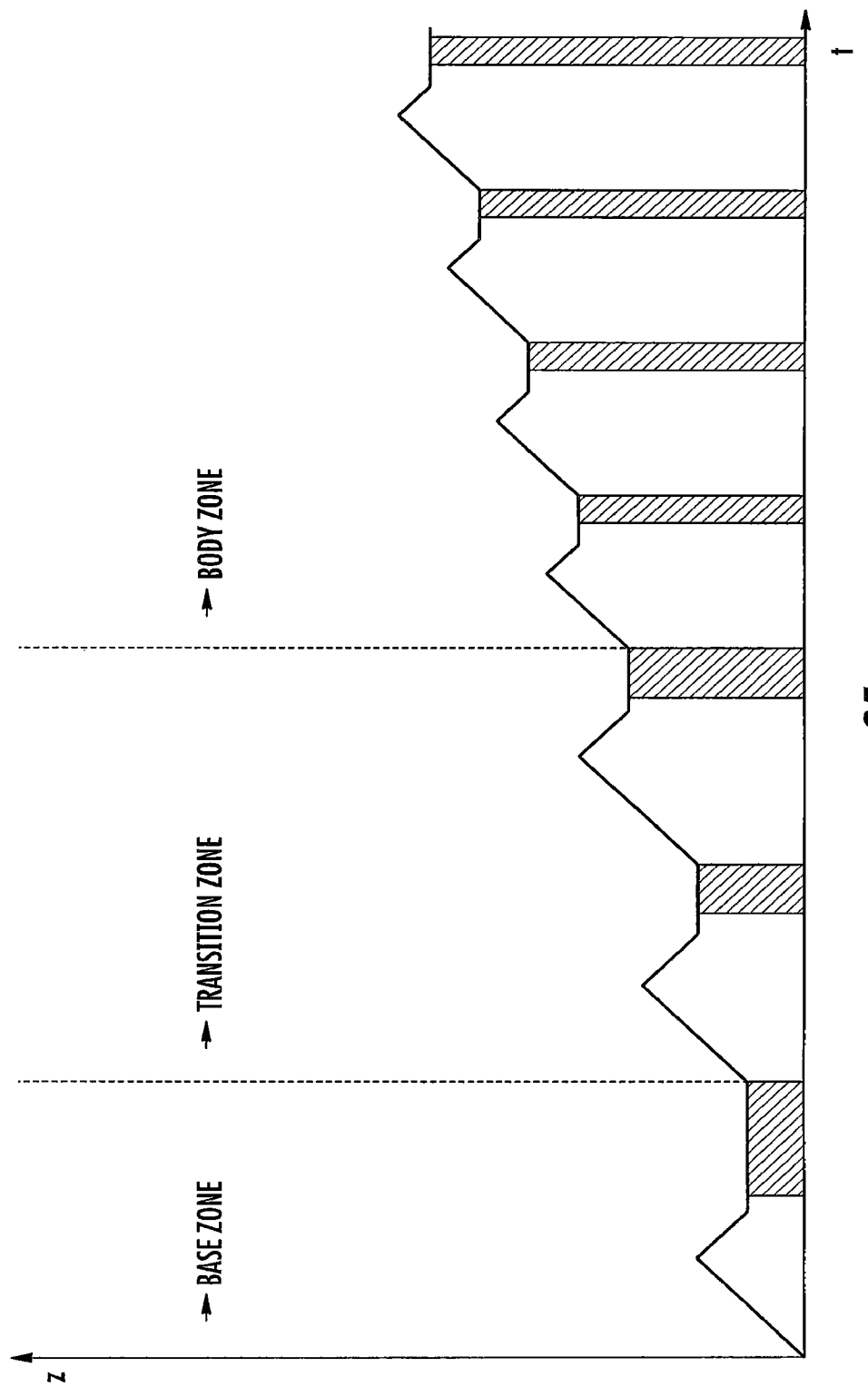

THREE-DIMENSIONAL PRINTING WITH BUILD PLATES HAVING SURFACE TOPOLOGIES FOR INCREASING PERMEABILITY AND RELATED METHODS

RELATED APPLICATIONS

This application is a continuation of U.S. patent application Ser. No. 14/994,853 filed Jan. 13, 2016 which claims priority to U.S. Provisional Patent Application Ser. No. 62/102,840 filed Jan. 13, 2015; 62/102,861 filed Jan. 13, 2015; 62/106,421 filed Jan. 22, 2015; 62/109,983 filed Jan. 30, 2015; 62/110,014 filed Jan. 30, 2015 and 62/205,181 filed Aug. 14, 2015, the disclosures of each of which are incorporated by reference herein in their entireties.

FIELD OF THE INVENTION

The present invention concerns methods and apparatus for the fabrication of solid three-dimensional objects from liquid materials.

BACKGROUND OF THE INVENTION

In conventional additive or three-dimensional fabrication techniques, construction of a three-dimensional object is performed in a step-wise or layer-by-layer manner. In particular, layer formation is performed through solidification of photo curable resin under the action of visible or UV light irradiation. Two techniques are known: one in which new layers are formed at the top surface of the growing object; the other in which new layers are formed at the bottom surface of the growing object.

If new layers are formed at the top surface of the growing object, then after each irradiation step the object under construction is lowered into the resin "pool," a new layer of resin is coated on top, and a new irradiation step takes place. An early example of such a technique is given in Hull, U.S. Pat. No. 5,236,637, at FIG. 3. A disadvantage of such "top down" techniques is the need to submerge the growing object in a (potentially deep) pool of liquid resin and reconstitute a precise overlayer of liquid resin.

If new layers are formed at the bottom of the growing object, then after each irradiation step the object under construction must be separated from the bottom plate in the fabrication well. An early example of such a technique is given in Hull, U.S. Pat. No. 5,236,637, at FIG. 4. While such "bottom up" techniques hold the potential to eliminate the need for a deep well in which the object is submerged by instead lifting the object out of a relatively shallow well or pool, a problem with such "bottom up" fabrication techniques, as commercially implemented, is that extreme care must be taken, and additional mechanical elements employed, when separating the solidified layer from the bottom plate due to physical and chemical interactions therebetween. For example, in U.S. Pat. No. 7,438,846, an elastic separation layer is used to achieve "non-destructive" separation of solidified material at the bottom construction plane. Other approaches, such as the B9Creator™ 3-dimensional printer marketed by B9Creations of Deadwood, S. Dak., USA, employ a sliding build plate. See, e.g., M. Joyce, US Patent App. 2013/0292862 and Y. Chen et al., US Patent App. 2013/0295212 (both Nov. 7, 2013); see also Y. Pan et al., *J. Manufacturing Sci. and Eng.* 134, 051011-1 (October 2012). Such approaches introduce a mechanical step that may complicate the apparatus, slow the method, and/or potentially distort the end product.

Continuous processes for producing a three-dimensional object are suggested at some length with respect to "top down" techniques in U.S. Pat. No. 7,892,474, but this reference does not explain how they may be implemented in "bottom up" systems in a manner non-destructive to the article being produced. Accordingly, there is a need for alternate methods and apparatus for three-dimensional fabrication that can obviate the need for mechanical separation steps in "bottom-up" fabrication.

SUMMARY OF THE INVENTION

Described herein are methods, systems and apparatus (including associated control methods, systems and apparatus), for the production of a three-dimensional object by additive manufacturing. In preferred (but not necessarily limiting) embodiments, the method is carried out continuously. In preferred (but not necessarily limiting) embodiments, the three-dimensional object is produced from a liquid interface. Hence they are sometimes referred to, for convenience and not for purposes of limitation, as continuous liquid interface (or interphase) production (or printing), that is, "CLIP" herein (the various phrasings being used interchangeably). A schematic representation of one embodiment thereof is given in FIG. 1 herein.

In some embodiments, a build plate for a three-dimensional printer includes: a rigid, optically transparent, gas-impermeable planar base having an upper surface and a lower surface; and a flexible, optically transparent, gas-permeable sheet having an upper and lower surface, the sheet upper surface comprising a build surface for forming a three-dimensional object, the sheet lower surface positioned on the base upper surface. The build plate includes a gas flow enhancing feature configured to increase gas flow to the build surface.

In some embodiments, the sheet is adhered to the planar base by the adhesive layer.

In some embodiments, the gas flow enhancing feature comprises the channel layer that defines channels therein. The channel layer may be gas permeable.

In some embodiments, the channel layer comprises a permeable material such as a permeable polymer (e.g., poly(dimethylsiloxane) (PDMS).

In some embodiments, the channel layer defines channels on a bottom surface opposite the adhesive.

In some embodiments, the channel layer is adhered to the base by chemical bonding including oxidative treatments, including oxygen plasma treatments, UV ozone treatments and/or wet chemical treatments.

In some embodiments, the adhesive layer comprises a gas-permeable adhesive.

In some embodiments, the adhesive layer comprises a poly(dimethylsiloxane) (PDMS) film.

In some embodiments, the channel layer comprises a first material and the base comprises a second material that is different from the first material.

In some embodiments, the second material comprises sapphire, glass and/or quartz.

In some embodiments, the build plate further comprising an elastomeric layer between the channel layer and the base configured to increase an elasticity of the build surface.

In some embodiments, the permeable sheet and/or channel layer comprises a PDMS composite comprising fluorescent, oxygen-sensing particles for sensing oxygen.

In some embodiments, the permeable sheet, elastomeric layer and/or channel layer comprises a PDMS composite comprising electrically conductive particles for heating a portion of the build plate.

In some embodiments, the gas-permeable sheet lower surface has an uneven surface topology thereon.

In some embodiments, the gas flow enhancing feature comprises the adhesive layer and the adhesive layer is a patterned adhesive layer.

In some embodiments, the adhesive layer comprises droplets deposited on the base upper surface. The adhesive layer may include a series of strips deposited on the base upper surface that define channels between the base and the gas-permeable sheet. The adhesive layer may include a random or non-random pattern of adhesive regions.

In some embodiments, the gas flow enhancing feature comprises the sheet and the sheet has a plurality of channels therein that increase gas flow to the build surface.

In some embodiments, the channels are formed by laminating a first layer having a surface topology to a second layer such that the first and second layers together form the permeable sheet.

In some embodiments, the adhesive layer comprises a first adhesive layer on the base upper surface, and the gas flow enhancing feature comprises the channel layer. The channel layer is a mesh layer on the adhesive layer opposite the base. The build plate further includes a second gas permeable adhesive layer on the mesh layer opposite the base that adheres the sheet to the mesh layer.

In some embodiments, the mesh layer comprises a polyester screen mesh or a fiberglass fabric.

In some embodiments, the mesh layer is optically transparent.

In some embodiments, the mesh layer comprises fibers having a thickness of about 10-50 microns.

In some embodiments, a spacing or pitch between the fibers is between about 50-500 microns.

In some embodiments, a thickness of the sheet is less than about 150 µm.

In some embodiments, the base comprises sapphire, glass, quartz or polymer.

In some embodiments, the sheet comprises a fluoropolymer.

In some embodiments, a method of forming a three-dimensional object includes providing a carrier and an optically transparent member having a build surface, said carrier and said build surface defining a build region therebetween; filling said build region with a polymerizable liquid, continuously or intermittently irradiating said build region with light through said optically transparent member to form a solid polymer from said polymerizable liquid, continuously or intermittently advancing (e.g., sequentially or concurrently with said irradiating step) said carrier away from said build surface to form said three-dimensional object from said solid polymer, —wherein said optically transparent member comprises the build plate described above.

In some embodiments, the filling, irradiating, and/or advancing steps are carried out while also concurrently: (i) continuously maintaining a dead zone of polymerizable liquid in contact with said build surface, and (ii) continuously maintaining a gradient of polymerization zone between said dead zone and said solid polymer and in contact with each thereof, said gradient of polymerization zone comprising said polymerizable liquid in partially cured form.

In some embodiments, the carrier with the polymerized region adhered thereto is unidirectionally advanced away from said build surface on said stationary build plate.

In some embodiments, filling step further comprising vertically reciprocating said carrier with respect to said build surface to enhance or speed the refilling of said build region with said polymerizable liquid.

In some embodiments, an apparatus for forming a three-dimensional object from a polymerizable liquid, includes (a) a support; (b) a carrier operatively associated with said support on which carrier said three-dimensional object is formed; (c) an optically transparent member having a build surface, with said build surface and said carrier defining a build region therebetween; (d) a liquid polymer supply (e.g., a well) operatively associated with said build surface and configured to supply liquid polymer into said build region for solidification or polymerization; (e) a radiation source configured to irradiate said build region through said optically transparent member to form a solid polymer from said polymerizable liquid; (f) optionally at least one drive operatively associated with either said transparent member or said carrier; (g) a controller operatively associated with said carrier, and/or optionally said at least one drive, and said radiation source for advancing said carrier away from said build surface to form said three-dimensional object from said solid polymer wherein said optically transparent member comprises the build plate described above.

In some embodiments of the methods and compositions described above and below, the polymerizable liquid (or "dual cure resin") has a viscosity of 500 or 1,000 centipoise or more at room temperature and/or under the operating conditions of the method, up to a viscosity of 10,000, 20,000, or 50,000 centipoise or more, at room temperature and/or under the operating conditions of the method.

Non-limiting examples and specific embodiments of the present invention are explained in greater detail in the drawings herein and the specification set forth below. The disclosure of all United States Patent references cited herein are to be incorporated herein by reference in their entirety.

BRIEF DESCRIPTION OF THE DRAWINGS

FIG. 25 schematically illustrates the movement of the carrier (z) over time (t) in the course of fabricating a three-dimensional object by processes of the present invention through a first base (or "adhesion") zone, a second transition zone, and a third body zone.

DETAILED DESCRIPTION OF ILLUSTRATIVE EMBODIMENTS

Figure 1:
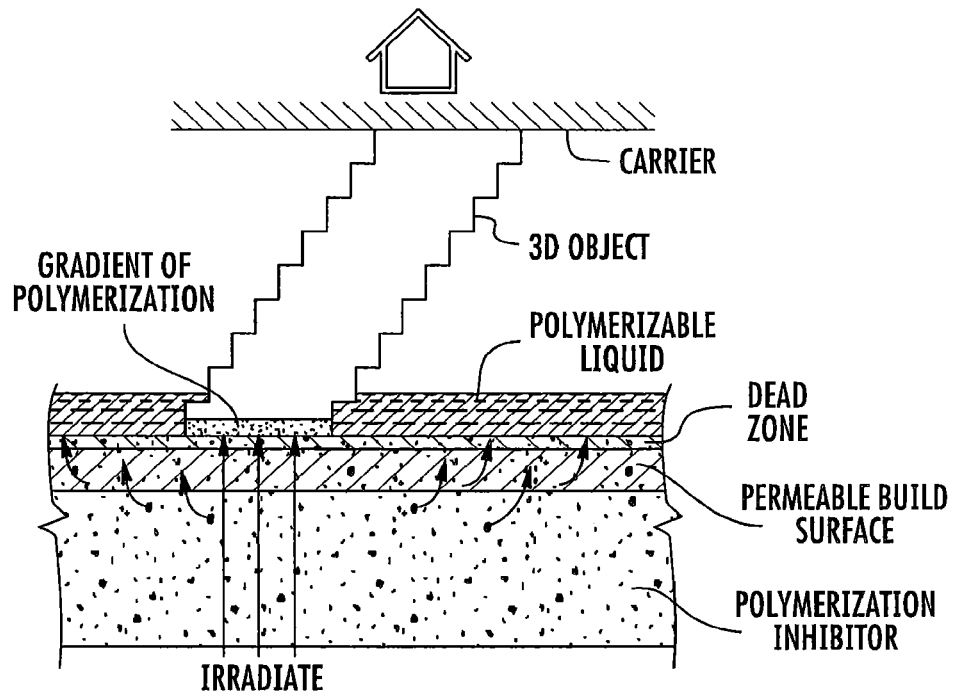
FIG. 1 is a schematic illustration of one embodiment of a method of the present invention.

The present invention is now described more fully hereinafter with reference to the accompanying drawings, in which embodiments of the invention are shown. This invention may, however, be embodied in many different forms and should not be construed as limited to the embodiments set forth herein; rather these embodiments are provided so that this disclosure will be thorough and complete and will fully convey the scope of the invention to those skilled in the art.

Like numbers refer to like elements throughout. In the figures, the thickness of certain lines, layers, components, elements or features may be exaggerated for clarity. Where used, broken lines illustrate optional features or operations unless specified otherwise.

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises" or "comprising," when used in this specification, specify the presence of stated features, integers, steps, operations, elements components and/or groups or combinations thereof, but do not preclude the presence or addition of one or more other features, integers, steps, operations, elements, components and/or groups or combinations thereof.

As used herein, the term "and/or" includes any and all possible combinations or one or more of the associated listed items, as well as the lack of combinations when interpreted in the alternative ("or").

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and claims and should not be interpreted in an idealized or overly formal sense unless expressly so defined herein. Well-known functions or constructions may not be described in detail for brevity and/or clarity.

It will be understood that when an element is referred to as being "on," "attached" to, "connected" to, "coupled" with, "contacting," etc., another element, it can be directly on, attached to, connected to, coupled with and/or contacting the other element or intervening elements can also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "adjacent" another feature can have portions that overlap or underlie the adjacent feature.

Spatially relative terms, such as "under," "below," "lower," "over," "upper" and the like, may be used herein for ease of description to describe an element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus the exemplary term "under" can encompass both an orientation of over and under. The device may otherwise be oriented (rotated 90 degrees or at other orientations) and the spatially relative descriptors used herein interpreted accordingly. Similarly, the terms "upwardly," "downwardly," "vertical," "horizontal" and the like are used herein for the purpose of explanation only, unless specifically indicated otherwise.

It will be understood that, although the terms first, second, etc., may be used herein to describe various elements, components, regions, layers and/or sections, these elements, components, regions, layers and/or sections should not be limited by these terms. Rather, these terms are only used to distinguish one element, component, region, layer and/or section, from another element, component, region, layer and/or section. Thus, a first element, component, region, layer or section discussed herein could be termed a second element, component, region, layer or section without departing from the teachings of the present invention. The sequence of operations (or steps) is not limited to the order presented in the claims or figures unless specifically indicated otherwise.

1. Polymerizable Liquids.

Any suitable polymerizable liquid can be used to enable the present invention. The liquid (sometimes also referred to as "liquid resin" "ink," or simply "resin" herein) can include a monomer, particularly photopolymerizable and/or free radical polymerizable monomers, and a suitable initiator such as a free radical initiator, and combinations thereof. Examples include, but are not limited to, acrylics, methacrylics, acrylamides, styrenics, olefins, halogenated olefins, cyclic alkenes, maleic anhydride, alkenes, alkynes, carbon monoxide, functionalized oligomers, multifunctional cure site monomers, functionalized PEGs, etc., including combinations thereof. Examples of liquid resins, monomers and initiators include but are not limited to those set forth in U.S. Pat. Nos. 8,232,043; 8,119,214; 7,935,476; 7,767,728; 7,649,029; WO 2012129968 A1; CN 102715751 A; JP 2012210408 A.

Acid catalyzed polymerizable liquids. While in some embodiments as noted above the polymerizable liquid comprises a free radical polymerizable liquid (in which case an inhibitor may be oxygen as described below), in other embodiments the polymerizable liquid comprises an acid catalyzed, or cationically polymerized, polymerizable liquid. In such embodiments the polymerizable liquid comprises monomers contain groups suitable for acid catalysis, such as epoxide groups, vinyl ether groups, etc. Thus suitable monomers include olefins such as methoxyethene, 4-methoxystyrene, styrene, 2-methylprop-1-ene, 1,3-butadiene, etc.; heterocycloic monomers (including lactones, lactams, and cyclic amines) such as oxirane, thietane, tetrahydrofuran, oxazoline, 1,3, dioxepane, oxetan-2-one, etc., and combinations thereof. A suitable (generally ionic or non-ionic) photoacid generator (PAG) is included in the acid catalyzed polymerizable liquid, examples of which include, but are not limited to onium salts, sulfonium and iodonium salts, etc., such as diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutylnaphthylsulfonium triflate, etc., including mixtures thereof. See, e.g., U.S. Pat. Nos. 7,824,839; 7,550,246; 7,534,844; 6,692,891; 5,374,500; and 5,017,461; see also Photoacid Generator Selection Guide for the electronics industry and energy curable coatings (BASF 2010).

Hydrogels. In some embodiments suitable resins includes photocurable hydrogels like poly(ethylene glycols) (PEG) and gelatins. PEG hydrogels have been used to deliver a variety of biologicals, including Growth factors; however, a great challenge facing PEG hydrogels crosslinked by chain growth polymerizations is the potential for irreversible protein damage. Conditions to maximize release of the biologicals from photopolymerized PEG diacrylate hydrogels can be enhanced by inclusion of affinity binding peptide sequences in the monomer resin solutions, prior to photopolymerization allowing sustained delivery. Gelatin is a biopolymer frequently used in food, cosmetic, pharmaceutical and photographic industries. It is obtained by thermal denaturation or chemical and physical degradation of collagen. There are three kinds of gelatin, including those found in animals, fish and humans. Gelatin from the skin of cold water fish is considered safe to use in pharmaceutical applications. UV or visible light can be used to crosslink appropriately modified gelatin. Methods for crosslinking gelatin include cure derivatives from dyes such as Rose Bengal.

Photocurable silicone resins. A suitable resin includes photocurable silicones. UV cure silicone rubber, such as Silopren™ UV Cure Silicone Rubber can be used as can LOCTITE™ Cure Silicone adhesives sealants. Applications include optical instruments, medical and surgical equipment, exterior lighting and enclosures, electrical connectors/sensors, fiber optics and gaskets.

Biodegradable resins. Biodegradable resins are particularly important for implantable devices to deliver drugs or for temporary performance applications, like biodegradable screws and stents (U.S. Pat. Nos. 7,919,162; 6,932,930). Biodegradable copolymers of lactic acid and glycolic acid (PLGA) can be dissolved in PEG dimethacrylate to yield a transparent resin suitable for use. Polycaprolactone and PLGA oligomers can be functionalized with acrylic or methacrylic groups to allow them to be effective resins for use.

Photocurable polyurethanes. A particularly useful resin is photocurable polyurethanes. A photopolymerizable polyurethane composition comprising (1) a polyurethane based on an aliphatic diisocyanate, poly(hexamethylene isophthalate glycol) and, optionally, 1,4-butanediol; (2) a polyfunctional acrylic ester; (3) a photoinitiator; and (4) an anti-oxidant, can be formulated so that it provides a hard, abrasion-resistant, and stain-resistant material (U.S. Pat. No. 4,337,130). Photocurable thermoplastic polyurethane elastomers incorporate photoreactive diacetylene diols as chain extenders.

High performance resins. In some embodiments, high performance resins are used. Such high performance resins may sometimes require the use of heating to melt and/or reduce the viscosity thereof, as noted above and discussed further below. Examples of such resins include, but are not limited to, resins for those materials sometimes referred to as liquid crystalline polymers of esters, ester-imide, and ester-amide oligomers, as described in U.S. Pat. Nos. 7,507,784; 6,939,940. Since such resins are sometimes employed as high-temperature thermoset resins, in the present invention they further comprise a suitable photoinitiator such as benzophenone, anthraquinone, and fluoroenone initiators (including derivatives thereof), to initiate cross-linking on irradiation, as discussed further below.

Additional example resins. Particularly useful resins for dental applications include EnvisionTEC's Clear Guide, EnvisionTEC's E-Denstone Material. Particularly useful resins for hearing aid industries include EnvisionTEC's e-Shell 300 Series of resins. Particularly useful resins include EnvisionTEC's HTM140IV High Temperature Mold Material for use directly with vulcanized rubber in molding/casting applications. A particularly useful material for making tough and stiff parts includes EnvisionTEC's RC31 resin. A particularly useful resin for investment casting applications includes EnvisionTEC's Easy Cast EC500.

Additional resin ingredients. The liquid resin or polymerizable material can have solid particles suspended or dispersed therein. Any suitable solid particle can be used, depending upon the end product being fabricated. The particles can be metallic, organic/polymeric, inorganic, or composites or mixtures thereof. The particles can be non-conductive, semi-conductive, or conductive (including metallic and non-metallic or polymer conductors); and the particles can be magnetic, ferromagnetic, paramagnetic, or nonmagnetic. The particles can be of any suitable shape, including spherical, elliptical, cylindrical, etc. The particles can comprise an active agent or detectable compound as described below, though these may also be provided dissolved solubilized in the liquid resin as also discussed below. For example, magnetic or paramagnetic particles or nanoparticles can be employed. The resin or polymerizable material may contain a dispersing agent, such as an ionic surfactant, a non-ionic surfactant, a block copolymer, or the like.

The liquid resin can have additional ingredients solubilized therein, including pigments, dyes, active compounds or pharmaceutical compounds, detectable compounds (e.g., fluorescent, phosphorescent, radioactive), etc., again depending upon the particular purpose of the product being fabricated. Examples of such additional ingredients include, but are not limited to, proteins, peptides, nucleic acids (DNA, RNA) such as siRNA, sugars, small organic compounds (drugs and drug-like compounds), etc., including combinations thereof.

Inhibitors of polymerization. Inhibitors or polymerization inhibitors for use in the present invention may be in the form of a liquid or a gas. In some embodiments, gas inhibitors are preferred. The specific inhibitor will depend upon the monomer being polymerized and the polymerization reaction. For free radical polymerization monomers, the inhibitor can conveniently be oxygen, which can be provided in the form of a gas such as air, a gas enriched in oxygen (optionally but in some embodiments preferably containing additional inert gases to reduce combustibility thereof), or in some embodiments pure oxygen gas. In alternate embodiments, such as where the monomer is polymerized by photoacid generator initiator, the inhibitor can be a base such as ammonia, trace amines (e.g. methyl amine, ethyl amine, di and trialkyl amines such as dimethyl amine, diethyl amine, trimethyl amine, triethyl amine, etc.), or carbon dioxide, including mixtures or combinations thereof.

Polymerizable liquids carrying live cells. In some embodiments, the polymerizable liquid may carry live cells as "particles" therein. Such polymerizable liquids are generally aqueous, and may be oxygenated, and may be considered as "emulsions" where the live cells are the discrete phase. Suitable live cells may be plant cells (e.g., monocot, dicot), animal cells (e.g., mammalian, avian, amphibian, reptile cells), microbial cells (e.g., prokaryote, eukaryote, protozoal, etc.), etc. The cells may be of differentiated cells from or corresponding to any type of tissue (e.g., blood, cartilage, bone, muscle, endocrine gland, exocrine gland, epithelial, endothelial, etc.), or may be undifferentiated cells such as stem cells or progenitor cells. In such embodiments the polymerizable liquid can be one that forms a hydrogel, including but not limited to those described in U.S. Pat. Nos. 7,651,683; 7,651,682; 7,556,490; 6,602,975; 5,836,313; etc.

2. Apparatus.

Figure 2:
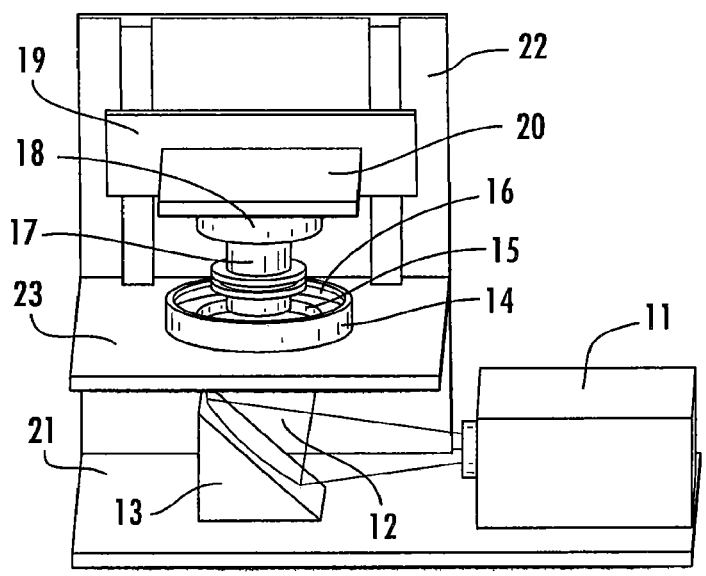
FIG. 2 is a perspective view of one embodiment of an apparatus of the present invention.

A non-limiting embodiment of an apparatus of the invention is shown in FIG. 2. It comprises a radiation source 11 such as a digital light processor (DLP) providing electromagnetic radiation 12 which though reflective mirror 13 illuminates a build chamber defined by wall 14 and a rigid build plate 15 forming the bottom of the build chamber, which build chamber is filled with liquid resin 16. The bottom of the chamber 15 is constructed of build plate comprising a semipermeable member as discussed further below. The top of the object under construction 17 is attached to a carrier 18. The carrier is driven in the vertical direction by linear stage 19, although alternate structures can be used as discussed below.

A liquid resin reservoir, tubing, pumps liquid level sensors and/or valves can be included to replenish the pool of liquid resin in the build chamber (not shown for clarity) though in some embodiments a simple gravity feed may be employed. Drives/actuators for the carrier or linear stage, along with associated wiring, can be included in accordance with known techniques (again not shown for clarity). The drives/actuators, radiation source, and in some embodiments pumps and liquid level sensors can all be operatively associated with a suitable controller, again in accordance with known techniques.

Build plates 15 used to carry out the present invention generally comprise or consist of a (typically rigid or solid, stationary, and/or fixed, but may also be flexible) semipermeable (or gas permeable) member, alone or in combination with one or more additional supporting substrates (e.g., clamps and tensioning members to rigidify an otherwise flexible semipermeable material). Additional build plate configurations are described with respect to FIGS. 30-49. The semipermeable member can be made of any suitable material that is optically transparent at the relevant wavelengths (or otherwise transparent to the radiation source, whether or not it is visually transparent as perceived by the human eye—i.e., an optically transparent window may in some embodiments be visually opaque), including but not limited to porous or microporous glass, and the rigid gas permeable polymers used for the manufacture of rigid gas permeable contact lenses. See, e.g., Norman G. Gaylord, US Patent No. RE31,406; see also U.S. Pat. Nos. 7,862,176; 7,344,731; 7,097,302; 5,349,394; 5,310,571; 5,162,469; 5,141,665; 5,070,170; 4,923,906; and 4,845,089. Other suitable oxygen-permeable materials may be used, including polyester, e.g., Mylar® from Dupont Tejjin Films, Chester, V.A., polyurethane, polyethelene, polychlorophene, mercapto ester-based resins, e.g., Norland 60, from Norland Optical Products, Inc., New Brunswich, N.J., porous Tygon® tubing from Saint-Gobain Performance Plastics, Mickleton, N.J., or other materials. Still other Exemplary oxygen-permeable materials are described in U.S. Pat. No. 7,709,544, the disclosure of which is incorporated herein by reference.

In some embodiments, suitable oxygen-permeable materials are characterized as glassy and/or amorphous polymers and/or substantially crosslinked that they are essentially non-swellable. Preferably the semipermeable member is formed of a material that does not swell when contacted to the liquid resin or material to be polymerized (i.e., is "non-swellable"). Suitable materials for the semipermeable member include amorphous fluoropolymers, such as those described in U.S. Pat. Nos. 5,308,685 and 5,051,115. For example, such fluoropolymers are particularly useful over silicones that would potentially swell when used in conjunction with organic liquid resin inks to be polymerized. For some liquid resin inks, such as more aqueous-based monomeric systems and/or some polymeric resin ink systems that have low swelling tendencies, silicone based window materials maybe suitable. The solubility or permeability of organic liquid resin inks can be dramatically decreased by a number of known parameters including increasing the crosslink density of the window material or increasing the molecular weight of the liquid resin ink. In some embodiments the build plate may be formed from a thin film or sheet of material which is flexible when separated from the apparatus of the invention, but which is clamped and tensioned when installed in the apparatus (e.g., with a tensioning ring) so that it is rendered fixed or rigid in the apparatus. Particular materials include TEFLON AF® fluoropolymers, commercially available from DuPont. Additional materials include perfluoropolyether polymers such as described in U.S. Pat. Nos. 8,268,446; 8,263,129; 8,158,728; and 7,435,495.

It will be appreciated that essentially all solid materials, and most of those described above, have some inherent "flex" even though they may be considered "rigid," depending on factors such as the shape and thickness thereof and environmental factors such as the pressure and temperature to which they are subjected. In addition, the terms "stationary" or "fixed" with respect to the build plate is intended to mean that no mechanical interruption of the process occurs, or no mechanism or structure for mechanical interruption of the process (as in a layer-by-layer method or apparatus) is provided, even if a mechanism for incremental adjustment of the build plate (for example, adjustment that does not lead to or cause collapse of the gradient of polymerization zone) is provided), or if the build surface contributes to reciprocation to aid feeding of the polymerizable liquid, as described further below.

The semipermeable member typically comprises a top surface portion, a bottom surface portion, and an edge surface portion. The build surface is on the top surface portion; and the feed surface may be on one, two, or all three of the top surface portion, the bottom surface portion, and/or the edge surface portion. In the embodiment illustrated in FIG. 2 the feed surface is on the bottom surface portion, but alternate configurations where the feed surface is provided on an edge, and/or on the top surface portion (close to but separate or spaced away from the build surface) can be implemented with routine skill.

The semipermeable member has, in some embodiments, a thickness of from 0.01, 0.1 or 1 millimeters to 10 or 100 millimeters, or more (depending upon the size of the item being fabricated, whether or not it is laminated to or in contact with an additional supporting plate such as glass, etc., as discussed further below.

The permeability of the semipermeable member to the polymerization inhibitor will depend upon conditions such as the pressure of the atmosphere and/or inhibitor, the choice of inhibitor, the rate or speed of fabrication, etc. In general, when the inhibitor is oxygen, the permeability of the semipermeable member to oxygen may be from 10 or 20 Barrers, up to 1000 or 2000 Barrers, or more. For example, a semipermeable member with a permeability of 10 Barrers used with a pure oxygen, or highly enriched oxygen, atmosphere under a pressure of 150 PSI may perform substantially the same as a semipermeable member with a permeability of 500 Barrers when the oxygen is supplied from the ambient atmosphere under atmospheric conditions.

Thus, the semipermeable member may comprise a flexible polymer film (having any suitable thickness, e.g., from 0.001, 0.01, 0.05, 0.1 or 1 millimeters to 1, 5, 10, or 100 millimeters, or more), and the build plate may further comprise a tensioning member (e.g., a peripheral clamp and an operatively associated strain member or stretching member, as in a "drum head"; a plurality of peripheral clamps, etc., including combinations thereof) connected to the polymer film and to fix and rigidify the film (e.g., at least sufficiently so that the film does not stick to the object as the object is advanced and resiliently or elastically rebound therefrom). The film has a top surface and a bottom surface, with the build surface on the top surface and the feed surface preferably on the bottom surface. In other embodiments, the semipermeable member comprises: (i) a polymer film layer (having any suitable thickness, e.g., from 0.001, 0.01, 0.1 or 1 millimeters to 5, 10 or 100 millimeters, or more), having a top surface positioned for contacting said polymerizable liquid and a bottom surface, and (ii) a rigid, gas permeable, optically transparent supporting member (having any suitable thickness, e.g., from 0.01, 0.1 or 1 millimeters to 10, 100, or 200 millimeters, or more), contacting said film layer bottom surface. The supporting member has a top surface contacting the film layer bottom surface, and the supporting member has a bottom surface which may serve as the feed surface for the polymerization inhibitor. Any suitable materials that permit the polymerization inhibitor to pass to the build surface may be used, including materials that are semipermeable (that is, permeable to the polymerization inhibitor). For example, the polymer film or polymer film layer may, for example, be a fluoropolymer film, such as an amorphous thermoplastic fluoropolymer like TEFLON AF 1600™ or TEFLON AF 2400™ fluoropolymer films, or perfluoropolyether (PFPE), particularly a crosslinked PFPE film, or a crosslinked silicone polymer film. The supporting member comprises a silicone or crosslinked silicone polymer member such as a polydmiethylxiloxane member, a rigid gas permeable polymer member, or glass member, including porous or microporous glass. Films can be laminated or clamped directly to the rigid supporting member without adhesive (e.g., using PFPE and PDMS materials), or silane coupling agents that react with the upper surface of a PDMS layer can be utilized to adhere to the first polymer film layer. UV-curable, acrylate-functional silicones can also be used as a tie layer between UV-curable PFPEs and rigid PDMS supporting layers.

When configured for placement in the apparatus, the carrier defines a "build region" on the build surface, within the total area of the build surface. Because lateral "throw" (e.g., in the X and/or Y directions) is not required in the present invention to break adhesion between successive layers, as in the Joyce and Chen devices noted previously, the area of the build region within the build surface may be maximized (or conversely, the area of the build surface not devoted to the build region may be minimized). Hence in some embodiments, the total surface area of the build region can occupy at least fifty, sixty, seventy, eighty, or ninety percent of the total surface area of the build surface.

As shown in FIG. 2, the various components are mounted on a support or frame assembly 20. While the particular design of the support or frame assembly is not critical and can assume numerous configurations, in the illustrated embodiment it is comprised of a base 21 to which the radiation source 11 is securely or rigidly attached, a vertical member 22 to which the linear stage is operatively associated, and a horizontal table 23 to which wall 14 is removably or securely attached (or on which the wall is placed), and with the build plate rigidly fixed, either permanently or removably, to form the build chamber as described above.

As noted above, the build plate can consist of a single unitary and integral piece of a rigid semipermeable member, or can comprise additional materials. For example, glass can be laminated or fixed to a rigid semipermeable material. Or, a semipermeable member as an upper portion can be fixed to a transparent lower member having purging channels formed therein for feeding gas carrying the polymerization inhibitor to the semipermeable member (through which it passes to the build surface to facilitate the formation of a release layer of unpolymerized liquid material, as noted above and below). Such purge channels may extend fully or partially through the base plate: For example, the purge channels may extend partially into the base plate, but then end in the region directly underlying the build surface to avoid introduction of distortion. Specific geometries will depend upon whether the feed surface for the inhibitor into the semipermeable member is located on the same side or opposite side as the build surface, on an edge portion thereof, or a combination of several thereof. Additional build plate configurations are described with respect to FIGS. 30-49.

Any suitable radiation source (or combination of sources) can be used, depending upon the particular resin employed, including electron beam and ionizing radiation sources. In a preferred embodiment the radiation source is an actinic radiation source, such as one or more light sources, and in particular one or more ultraviolet light sources. Any suitable light source can be used, such as incandescent lights, fluorescent lights, phosphorescent or luminescent lights, a laser, light-emitting diode, etc., including arrays thereof. The light source preferably includes a pattern-forming element operatively associated with a controller, as noted above. In some embodiments, the light source or pattern forming element comprises a digital (or deformable) micromirror device (DMD) with digital light processing (DLP), a spatial modulator (SLM), or a microelectromechanical system (MEMS) mirror array, a mask (aka a reticle), a silhouette, or a combination thereof. See, U.S. Pat. No. 7,902,526. Preferably the light source comprises a spatial light modulation array such as a liquid crystal light valve array or micromirror array or DMD (e.g., with an operatively associated digital light processor, typically in turn under the control of a suitable controller), configured to carry out exposure or irradiation of the polymerizable liquid without a mask, e.g., by maskless photolithography. See, e.g., U.S. Pat. Nos. 6,312,134; 6,248,509; 6,238,852; and 5,691,541.

In some embodiments, as discussed further below, there may be movement in the X and/or Y directions concurrently with movement in the Z direction, with the movement in the X and/or Y direction hence occurring during polymerization of the polymerizable liquid (this is in contrast to the movement described in Y. Chen et al., or M. Joyce, supra, which is movement between prior and subsequent polymerization steps for the purpose of replenishing polymerizable liquid). In the present invention such movement may be carried out for purposes such as reducing "burn in" or fouling in a particular zone of the build surface.

Because an advantage of some embodiments of the present invention is that the size of the build surface on the semipermeable member (i.e., the build plate or window) may be reduced due to the absence of a requirement for extensive lateral "throw" as in the Joyce or Chen devices noted above, in the methods, systems and apparatus of the present invention lateral movement (including movement in the X and/or Y direction or combination thereof) of the carrier and object (if such lateral movement is present) is preferably not more than, or less than, 80, 70, 60, 50, 40, 30, 20, or even 10 percent of the width (in the direction of that lateral movement) of the build region.

While in some embodiments the carrier is mounted on an elevator to advance up and away from a stationary build plate, on other embodiments the converse arrangement may be used: That is, the carrier may be fixed and the build plate lowered to thereby advance the carrier away therefrom. Numerous different mechanical configurations will be apparent to those skilled in the art to achieve the same result.

Depending on the choice of material from which the carrier is fabricated, and the choice of polymer or resin from which the article is made, adhesion of the article to the carrier may sometimes be insufficient to retain the article on the carrier through to completion of the finished article or "build." For example, an aluminum carrier may have lower adhesion than a poly(vinyl chloride) (or "PVC") carrier.

Hence one solution is to employ a carrier comprising a PVC on the surface to which the article being fabricated is polymerized. If this promotes too great an adhesion to conveniently separate the finished part from the carrier, then any of a variety of techniques can be used to further secure the article to a less adhesive carrier, including but not limited to the application of adhesive tape such as "Greener Masking Tape for Basic Painting #2025 High adhesion" to further secure the article to the carrier during fabrication.

3. Controller and Process Control.

The methods and apparatus of the invention can include process steps and apparatus features to implement process control, including feedback and feed-forward control, to, for example, enhance the speed and/or reliability of the method.

A controller for use in carrying out the present invention may be implemented as hardware circuitry, software, or a combination thereof. In one embodiment, the controller is a general purpose computer that runs software, operatively associated with monitors, drives, pumps, and other components through suitable interface hardware and/or software. Suitable software for the control of a three-dimensional printing or fabrication method and apparatus as described herein includes, but is not limited to, the ReplicatorG open source 3d printing program, 3DPrint™ controller software from 3D systems, Slic3r, Skeinforge, KIS Slicer, Repetier-Host, PrintRun, Cura, etc., including combinations thereof.

Process parameters to directly or indirectly monitor, continuously or intermittently, during the process (e.g., during one, some or all of said filling, irradiating and advancing steps) include, but are not limited to, irradiation intensity, temperature of carrier, polymerizable liquid in the build zone, temperature of growing product, temperature of build plate, pressure, speed of advance, pressure, force (e.g., exerted on the build plate through the carrier and product being fabricated), strain (e.g., exerted on the carrier by the growing product being fabricated), thickness of release layer, etc.

Known parameters that may be used in feedback and/or feed-forward control systems include, but are not limited to, expected consumption of polymerizable liquid (e.g., from the known geometry or volume of the article being fabricated), degradation temperature of the polymer being formed from the polymerizable liquid, etc.

Process conditions to directly or indirectly control, continuously or step-wise, in response to a monitored parameter, and/or known parameters (e.g., during any or all of the process steps noted above), include, but are not limited to, rate of supply of polymerizable liquid, temperature, pressure, rate or speed of advance of carrier, intensity of irradiation, duration of irradiation (e.g. for each "slice"), etc.

For example, the temperature of the polymerizable liquid in the build zone, or the temperature of the build plate, can be monitored, directly or indirectly with an appropriate thermocouple, non-contact temperature sensor (e.g., an infrared temperature sensor), or other suitable temperature sensor, to determine whether the temperature exceeds the degradation temperature of the polymerized product. If so, a process parameter may be adjusted through a controller to reduce the temperature in the build zone and/or of the build plate. Suitable process parameters for such adjustment may include: decreasing temperature with a cooler, decreasing the rate of advance of the carrier, decreasing intensity of the irradiation, decreasing duration of radiation exposure, etc.

In addition, the intensity of the irradiation source (e.g., an ultraviolet light source such as a mercury lamp) may be monitored with a photodetector to detect a decrease of intensity from the irradiation source (e.g., through routine degredation thereof during use). If detected, a process parameter may be adjusted through a controller to accommodate the loss of intensity. Suitable process parameters for such adjustment may include: increasing temperature with a heater, decreasing the rate of advance of the carrier, increasing power to the light source, etc.

As another example, control of temperature and/or pressure to enhance fabrication time may be achieved with heaters and coolers (individually, or in combination with one another and separately responsive to a controller), and/or with a pressure supply (e.g., pump, pressure vessel, valves and combinations thereof) and/or a pressure release mechanism such as a controllable valve (individually, or in combination with one another and separately responsive to a controller).

In some embodiments the controller is configured to maintain the gradient of polymerization zone described herein (see, e.g., FIG. 1) throughout the fabrication of some or all of the final product. The specific configuration (e.g., times, rate or speed of advancing, radiation intensity, temperature, etc.) will depend upon factors such as the nature of the specific polymerizable liquid and the product being created. Configuration to maintain the gradient of polymerization zone may be carried out empirically, by entering a set of process parameters or instructions previously determined, or determined through a series of test runs or "trial and error"; configuration may be provided through pre-determined instructions; configuration may be achieved by suitable monitoring and feedback (as discussed above), combinations thereof, or in any other suitable manner.

Figure 3:
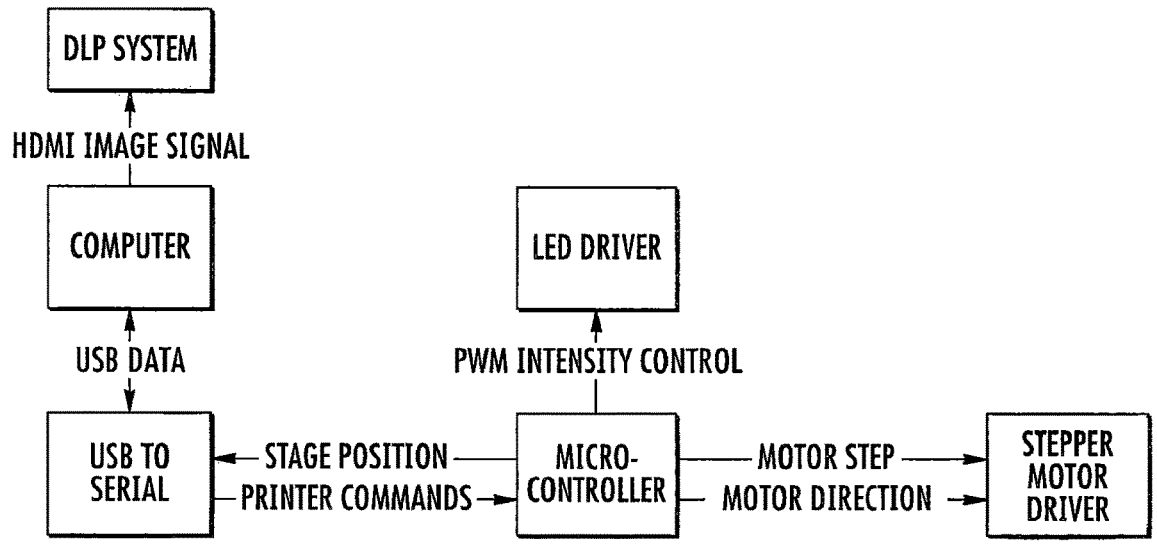
FIGS. 3 to 5 are flow charts illustrating control systems and methods for carrying out the present invention.
Figure 4:
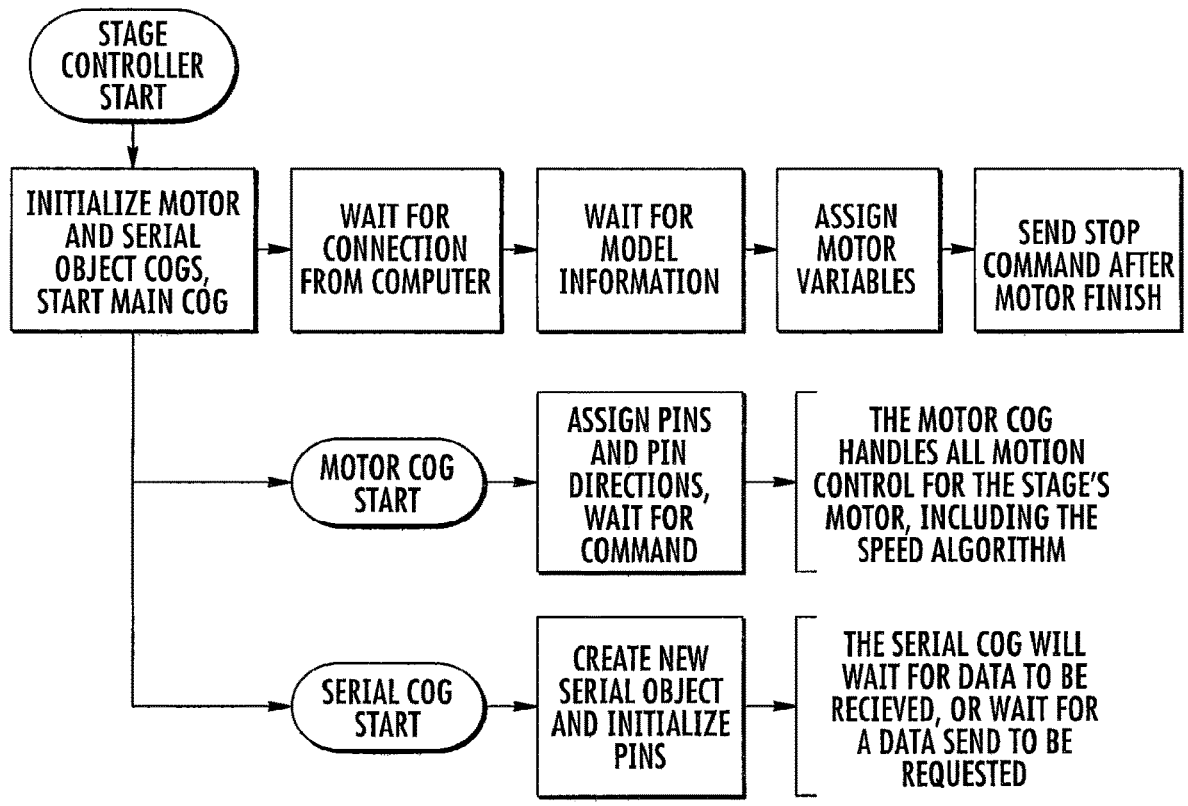
Figure 5:
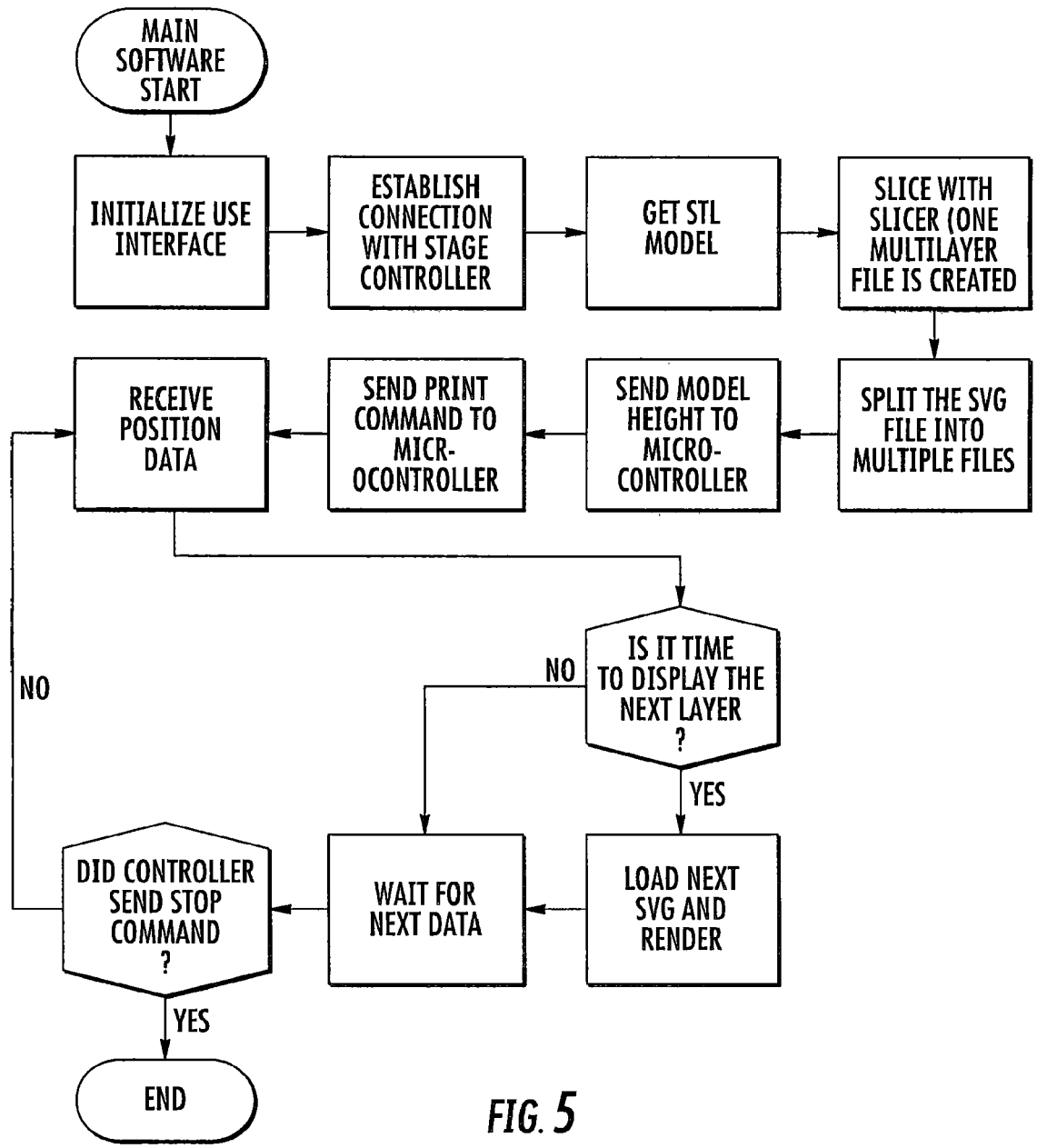

In some embodiments, a method and apparatus as described above may be controlled by a software program running in a general purpose computer with suitable interface hardware between that computer and the apparatus described above. Numerous alternatives are commercially available. Non-limiting examples of one combination of components is shown in FIGS. 3 to 5, where "Microcontroller" is Parallax Propeller, the Stepper Motor Driver is Sparkfun EasyDriver, the LED Driver is a Luxeon Single LED Driver, the USB to Serial is a Parallax USB to Serial converter, and the DLP System is a Texas Instruments LightCrafter system.

4. General Methods.

As noted above, the present invention provides a method of forming a three-dimensional object, comprising the steps of: (a) providing a carrier and a build plate, said build plate comprising a semipermeable member, said semipermeable member comprising a build surface and a feed surface separate from said build surface, with said build surface and said carrier defining a build region therebetween, and with said feed surface in fluid contact with a polymerization inhibitor; then (concurrently and/or sequentially) (b) filing said build region with a polymerizable liquid, said polymerizable liquid contacting said build segment, (c) irradiating said build region through said build plate to produce a solid polymerized region in said build region, with a liquid film release layer comprised of said polymerizable liquid formed between said solid polymerized region and said build surface, the polymerization of which liquid film is inhibited by said polymerization inhibitor; and (d) advancing said carrier with said polymerized region adhered thereto away from said build surface on said stationary build plate to create a subsequent build region between said polymerized region and said top zone. In general the method includes (e) continuing and/or repeating steps (b) through (d) to produce a subsequent polymerized region adhered to a previous polymerized region until the continued or repeated deposition of polymerized regions adhered to one another forms said three-dimensional object.

Since no mechanical release of a release layer is required, or no mechanical movement of a build surface to replenish oxygen is required, the method can be carried out in a continuous fashion, though it will be appreciated that the individual steps noted above may be carried out sequentially, concurrently, or a combination thereof. Indeed, the rate of steps can be varied over time depending upon factors such as the density and/or complexity of the region under fabrication.

Also, since mechanical release from a window or from a release layer generally requires that the carrier be advanced a greater distance from the build plate than desired for the next irradiation step, which enables the window to be recoated, and then return of the carrier back closer to the build plate (e.g., a "two steps forward one step back" operation), the present invention in some embodiments permits elimination of this "back-up" step and allows the carrier to be advanced unidirectionally, or in a single direction, without intervening movement of the window for re-coating, or "snapping" of a pre-formed elastic release-layer. However, in other embodiments of the invention, reciprocation is utilized not for the purpose of obtaining release, but for the purpose of more rapidly filling or pumping polymerizable liquid into the build region.

In some embodiments, the advancing step is carried out sequentially in uniform increments (e.g., of from 0.1 or 1 microns, up to 10 or 100 microns, or more) for each step or increment. In some embodiments, the advancing step is carried out sequentially in variable increments (e.g., each increment ranging from 0.1 or 1 microns, up to 10 or 100 microns, or more) for each step or increment. The size of the increment, along with the rate of advancing, will depend in part upon factors such as temperature, pressure, structure of the article being produced (e.g., size, density, complexity, configuration, etc.)

In other embodiments of the invention, the advancing step is carried out continuously, at a uniform or variable rate.

In some embodiments, the rate of advance (whether carried out sequentially or continuously) is from about 0.1 1, or 10 microns per second, up to about to 100, 1,000, or 10,000 microns per second, again depending again depending on factors such as temperature, pressure, structure of the article being produced, intensity of radiation, etc As described further below, in some embodiments the filling step is carried out by forcing said polymerizable liquid into said build region under pressure. In such a case, the advancing step or steps may be carried out at a rate or cumulative or average rate of at least 0.1, 1, 10, 50, 100, 500 or 1000 microns per second, or more. In general, the pressure may be whatever is sufficient to increase the rate of said advancing step(s) at least 2, 4, 6, 8 or 10 times as compared to the maximum rate of repetition of said advancing steps in the absence of said pressure. Where the pressure is provided by enclosing an apparatus such as described above in a pressure vessel and carrying the process out in a pressurized atmosphere (e.g., of air, air enriched with oxygen, a blend of gasses, pure oxygen, etc.) a pressure of 10, 20, 30 or 40 pounds per square inch (PSI) up to, 200, 300, 400 or 500 PSI or more, may be used. For fabrication of large irregular objects higher pressures may be less preferred as compared to slower fabrication times due to the cost of a large high pressure vessel. In such an embodiment, both the feed surface and the polymerizable liquid can be in fluid contact with the same compressed gas (e.g., one comprising from 20 to 95 percent by volume of oxygen, the oxygen serving as the polymerization inhibitor.

On the other hand, when smaller items are fabricated, or a rod or fiber is fabricated that can be removed or exited from the pressure vessel as it is produced through a port or orifice therein, then the size of the pressure vessel can be kept smaller relative to the size of the product being fabricated and higher pressures can (if desired) be more readily utilized.

As noted above, the irradiating step is in some embodiments carried out with patterned irradiation. The patterned irradiation may be a fixed pattern or may be a variable pattern created by a pattern generator (e.g., a DLP) as discussed above, depending upon the particular item being fabricated.

When the patterned irradiation is a variable pattern rather than a pattern that is held constant over time, then each irradiating step may be any suitable time or duration depending on factors such as the intensity of the irradiation, the presence or absence of dyes in the polymerizable material, the rate of growth, etc. Thus in some embodiments each irradiating step can be from 0.001, 0.01, 0.1, 1 or 10 microseconds, up to 1, 10, or 100 minutes, or more, in duration. The interval between each irradiating step is in some embodiments preferably as brief as possible, e.g., from 0.001, 0.01, 0.1, or 1 microseconds up to 0.1, 1, or 10 seconds.

While the dead zone and the gradient of polymerization zone do not have a strict boundary therebetween (in those locations where the two meet), the thickness of the gradient of polymerization zone is in some embodiments at least as great as the thickness of the dead zone. Thus, in some embodiments, the dead zone has a thickness of from 0.01, 0.1, 1, 2, or 10 microns up to 100, 200 or 400 microns, or more, and/or said gradient of polymerization zone and said dead zone together have a thickness of from 1 or 2 microns up to 400, 600, or 1000 microns, or more. Thus the gradient of polymerization zone may be thick or thin depending on the particular process conditions at that time. Where the gradient of polymerization zone is thin, it may also be described as an active surface on the bottom of the growing three-dimensional object, with which monomers can react and continue to form growing polymer chains therewith. In some embodiments, the gradient of polymerization zone, or active surface, is maintained (while polymerizing steps continue) for a time of at least 5, 10, 15, 20 or 30 seconds, up to 5, 10, 15 or 20 minutes or more, or until completion of the three-dimensional product.

The method may further comprise the step of disrupting said gradient of polymerization zone for a time sufficient to form a cleavage line in said three-dimensional object (e.g., at a predetermined desired location for intentional cleavage, or at a location in said object where prevention of cleavage or reduction of cleavage is non-critical), and then reinstating said gradient of polymerization zone (e.g. by pausing, and resuming, the advancing step, increasing, then decreasing, the intensity of irradiation, and combinations thereof In some embodiments the build surface is flat; in other the build surface is irregular such as convexly or concavely curved, or has walls or trenches formed therein. In either case the build surface may be smooth or textured.

Curved and/or irregular build plates or build surfaces can be used in fiber or rod formation, to provide different materials to a single object being fabricated (that is, different polymerizable liquids to the same build surface through channels or trenches formed in the build surface, each associated with a separate liquid supply, etc.

Carrier Feed Channels for Polymerizable liquid. While polymerizable liquid may be provided directly to the build plate from a liquid conduit and reservoir system, in some embodiments the carrier include one or more feed channels therein. The carrier feed channels are in fluid communication with the polymerizable liquid supply, for example a reservoir and associated pump. Different carrier feed channels may be in fluid communication with the same supply and operate simultaneously with one another, or different carrier feed channels may be separately controllable from one another (for example, through the provision of a pump and/or valve for each). Separately controllable feed channels may be in fluid communication with a reservoir containing the same polymerizable liquid, or may be in fluid communication with a reservoir containing different polymerizable liquids. Through the use of valve assemblies, different polymerizable liquids may in some embodiments be alternately fed through the same feed channel, if desired.

Three-dimensional products produced by the methods and processes of the present invention may be final, finished or substantially finished products, or may be intermediate products subject to further manufacturing steps such as surface treatment, laser cutting, electric discharge machining, etc., is intended. Intermediate products include products for which further additive manufacturing, in the same or a different apparatus, may be carried out). The three dimensional intermediate is preferably formed from resins as described above by additive manufacturing, typically bottom-up or top-down additive manufacturing. Such methods are known and described in, for example, U.S. Pat. No. 5,236,637 to Hull, U.S. Pat. Nos. 5,391,072 and 5,529,473 to Lawton, U.S. Pat. No. 7,438,846 to John, U.S. Pat. No. 7,892,474 to Shkolnik, U.S. Pat. No. 8,110,135 to El-Siblani, U.S. Patent Application Publication Nos. 2013/0292862 to Joyce and 2013/0295212 to Chen et al., and PCT Application Publication No. WO 2015/164234 to Robeson et al. The disclosures of these patents and applications are incorporated by reference herein in their entirety.

In general, top-down three-dimensional fabrication is carried out by:

(a) providing a polymerizable liquid reservoir having a polymerizable liquid fill level and a carrier positioned in the reservoir, the carrier and the fill level defining a build region therebetween;

(b) filling the build region with a polymerizable liquid (i.e., the resin), said polymerizable liquid comprising a mixture of (i) a light (typically ultraviolet light) polymerizable liquid first component, and (ii) a second solidifiable component of the dual cure system; and then (c) irradiating the build region with light to form a solid polymer scaffold from the first component and also advancing (typically lowering) the carrier away from the build surface to form a three-dimensional intermediate having the same shape as, or a shape to be imparted to, the three-dimensional object and containing said second solidifiable component (e.g., a second reactive component) carried in the scaffold in unsolidified and/or uncured form.

A wiper blade, doctor blade, or optically transparent (rigid or flexible) window, may optionally be provided at the fill level to facilitate leveling of the polymerizable liquid, in accordance with known techniques. In the case of an optically transparent window, the window provides a build surface against which the three dimensional intermediate is formed, analogous to the build surface in bottom-up three dimensional fabrication as discussed below.

In general, bottom-up three dimensional fabrication is carried out by:

(a) providing a carrier and an optically transparent member having a build surface, the carrier and the build surface defining a build region therebetween;

(b) filling the build region with a polymerizable liquid (i.e., the resin), said polymerizable liquid comprising a mixture of (i) a light (typically ultraviolet light) polymerizable liquid first component, and (ii) a second solidifiable component of the dual cure system; and then (c) irradiating the build region with light through said optically transparent member to form a solid polymer scaffold from the first component and also advancing (typically raising) the carrier away from the build surface to form a three-dimensional intermediate having the same shape as, or a shape to be imparted to, the three-dimensional object and containing said second solidifiable component (e.g., a second reactive component) carried in the scaffold in unsolidified and/or uncured form.

In some embodiments of bottom up or top down three dimensional fabrication as implemented in the context of the present invention, the build surface is stationary during the formation of the three dimensional intermediate; in other embodiments of bottom-up three dimensional fabrication as implemented in the context of the present invention, the build surface is tilted, slid, flexed and/or peeled, and/or otherwise translocated or released from the growing three dimensional intermediate, usually repeatedly, during formation of the three dimensional intermediate.

In some embodiments of bottom up or top down three dimensional fabrication as carried out in the context of the present invention, the polymerizable liquid (or resin) is maintained in liquid contact with both the growing three dimensional intermediate and the build surface during both the filling and irradiating steps, during fabrication of some of, a major portion of, or all of the three dimensional intermediate.

In some embodiments of bottom-up or top down three dimensional fabrication as carried out in the context of the present invention, the growing three dimensional intermediate is fabricated in a layerless manner (e.g., through multiple exposures or "slices" of patterned actinic radiation or light) during at least a portion of the formation of the three dimensional intermediate.

In some embodiments of bottom up or top down three dimensional fabrication as carried out in the context of the present invention, the growing three dimensional intermediate is fabricated in a layer-by-layer manner (e.g., through multiple exposures or "slices" of patterned actinic radiation or light), during at least a portion of the formation of the three dimensional intermediate.

In some embodiments of bottom up or top down three dimensional fabrication employing a rigid or flexible optically transparent window, a lubricant or immiscible liquid may be provided between the window and the polymerizable liquid (e.g., a fluorinated fluid or oil such as a perfluoropolyether oil).

From the foregoing it will be appreciated that, in some embodiments of bottom-up or top down three dimensional fabrication as carried out in the context of the present invention, the growing three dimensional intermediate is fabricated in a layerless manner during the formation of at least one portion thereof, and that same growing three dimensional intermediate is fabricated in a layer-by-layer manner during the formation of at least one other portion thereof. Thus, operating mode may be changed once, or on multiple occasions, between layerless fabrication and layer-by-layer fabrication, as desired by operating conditions such as part geometry.

In preferred embodiments, the intermediate is formed by continuous liquid interface production (CLIP). CLIP is known and described in, for example, PCT Applications Nos. PCT/US2014/015486 (published as U.S. Pat. No. 9,211,678 on Dec. 15, 2015); PCT/US2014/015506 (also published as U.S. Pat. No. 9,205,601 on Dec. 8, 2015), PCT/US2014/015497 (also published as US 2015/0097316, and to publish as U.S. Pat. No. 9,216,546 on Dec. 22, 2015), and in J. Tumbleston, D. Shirvanyants, N. Ermoshkin et al., Continuous liquid interface production of 3D Objects, *Science* 347, 1349-1352 (published online 16 Mar. 2015). In some embodiments, CLIP employs features of a bottom-up three dimensional fabrication as described above, but the irradiating and/or said advancing steps are carried out while also concurrently maintaining a stable or persistent liquid interface between the growing object and the build surface or window, such as by: (i) continuously maintaining a dead zone of polymerizable liquid in contact with said build surface, and (ii) continuously maintaining a gradient of polymerization zone (such as an active surface) between the dead zone and the solid polymer and in contact with each thereof, the gradient of polymerization zone comprising the first component in partially cured form. In some embodiments of CLIP, the optically transparent member comprises a semipermeable member (e.g., a fluoropolymer), and the continuously maintaining a dead zone is carried out by feeding an inhibitor of polymerization through the optically transparent member, thereby creating a gradient of inhibitor in the dead zone and optionally in at least a portion of the gradient of polymerization zone.

In some embodiments, the stable liquid interface may be achieved by other techniques, such as by providing an immiscible liquid as the build surface between the polymerizable liquid and the optically transparent member, by feeding a lubricant to the build surface (e.g., through an optically transparent member which is semipermeable thereto, and/or serves as a reservoir thereof), etc.

While the dead zone and the gradient of polymerization zone do not have a strict boundary therebetween (in those locations where the two meet), the thickness of the gradient of polymerization zone is in some embodiments at least as great as the thickness of the dead zone. Thus, in some embodiments, the dead zone has a thickness of from 0.01, 0.1, 1, 2, or 10 microns up to 100, 200 or 400 microns, or more, and/or the gradient of polymerization zone and the dead zone together have a thickness of from 1 or 2 microns up to 400, 600, or 1000 microns, or more. Thus the gradient of polymerization zone may be thick or thin depending on the particular process conditions at that time. Where the gradient of polymerization zone is thin, it may also be described as an active surface on the bottom of the growing three-dimensional object, with which monomers can react and continue to form growing polymer chains therewith. In some embodiments, the gradient of polymerization zone, or active surface, is maintained (while polymerizing steps continue) for a time of at least 5, 10, 15, 20 or 30 seconds, up to 5, 10, 15 or 20 minutes or more, or until completion of the three-dimensional product.

Inhibitors, or polymerization inhibitors, for use in the present invention may be in the form of a liquid or a gas. In some embodiments, gas inhibitors are preferred. In some embodiments, liquid inhibitors such as oils or lubricants may be employed. In further embodiments, gas inhibitors which are dissolved in liquids (e.g. oils or lubricants) may be employed. For example, oxygen dissolved in a fluorinated fluid. The specific inhibitor will depend upon the monomer being polymerized and the polymerization reaction. For free radical polymerization monomers, the inhibitor can conveniently be oxygen, which can be provided in the form of a gas such as air, a gas enriched in oxygen (optionally but in some embodiments preferably containing additional inert gases to reduce combustibility thereof), or in some embodiments pure oxygen gas. In alternate embodiments, such as where the monomer is polymerized by photoacid generator initiator, the inhibitor can be a base such as ammonia, trace amines (e.g. methyl amine, ethyl amine, di and trialkyl amines such as dimethyl amine, diethyl amine, trimethyl amine, triethyl amine, etc.), or carbon dioxide, including mixtures or combinations thereof.

The method may further comprise the step of disrupting the gradient of polymerization zone for a time sufficient to form a cleavage line in the three-dimensional object (e.g., at a predetermined desired location for intentional cleavage, or at a location in the object where prevention of cleavage or reduction of cleavage is non-critical), and then reinstating the gradient of polymerization zone (e.g. by pausing, and resuming, the advancing step, increasing, then decreasing, the intensity of irradiation, and combinations thereof).

CLIP may be carried out in different operating modes operating modes (that is, different manners of advancing the carrier and build surface away from one another), including continuous, intermittent, reciprocal, and combinations thereof.

Thus in some embodiments, the advancing step is carried out continuously, at a uniform or variable rate, with either constant or intermittent illumination or exposure of the build area to the light source.

In other embodiments, the advancing step is carried out sequentially in uniform increments (e.g., of from 0.1 or 1 microns, up to 10 or 100 microns, or more) for each step or increment. In some embodiments, the advancing step is carried out sequentially in variable increments (e.g., each increment ranging from 0.1 or 1 microns, up to 10 or 100 microns, or more) for each step or increment. The size of the increment, along with the rate of advancing, will depend in part upon factors such as temperature, pressure, structure of the article being produced (e.g., size, density, complexity, configuration, etc.).

In some embodiments, the rate of advance (whether carried out sequentially or continuously) is from about 0.1 1, or 10 microns per second, up to about to 100, 1,000, or 10,000 microns per second, again depending again depending on factors such as temperature, pressure, structure of the article being produced, intensity of radiation, etc.

In still other embodiments, the carrier is vertically reciprocated with respect to the build surface to enhance or speed the refilling of the build region with the polymerizable liquid. In some embodiments, the vertically reciprocating step, which comprises an upstroke and a downstroke, is carried out with the distance of travel of the upstroke being greater than the distance of travel of the downstroke, to thereby concurrently carry out the advancing step (that is, driving the carrier away from the build plate in the Z dimension) in part or in whole.

In some embodiments, the solidifiable or polymerizable liquid is changed at least once during the method with a subsequent solidifiable or polymerizable liquid (e.g., by switching a "window" or "build surface" and associated reservoir of polymerizable liquid in the apparatus); optionally where the subsequent solidifiable or polymerizable liquid is cross-reactive with each previous solidifiable or polymerizable liquid during the subsequent curing, to form an object having a plurality of structural segments covalently coupled to one another, each structural segment having different structural (e.g., tensile) properties (e.g., a rigid funnel or liquid connector segment, covalently coupled to a flexible pipe or tube segment).

Once the three-dimensional intermediate is formed, it may be removed from the carrier, optionally washed, any supports optionally removed, any other modifications optionally made (cutting, welding, adhesively bonding, joining, grinding, drilling, etc.), and then heated and/or microwave irradiated sufficiently to further cure the resin and form the three dimensional object. Of course, additional modifications may also be made following the heating and/or microwave irradiating step.

Washing may be carried out with any suitable organic or aqueous wash liquid, or combination thereof, including solutions, suspensions, emulsions, microemulsions, etc. Examples of suitable wash liquids include, but are not limited to water, alcohols (e.g., methanol, ethanol, isopropanol, etc.), benzene, toluene, etc. Such wash solutions may optionally contain additional constituents such as surfactants, etc. A currently preferred wash liquid is a 50:50 (volume:volume) solution of water and isopropanol. Wash methods such as those described in U.S. Pat. No. 5,248,456 may be employed and are included therein.

After the intermediate is formed, optionally washed, etc., as described above, it is then heated and/or microwave irradiated to further cure the same. Heating may be active heating (e.g., in an oven, such as an electric, gas, or solar oven), or passive heating (e.g., at ambient temperature). Active heating will generally be more rapid than passive heating and in some embodiments is preferred, but passive heating—such as simply maintaining the intermediate at ambient temperature for a sufficient time to effect further cure—is in some embodiments preferred.

In some embodiments, the heating step is carried out at at least a first temperature and a second temperature, with the first temperature greater than ambient temperature, the second temperature greater than the first temperature, and the second temperature less than 300° C. (e.g., with ramped or step-wise increases between ambient temperature and the first temperature, and/or between the first temperature and the second temperature).

For example, the intermediate may be heated in a stepwise manner at a first oven temperature of about 70° C. to about 150° C., and then at a second temperature of about 150° C. to 200 or 250° C., with the duration of each heating depending on the size, shape, and/or thickness of the intermediate. In another embodiment, the intermediate may be cured by a ramped heating schedule, with the temperature ramped from ambient temperature through a temperature of 70 to 150° C., and up to a final oven temperature of 250 or 300° C., at a change in heating rate of 0.5° C. per minute, to 5° C. per minute. (See, e.g., U.S. Pat. No. 4,785,075).

It will be clear to those skilled in the art that the materials described in the current invention will be useful in other additive manufacturing techniques, including ink-jet printer-based methods.

5. Reciprocating Feed of Polymerizable Liquid.

In an embodiment of the present invention, the carrier is vertically reciprocated with respect to the build surface (that is, the two are vertically reciprocated with respect to one another) to enhance or speed the refilling of the build region with the polymerizable liquid.

In some embodiments, the vertically reciprocating step, which comprises an upstroke and a downstroke, is carried out with the distance of travel of the upstroke being greater than the distance of travel of the downstroke, to thereby concurrently carry out the advancing step (that is, driving the carrier away from the build plate in the Z dimension) in part or in whole.

In some embodiments, the speed of the upstroke gradually accelerates (that is, there is provided a gradual start and/or gradual acceleration of the upstroke, over a period of at least 20, 30, 40, or 50 percent of the total time of the upstroke, until the conclusion of the upstroke, or the change of direction which represents the beginning of the downstroke. Stated differently, the upstroke begins, or starts, gently or gradually.

In some embodiments, the speed of the downstroke gradually decelerates (that is, there is provided a gradual termination and/or gradual deceleration of the downstroke, over a period of at least 20, 30, 40, or 50 percent of the total time of the downstroke. Stated differently, the downstroke concludes, or ends, gently or gradually.

While in some embodiments there is an abrupt end, or abrupt deceleration, of the upstroke, and an abrupt beginning or deceleration of the downstroke (e.g., a rapid change in vector or direction of travel from upstroke to downstroke), it will be appreciated that gradual transitions may be introduced here as well (e.g., through introduction of a "plateau" or pause in travel between the upstroke and downstroke). It will also be appreciated that, while each reciprocating step may be consist of a single upstroke and downstroke, the reciprocation step may comprise a plurality of 2, 3, 4 or 5 or more linked set of reciprocations, which may e the same or different in frequent and/or amplitude In some embodiments, the vertically reciprocating step is carried out over a total time of from 0.01 or 0.1 seconds up to 1 or 10 seconds (e.g., per cycle of an upstroke and a downstroke).

In some embodiments, the upstroke distance of travel is from 0.02 or 0.2 millimeters (or 20 or 200 microns) to 1 or 10 millimeters (or 1000 to 10,000 microns). The distance of travel of the downstroke may be the same as, or less than, the distance of travel of the upstroke, where a lesser distance of travel for the downstroke serves to achieve the advancing of the carrier away from the build surface as the three-dimensional object is gradually formed. Where a reciprocation step comprises multiple linked reciprocations, the sum distance of travel of all upstrokes in that set is preferably greater than the sum distance of travel of all downstrokes in that set, to achieve the advancing of the carrier away from the build surface as the three-dimensional object is gradually formed.

Preferably the vertically reciprocating step, and particularly the upstroke thereof, does not cause the formation of gas bubbles or a gas pocket in the build region, but instead the build region remains filled with the polymerizable liquid throughout the reciprocation steps, and the gradient of polymerization zone or region remains in contact with the "dead zone" and with the growing object being fabricated throughout the reciprocation steps. As will be appreciated, a purpose of the reciprocation is to speed or enhance the refilling of the build region, particularly where larger build regions are to be refilled with polymerizable liquid, as compared to the speed at which the build region could be refilled without the reciprocation step.

In some embodiments, the advancing step is carried out intermittently at a rate of 1, 2, 5 or 10 individual advances per minute up to 300, 600, or 1000 individual advances per minute, each followed by a pause during which an irradiating step is carried out. It will be appreciated that one or more reciprocation steps (e.g., upstroke plus downstroke) may be carried out within each advancing step. Stated differently, the reciprocating steps may be nested within the advancing steps.

In some embodiments, the individual advances are carried out over an average distance of travel for each advance of from 10 or 50 microns to 100 or 200 microns (optionally including the total distance of travel for each vertically reciprocating step, e.g., the sum of the upstroke distance minus the downstroke distance).

Apparatus for carrying out the invention in which the reciprocation steps described herein are implemented substantially as described above, with the drive associated with the carrier, and/or with an additional drive operatively associated with the transparent member, and with the controller operatively associated with either or both thereof and configured to reciprocate the carrier and transparent member with respect to one another as described above.

In the alternative, vertical reciprocation may be carried out by configuring the build surface (and corresponding build plate) so that it may have a limited range of movement up and down in the vertical or "Z" dimension, while the carrier advances (e.g., continuously or step-wise) away from the build plate in the vertical or "Z" dimension. In some embodiments, such limited range of movement may be passively imparted, such as with upward motion achieved by partial adhesion of the build plate to the growing object through a viscous polymerizable liquid, followed by downward motion achieved by the weight, resiliency, etc. of the build plate (optionally including springs, buffers, shock absorbers or the like, configured to influence either upward or downward motion of the build plate and build surface). In another embodiment, such motion of the build surface may be actively achieved, by operatively associating a separate drive system with the build plate, which drive system is also operatively associated with the controller, to separately achieve vertical reciprocation. In still another embodiment, vertical reciprocation may be carried out by configuring the build plate, and/or the build surface, so that it flexes upward and downward, with the upward motion thereof being achieved by partial adhesion of the build surface to the growing object through a viscous polymerizable liquid, followed by downward motion achieved by the inherent stiffness of the build surface biasing it or causing it to return to a prior position.

It will be appreciated that illumination or irradiation steps, when intermittent, may be carried out in a manner synchronized with vertical reciprocation, or not synchronized with vertical reciprocation, depending on factors such as whether the reciprocation is achieved actively or passively.

It will also be appreciated that vertical reciprocation may be carried out between the carrier and all regions of the build surface simultaneously (e.g., where the build surface is rigid), or may be carried out between the carrier and different regions of the build surface at different times (e.g., where the build surface is of a flexible material, such as a tensioned polymer film).

6. Increased Speed of Fabrication by Increasing Light Intensity.

In general, it has been observed that speed of fabrication can increase with increased light intensity. In some embodiments, the light is concentrated or "focused" at the build region to increase the speed of fabrication. This may be accomplished using an optical device such as an objective lens.

The speed of fabrication may be generally proportional to the light intensity. For example, the build speed in millimeters per hour may be calculated by multiplying the light intensity in milliWatts per square centimeter and a multiplier. The multiplier may depend on a variety of factors, including those discussed below. A range of multipliers, from low to high, may be employed. On the low end of the range, the multiplier may be about 10, 15, 20 or 30. On the high end of the mutipler range, the multiplier may be about 150, 300, 400 or more.

The relationships described above are, in general, contemplated for light intensities of from 1, 5 or 10 milliWatts per square centimeter, up to 20 or 50 milliWatts per square centimeter.

Certain optical characteristics of the light may be selected to facilitate increased speed of fabrication. By way of example, a band pass filter may be used with a mercury bulb light source to provide 365±10 nm light measured at Full Width Half Maximum (FWHM). By way of further example, a band pass filter may be used with an LED light source to provide 375±15 nm light measured at FWHM.

As noted above, poymerizable liquids used in such processes are, in general, free radical polymerizable liquids with oxygen as the inhibitor, or acid-catalyzed or cationically polymerizable liquids with a base as the inhibitor. Some specific polymerizable liquids will of course cure more rapidly or efficiently than others and hence be more amenable to higher speeds, though this may be offset at least in part by further increasing light intensity.

At higher light intensities and speeds, the "dead zone" may become thinner as inhibitor is consumed. If the dead zone is lost then the process will be disrupted. In such case, the supply of inhibitor may be enhanced by any suitable means, including providing an enriched and/or pressurized atmosphere of inhibitor, a more porous semipermeable member, a stronger or more powerful inhibitor (particularly where a base is employed), etc.

In general, lower viscosity polymerizable liquids are more amenable to higher speeds, particularly for fabrication of articles with a large and/or dense cross section (although this can be offset at least in part by increasing light intensity). Polymerizable liquids with viscosities in the range of 50 or 100 centipoise, up to 600, 800 or 1000 centipoise or more (as measured at room temperature and atmospheric pressure with a suitable device such as a HYDRAMOTION REACTAVISC™ Viscometer (available from Hydramotion Ltd, 1 York Road Business Park, Malton, York YO17 6YA England). In some embodiments, where necessary, the viscosity of the polymerizable liquid can advantageously be reduced by heating the polymerizable liquid, as described above.

In some embodiments, such as fabrication of articles with a large and/or dense cross-section, speed of fabrication can be enhanced by introducing reciprocation to "pump" the polymerizable liquid, as described above, and/or the use of feeding the polymerizable liquid through the carrier, as also described above, and/or heating and/or pressurizing the polymerizable liquid, as also described above.

7. Tiling.

It may be desirable to use more than one light engine to preserve resolution and light intensity for larger build sizes. Each light engine may be configured to project an image (e.g., an array of pixels) into the build region such that a plurality of "tiled" images are projected into the build region. As used herein, the term "light engine" can mean an assembly including a light source, a DLP device such as a digital micromirror device and/or an optical device such as an objective lens. The "light engine" may also include electronics such as a controller that is operatively associated with one or more of the other components.

Figure 17A:
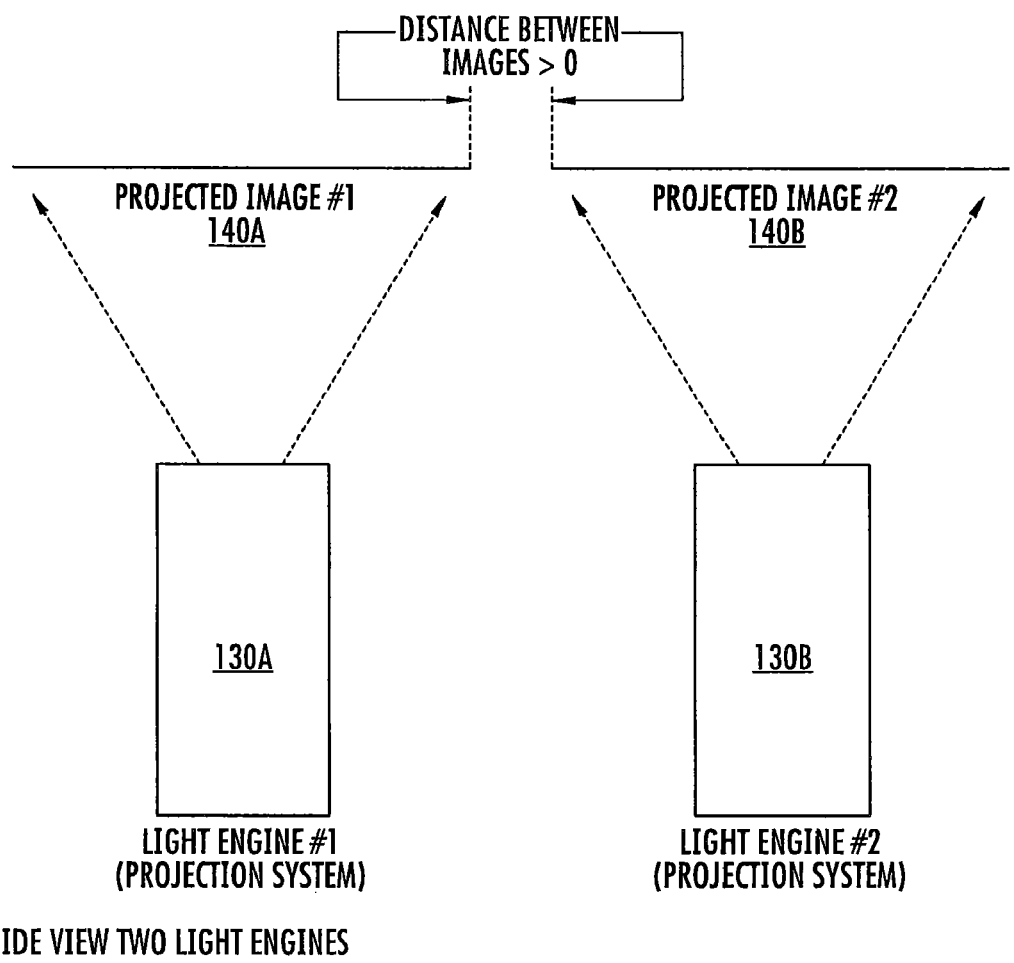
FIGS. 17A-17C are schematic diagrams illustrating tiled images.
Figure 17B:
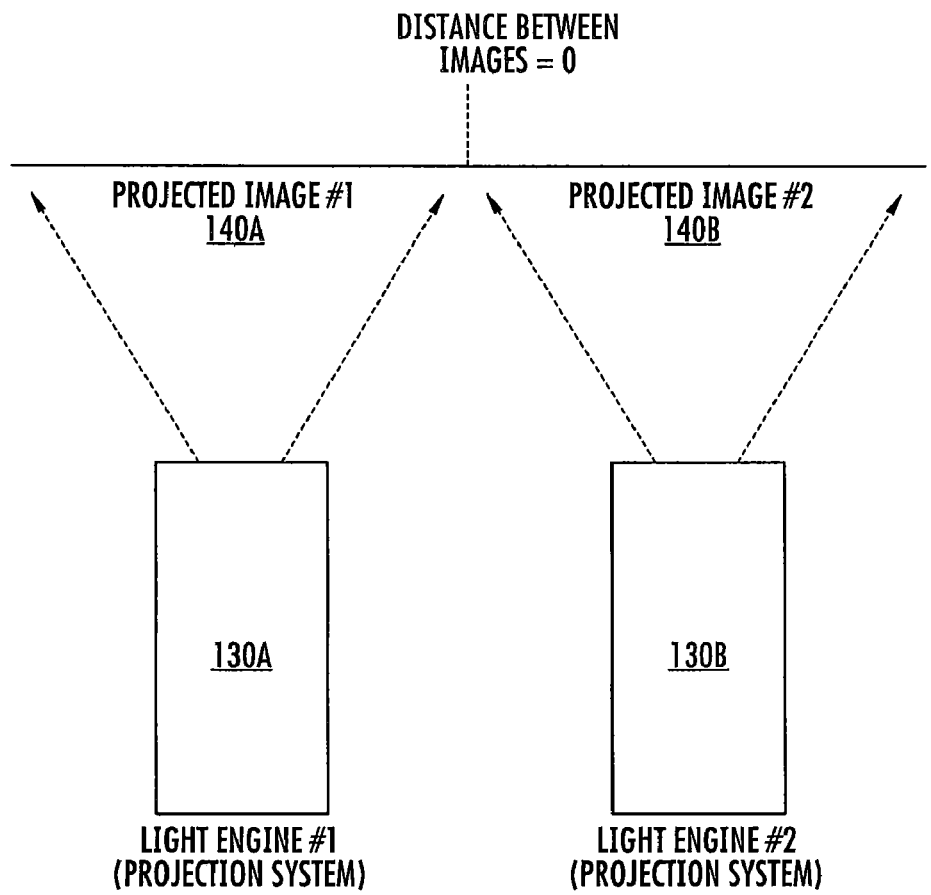
Figure 17C:
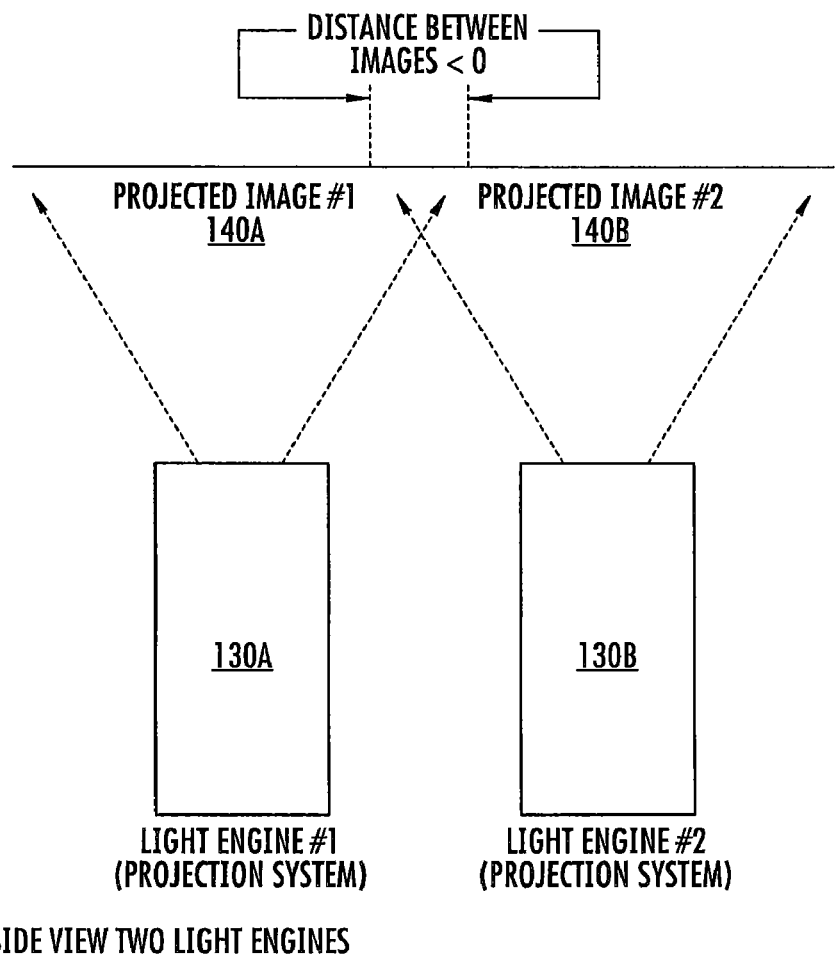

This is shown schematically in FIGS. 17A-17C. The light engine assemblies 130A, 130B produce adjacent or "tiled" images 140A, 140B. In FIG. 17A, the images are slightly misaligned; that is, there is a gap between them. In FIG. 17B, the images are aligned; there is no gap and no overlap between them. In FIG. 17C, there is a slight overlap of the images 140A and 140B.

In some embodiments, the configuration with the overlapped images shown in FIG. 17C is employed with some form of "blending" or "smoothing" of the overlapped regions as generally discussed in, for example, U.S. Pat. Nos. 7,292,207, 8,102,332, 8,427,391, 8,446,431 and U.S. Patent Application Publication Nos. 2013/0269882, 2013/0278840 and 2013/0321475, the disclosures of which are incorporated herein in their entireties. The tiled images can allow for larger build areas without sacrificing light intensity, and therefore can facilitate faster build speeds for larger objects. It will be understood that more than two light engine assemblies (and corresponding tiled images) may be employed. Various embodiments of the invention employ at least 4, 8, 16, 32, 64, 128 or more tiled images.

8. Fabrication in Multiple Zones.

As noted above, embodiments of the invention may carry out the formation of the three-dimensional object through multiple zones or segments of operation. Such a method generally comprises:

(a) providing a carrier and an optically transparent member having a build surface, the carrier and the build surface defining a build region therebetween, with the carrier positioned adjacent and spaced apart from the build surface at a start position; then (b) forming an adhesion segment of the three-dimensional object by:

(i) filling the build region with a polymerizable liquid, (ii) irradiating the build region with light through the optically transparent member (e.g., by a single exposure), while (iii) maintaining the carrier stationary or advancing the carrier away from the build surface at a first cumulative rate of advance, to thereby form from the polymerizable liquid a solid polymer adhesion segment of the object adhered to the carrier; then (c) optionally but preferably forming a transition segment of the three dimensional object by (i) filling the build region with a polymerizable liquid, (ii) continuously or intermittently irradiating the build region with light through the optically transparent member, and (iii) continuously or intermittently advancing (e.g., sequentially or concurrently with the irradiating step) the carrier away from the build surface at a second cumulative rate of advance to thereby form from the polymerizable liquid a transition segment of the object between the adhesion segment and the build surface;

wherein the second cumulative rate of advance is greater than the first cumulative rate of advance; and then (d) forming a body segment of the three dimensional object by:

(i) filling the build region with a polymerizable liquid, (ii) continuously or intermittently irradiating the build region with light through the optically transparent, and (iii) continuously or intermittently advancing (e.g., sequentially or concurrently with the irradiating step) the carrier away from the build surface at a third cumulative rate of advance, to thereby form from the polymerizable liquid a body segment of the object between the transition segment and the build surface;

wherein the third cumulative rate of advance is greater than the first and/or the second cumulative rate of advance.

Note that the start position can be any position among a range of positions (e.g., a range of up to 5 or 10 millimeters or more), and the irradiating step (b)(ii) is carried out at an intensity sufficient to adhere the solid polymer to the carrier when the carrier is at any position within that range of positions. This advantageously reduces the possibility of failure of adhesion of the three-dimensional object to the carrier due to variations in uniformity of the carrier and/or build surfaces, variations inherent in drive systems in positioning the carrier adjacent the build surface, etc.

9. Fabrication with Intermittent (or Strobe") Illumination.

As noted above, in some embodiments the invention may be carried out with the illumination in intermittent periods or burst. In one embodiment, such a method comprises:

providing a carrier and an optically transparent member having a build surface, the carrier and the build surface defining a build region therebetween;

filling the build region with a polymerizable liquid, intermittently irradiating the build region with light through the optically transparent member to form a solid polymer from the polymerizable liquid, continuously advancing the carrier away from the build surface to form the three-dimensional object from the solid polymer.

Another embodiment of such a mode of operation comprises:

providing a carrier and an optically transparent member having a build surface, the carrier and the build surface defining a build region therebetween;

filling the build region with a polymerizable liquid, intermittently irradiating the build region with light through the optically transparent member to form a solid polymer from the polymerizable liquid, continuously or intermittently advancing (e.g., sequentially or concurrently with the irradiating step) the carrier away from the build surface to form the three-dimensional object from the solid polymer.

In some embodiments, the intermittently irradiating comprises alternating periods of active and inactive illumination, where the average duration of the periods of active illumination is less than the average duration of the periods of inactive illumination (e.g., is not more than 50, 60, or 80 percent thereof).

In other embodiments, the intermittently irradiating comprises alternating periods of active and inactive illumination, where the average duration of the periods of active illumination is the same as or greater than the average duration of the periods of inactive illumination (e.g., is at least 100, 120, 160, or 180 percent thereof).

Examples of such modes of operation are given further below. These features may be combined with any of the other features and operating steps or parameters described herein.

10. Fabrication Products.

Three-dimensional products produced by the methods and processes of the present invention may be final, finished or substantially finished products, or may be intermediate products subject to further manufacturing steps such as surface treatment, laser cutting, electric discharge machining, etc., is intended. Intermediate products include products for which further additive manufacturing, in the same or a different apparatus, may be carried out). For example, a fault or cleavage line may be introduced deliberately into an ongoing "build" by disrupting, and then reinstating, the gradient of polymerization zone, to terminate one region of the finished product, or simply because a particular region of the finished product or "build" is less fragile than others.

Numerous different products can be made by the methods and apparatus of the present invention, including both large-scale models or prototypes, small custom products, miniature or microminiature products or devices, etc. Examples include, but are not limited to, medical devices and implantable medical devices such as stents, drug delivery depots, functional structures, microneedle arrays, fibers and rods such as waveguides, micromechanical devices, microfluidic devices, etc.

Thus in some embodiments the product can have a height of from 0.1 or 1 millimeters up to 10 or 100 millimeters, or more, and/or a maximum width of from 0.1 or 1 millimeters up to 10 or 100 millimeters, or more. In other embodiments, the product can have a height of from 10 or 100 nanometers up to 10 or 100 microns, or more, and/or a maximum width of from 10 or 100 nanometers up to 10 or 100 microns, or more. These are examples only:

Maximum size and width depends on the architecture of the particular device and the resolution of the light source and can be adjusted depending upon the particular goal of the embodiment or article being fabricated.

In some embodiments, the ratio of height to width of the product is at least 2:1, 10:1, 50:1, or 100:1, or more, or a width to height ratio of 1:1, 10:1, 50:1, or 100:1, or more.

In some embodiments, the product has at least one, or a plurality of, pores or channels formed therein, as discussed further below.

The processes described herein can produce products with a variety of different properties. Hence in some embodiments the products are rigid; in other embodiments the products are flexible or resilient. In some embodiments, the products are a solid; in other embodiments, the products are a gel such as a hydrogel. In some embodiments, the products have a shape memory (that is, return substantially to a previous shape after being deformed, so long as they are not deformed to the point of structural failure). In some embodiments, the products are unitary (that is, formed of a single polymerizable liquid); in some embodiments, the products are composites (that is, formed of two or more different polymerizable liquids). Particular properties will be determined by factors such as the choice of polymerizable liquid(s) employed.

In some embodiments, the product or article made has at least one overhanging feature (or "overhang"), such as a bridging element between two supporting bodies, or a cantilevered element projecting from one substantially vertical support body. Because of the unidirectional, continuous nature of some embodiments of the present processes, the problem of fault or cleavage lines that form between layers when each layer is polymerized to substantial completion and a substantial time interval occurs before the next pattern is exposed, is substantially reduced. Hence, in some embodiments the methods are particularly advantageous in reducing, or eliminating, the number of support structures for such overhangs that are fabricated concurrently with the article.

11. Build Plates with Surface Topology

According to some embodiments, the build plate may be configured to allow a polymerization inhibitor to reach the build surface. In particular, the build plate includes a rigid, optically transparent, gas-impermeable planar base having upper and lower surfaces, and an optically transparent sheet having upper and lower surfaces such that the sheet lower surface is positioned on the base upper surface. The base upper surface and/or the sheet lower surface have a surface topology that increases gas flow to the gas permeable sheet. For example, the surface topology may include a surface roughness that maintains a sufficient gap between the base and the sheet such that a polymerization inhibitor may flow through the gap through the permeable sheet and to the build surface. In some embodiments, the surface topology may reduce or prevent surface wetting or sticking between the base and the sheet.

In this configuration, a relatively thin, flexible permeable sheet may be used. The rigid base may serve to stabilize the flexible sheet and/or reduce or prevent warping or bowing, particularly in the lower direction, during three-dimensional object fabrication. The surface topology may be configured to sufficiently maintain an optical pathway of radiation passing through the window (e.g., by limiting any optical blocking or scattering) so as to minimize any effects on the resolution of the three-dimensional object fabrication. The sheet may be held against the plate by one or more clamps along the periphery or a "drum head" configuration.

Figure 6:
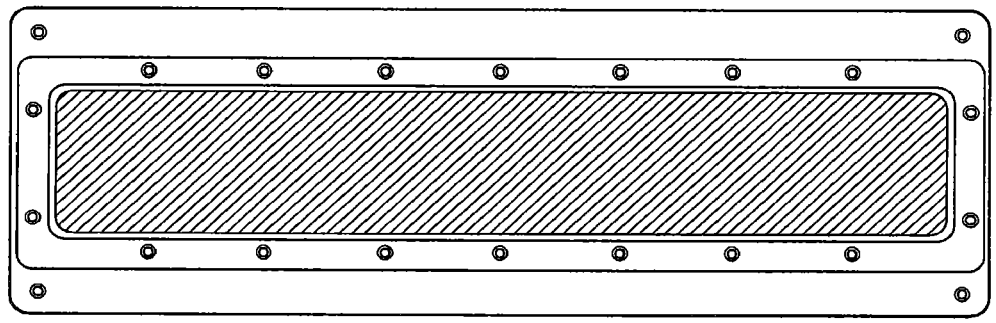
FIG. 6 is a top view of a 3 inch by 16 inch "high aspect" rectangular build plate (or "window") assembly of the present invention, where the film dimensions are 3.5 inch by 17 inch.
Figure 30:
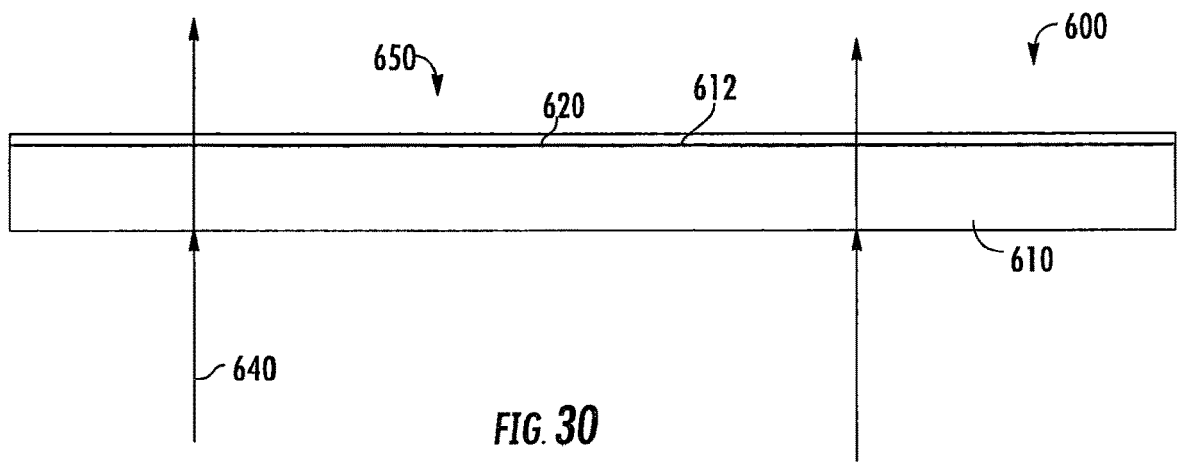
FIG. 30 is a cross sectional view of a laminated build plate.

As illustrated in FIG. 30, a configuration of a build plate 600 with generally smooth surfaces, i.e., without a surface topology that increases gas flow, is shown. The build plate 600 has a rigid support base 610 with a planar surface topology 612 and a permeable or semipermeable sheet 620 thereon is shown. Electromagnetic radiation 640 (e.g., from the radiation source 12 of FIG. 2) passes through the base 610 and the sheet 620 to define a build region 650, which is filled with liquid resin that is cured in a continuous liquid interface printing process to form a three-dimensional object as described herein. As shown in FIG. 6, the radiation 640 maintains substantially the same optical path as it passes through the build plate 600.

Figure 31:
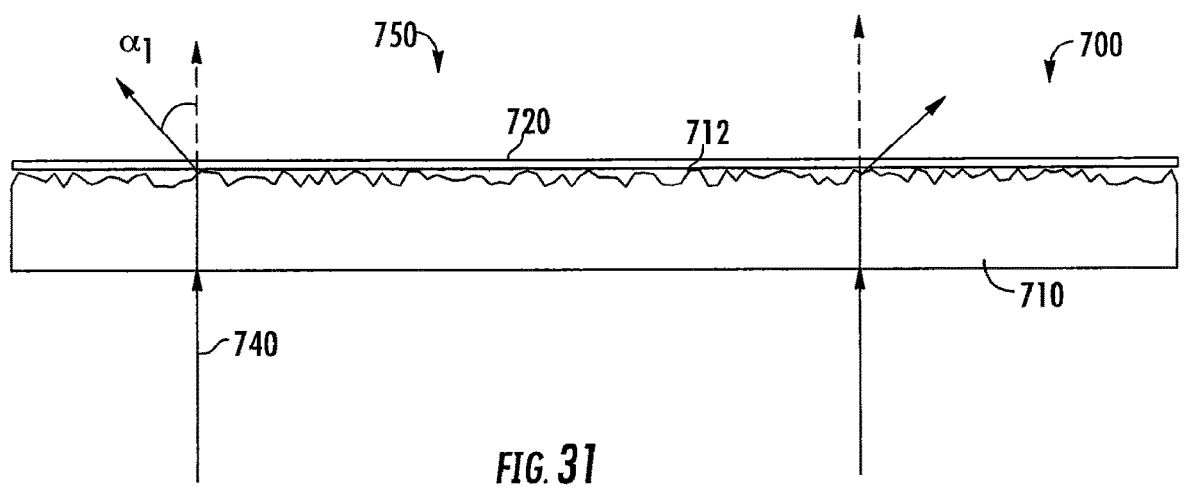
FIGS. 31 and 32 are cross sectional views of build plates having a base with a surface topology and a permeable sheet thereon that maintains a gap therebetween according to some embodiments.

As illustrated in FIG. 31, a build plate 700 having a rigid support base 710 with a rough surface topology 712 and a permeable or semipermeable sheet 720 thereon is shown. The sheet 720 is optionally held on the base 710 (e.g., by a tensioning ring or clamp, not shown) to hold the sheet 720 (which may otherwise be flexible) in a taut or rigid position, and electromagnetic radiation 740 passes through the plate 700 to a build region 750. Similarly, in FIG. 32, a build plate 800 includes a base 810 with a rough surface topology 812 and a permeable sheet or semipermeable sheet 820. Electromagnetic radiation 840 passes through the plate to a build region 850. The configuration in FIG. 32 has a surface topology 812 with a reduced roughness as compared to the surface topology 712 of FIG. 31.

Figure 32:
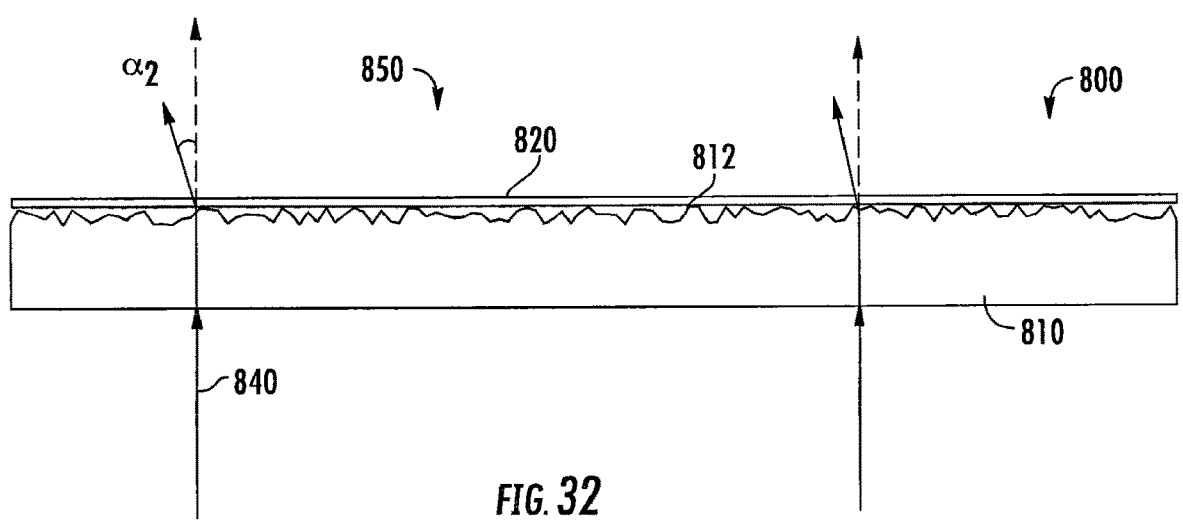

In contrast to FIG. 30, the surface topologies 712, 812 of FIGS. 31 and 32, respectively, have an uneven or rough surface. Although the surface roughness may cause scattering and/or blockage of the radiation 740, 840, which is normally not desirable, the surface roughness may be sufficient to maintain a gap between the bottom surface of the sheet 720, 820, respectively, but still maintain a suitable optical pathway of the radiation 740, 840. As illustrated in FIG. 31, the surface roughness 712 scatters the radiation 740 at an angle of $\alpha_1$, while the surface roughness 812 in FIG. 32, scatters the radiation 840 at an angle of $\alpha_2$, which is less than $\alpha_1$. It should be understood that the angles $\alpha_1$, $\alpha_2$ would vary over the longitudinal area of the sheets 720, 820 based on the particular geometry and scattering angles at a given location of the surface topology 712, 812; however, in general, a rougher surface would typically result in greater scattering angles than a smoother surface. In some embodiments, the optical scattering angle at all points along the longitudinal area of the sheet is less than 20%, 10%, 5.0% or 1.0%.

A smooth surface topology 612 as shown in FIG. 30 would result in very little, if any, light scattering or light blockage. However, in the configuration shown in FIG. 30, the gaspermeability of the sheet 612 may be limited to flow in the lateral direction. In FIGS. 31 and 32, the gap may permit additional polymerization inhibitor, such as oxygen or other gases, to flow through the gap to the respective build regions 750, 850. The surface roughness of the topology 712 in FIG. 31 is greater (i.e., more uneven) than that of the topology 812 in FIG. 32, which results in a greater average scattering angle $\alpha_1$ as compared with scattering angle $\alpha_2$.

Small areas of contact between the sheet 720, 820 and the base 710, 810 may be permitted because the polymerization inhibitor may travel through the sheet 720, 820 laterally as well as vertically. In some embodiments, the gap may be maintained such that any point on the bottom of the sheet is no more than a given distance from a continuous path to the supply of air from the perimeter of the build plate 700, 800. In particular embodiments, the distance is no more than about two to five times the thickness of the sheet 720, 820.

The surface roughness may include a random pattern of surface features. It should be understood that the term "random" includes patterns that are not perfectly random. The surface roughness may be formed by various techniques, including spraying the top surface of the base 710, 810 with an abrasive media to create surface features that may reduce the adhesion between the base 710, 810 and the sheet 720, 820. For example, if the base is formed of glass, spraying the base with glass beads of approximately 50-150 μm diameter with a stream of air pressurized to about 40, 60, 80, 90 to 100, 110, or 120 psi from a distance of about 2-10 inches may create pits in the glass ranging from about 0.1, 0.5, 1.0, 2.0 to 3.0, 4.0 or 5.0 μm deep and 1.0, 2.0, 5.0 to 7.0, 8.0 or 10 μm in diameter. If covering about 0.1%, 1.0%, 3.0%, 5.0% to 10%, 15% or 20% or more of the area of the base, these pits or indentations may effectively maintain a gap for the polymerization inhibitor. The surface roughness may be a random pattern.

Other abrasives may be used to create surface roughness, including aluminum oxide, crushed glass grit, glass beads, silicon carbide, pumice, steel shot and steel grit. Chemical etching may also be used to create a pattern of surface features. Acid solutions such as hydrofluorosilic acid, sodium fluoride and hydrogen fluoride may dissolve a base material, such as glass, slowly and can dissolve the material starting at microscopic surface imperfections that are randomly distributed across the surface. If the acid is left on the surface for a sufficiently short time, the acid may only affect small areas of the surface and may create indentations or pits similar to those formed by blasting.

Figure 36:
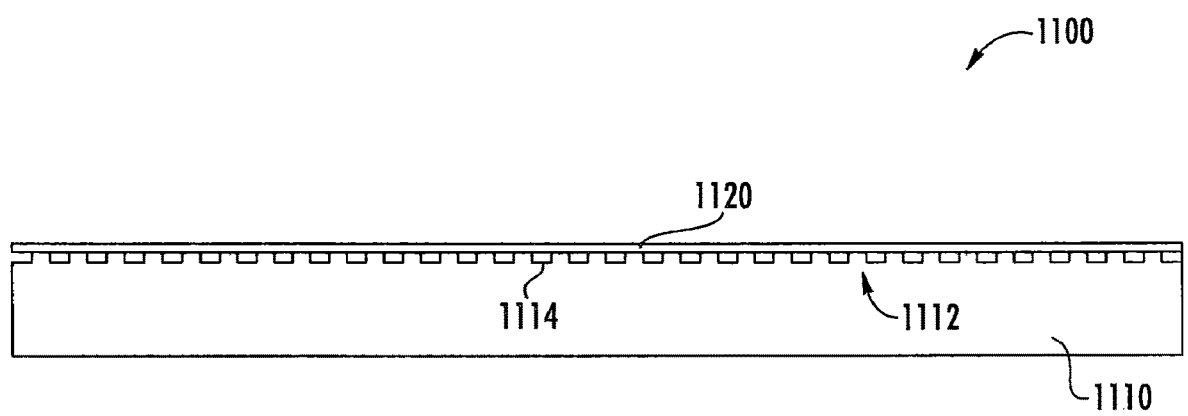
FIG. 36 is a cross sectional view of a build plate having a base with a non-random pattern according to some embodiments.

In some embodiments, the surface roughness on the base and/or the sheet may include a non-random set of patterned features having dimensions similar to those described herein, e.g., channels or wells ranging from about 0.1, 0.5, 1.0 to 2.0, 3.0, 4.0 or 5.0 μm deep and 1.0, 2.0, 3.0, 4.0 to 5.0, 6.0, 7.0, 8.0, 9.0 or 10 μm in width and/or length. The channels or wells may cover at least about 0.1%, 1.0%, 3.0%, 5.0% to 10%, 15% or 20% or more of the area of the base to maintain a gap for the polymerization inhibitor. For example, as illustrated in FIG. 36, a build plate 1100 has a rigid support base 1110 with a patterned surface topology 1112 including channels 1114 and a permeable or semipermeable sheet 1120 is on the base 1110.

Figure 33:
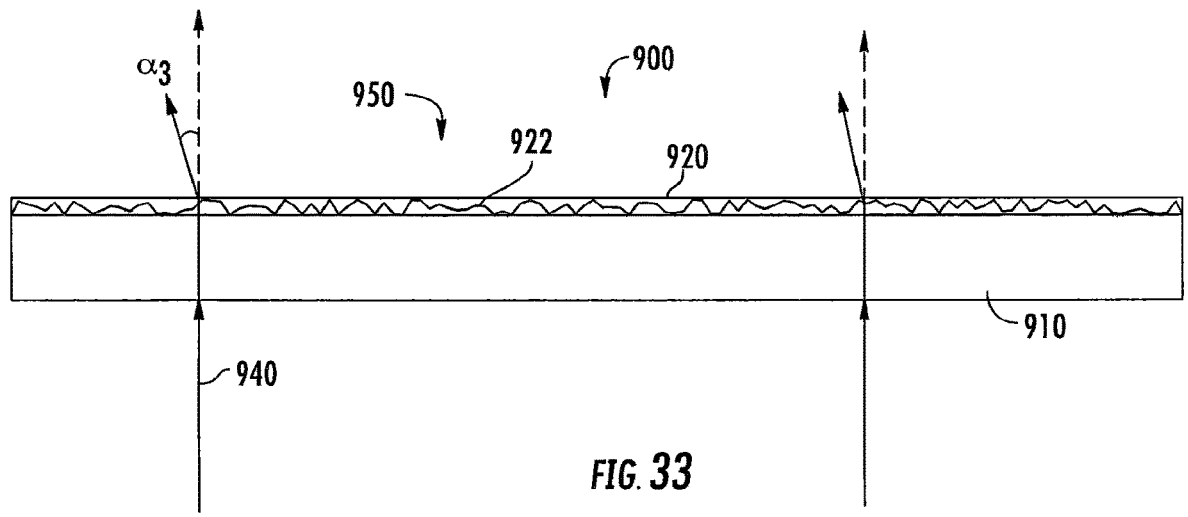
FIG. 33 is a cross sectional view of a build plate having a base and a permeable sheet with a surface topology that maintains a gap therebetween according to some embodiments.

In some embodiments, the surface topology that maintains the gap may be formed on the flexible sheet instead of on the base. As illustrated in FIG. 33, a build plate 900 having a rigid, gas-impermeable base 910 and a flexible sheet 920 with a surface topology 922 thereon. Radiation 940 passes through the base 910 and sheet 920 to define a build surface 950. The surface topology 922 may be similar or the same in terms of dimensions as that shown on the bases 710, 820 in FIGS. 31 and 32 and may be configured to form a gap between the base 910 and the sheet 920.

Without wishing to be bound by any particular theory, it is currently believed that trace amounts of fluid used for cleaning, moisture from the air (humidity), chemical components from the monomer resin that are able to migrate through the sheet are possible sources of small amounts of fluid that may block a continuous path for air or other polymerization inhibitors to areas of the build plate. If the top surface of the base and the bottom of the sheet are both sufficiently smooth (e.g., as shown in FIG. 30), then a very small amount of fluid may create an air free zone over a large area of the window, for example, by collecting in the area between the base and the sheet. Even a small amount of surface roughness as described in FIGS. 31 and 32 may reduce or eliminate the area over which fluid may spread and block the path of gas flow.

The permeability of the build plates described herein, via the sheet and the gap, to the polymerization inhibitor may depend upon conditions such as the pressure of the atmosphere and/or inhibitor, the choice of inhibitor, the rate or speed of fabrication, etc. In general, when the inhibitor is oxygen, the permeability of the semipermeable member to oxygen may be from 10 or 20 Barrers, up to 1000 or 2000 Barrers, or more. For example, a semipermeable sheet with a permeability of 10 Barrers used with pure oxygen or highly enriched oxygen, atmosphere under a pressure of 150 PSI may perform substantially the same as a semipermeable member with a permeability of 500 Barrers when the oxygen is supplied from the ambient atmosphere under atmospheric conditions.

Figure 34:
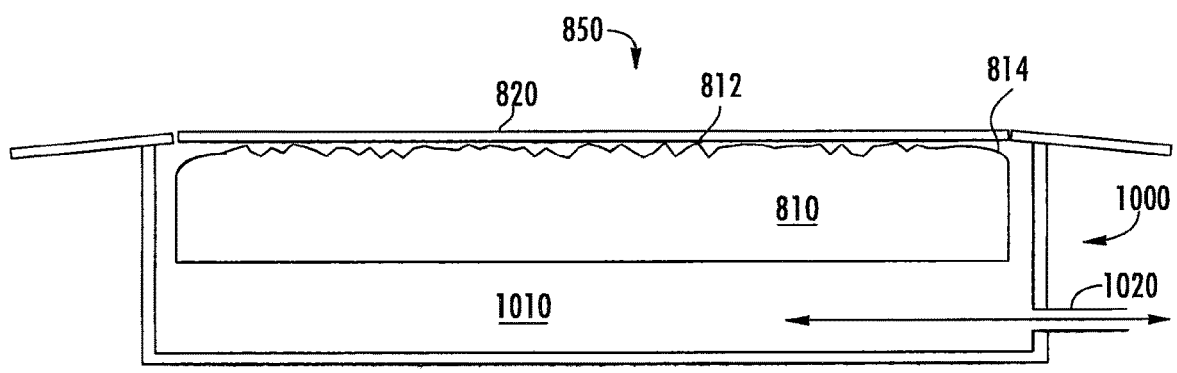
FIGS. 34 and 35 are cross sectional views of a build plate in a chamber according to some embodiments.
Figure 35:
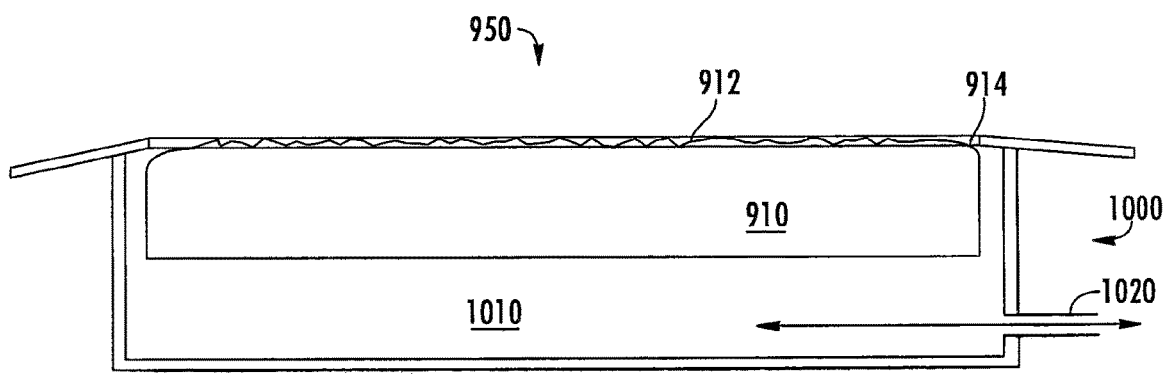

For example, as illustrated in FIG. 34, the base 810 may be positioned in a housing 1000 having an interior chamber 1010 and an inlet/outlet 1020. The base 810 may have a curved or beleved edge portion 814, which may increase gas flow to the build surface 850. A tensioning ring or clamp may be used to hold the sheet 820 on the chamber 1010 and adjacent the base 810. A tensioning ring or clamp may be used to hold the sheet 820 on the chamber 1010 and adjacent the base 810. The chamber 1010 may be a controlled pressure environment and/or may have a gas, such as a polymerization inhibitor (e.g., oxygen) supplied via the inlet/outlet 1020. Similarly, as illustrated in FIG. 35, the base 910 may be positioned in the housing 1000, and the base 910 may have a curved or beleved edge portion 914. In some embodiments, the sheet 810 may be held in position on the base 810 by creating a reduced pressure environment in the chamber 1010 with or without the use of additional holding mechanisms, such as a tensioning ring or clamp, while still providing sufficient polymerization inhibitor to maintain the dead zone. Reduced pressure of about 0.9 to 0.1 atm or about 0.5 atm may be used.

In some embodiments, the build plate comprises: (i) a polymer film layer such as the sheets (having any suitable thickness, e.g., from 0.001, 0.01, 0.1 or 1 millimeters to 5, 10 or 100 millimeters, or more), having a top surface positioned for contacting said polymerizable liquid and a bottom surface, and (ii) a rigid, impermeable, optically transparent supporting base, such as the base (having any suitable thickness, e.g., from 0.01, 0.1 or 1 millimeters to 10, 100, or 200 millimeters, or more), contacting said film layer bottom surface. The base may be formed of glass, silicone, quartz, sapphire, polymer materials or other optically transparent materials in the desired optical range.

Because an advantage of some embodiments of the present invention is that the size of the build surface on the build plate may be reduced due to the absence of a requirement for extensive lateral "throw" as in the Joyce or Chen devices noted above, in the methods, systems and apparatus of the present invention lateral movement (including movement in the X and/or Y direction or combination thereof) of the carrier and object (if such lateral movement is present) is preferably not more than, or less than, 80, 70, 60, 50, 40, 30, 20, or even 10 percent of the width (in the direction of that lateral movement) of the build region.

While in some embodiments the carrier is mounted on an elevator to advance up and away from a stationary build plate, on other embodiments the converse arrangement may be used: That is, the carrier may be fixed and the build plate lowered to thereby advance the carrier away therefrom. Numerous different mechanical configurations will be apparent to those skilled in the art to achieve the same result, in all of which the build plate is "stationary" in the sense that no lateral (X or Y) movement is required to replenish the inhibitor thereon, or no elastic build plate that must be stretched and then rebound (with associated over-advance, and back-up of, the carrier) need be employed.

12. Build Plates with an Adhered Permeable Sheet and Gas Flow Enhancing Features In some embodiments, additional or alternative gas flow enhancing features may be incorporated into the build plate. A gas flow enhancing feature includes any structure that increases permeability of the build plate and/or creates gaps or voids for gas flow. For example, an adhesive layer may be used to secure the permeable sheet to the base, for example, as illustrated in FIGS. 37-49, and a gas flow enhancing feature, such as a channel, other surface topology, or gas permeable material (e.g., mesh) for increasing gas flow to the build surface may be provided. The adhesive layer may be gas permeable.

Figure 37:
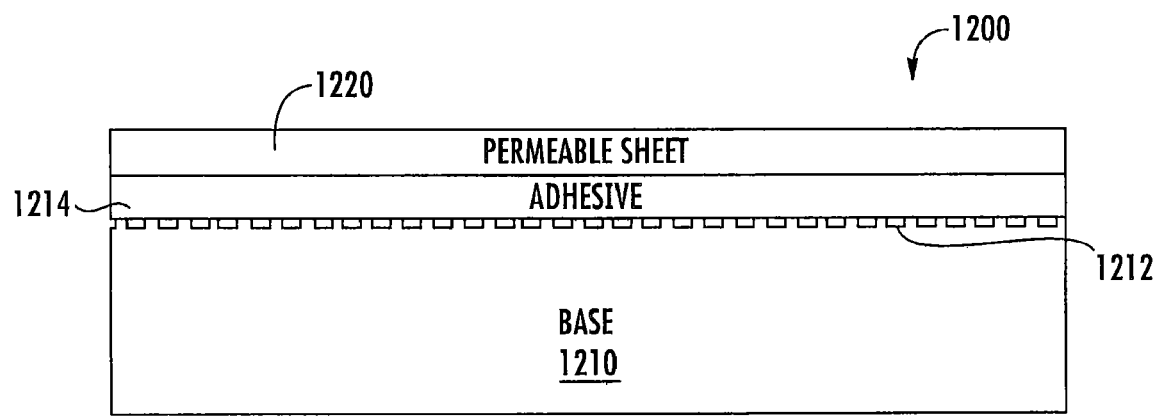
FIGS. 37-40 are cross sectional side views of build plates having an adhesive layer according to some embodiments.

As illustrated in FIG. 37, the build plate 1200 may include a rigid, optically transparent, gas-impermeable planar base 1210 having an upper surface with an uneven surface topology or channels 1212. An adhesive layer 1214 is on the upper surface of the base 1212. A permeable sheet 1220 has an upper surface that includes the build surface for forming a three-dimensional object. The lower surface of the permeable sheet is positioned on the adhesive layer 1214 opposite the base 1210. In this configuration, the build plate 1200 permits gas flow to the build surface because gas is permitted to flow through the channels 1212 and the gas permeable adhesive 1214 and permeable sheet 1220.

In particular embodiments, the permeable sheets described herein may have a thickness of about 5, 10, 50, 100, or 200 nm to 1.0, 5.0, 10, 50, 100 mm or greater (up to about 1-2 centimeters), the adhesive layer may have a thickness of about 1, 5, 10, 20, or 50 micron-100, 500, 1000 microns or greater (up to about 1-2 centimeters) and the channel layer may have a thickness of about 5, 10, 50, or 100 microns to 1, 5, 10, 50, 100 millimeters or more (up to 1-5 centimeters). The dimensions of the channels may be about 10, 20, 50 or 100 nm to 1, 5, 10, 100, 500 millimeters or more (up to about 1-2 centimeters).

The adhesive layers described herein may be a gas-permeable adhesive, such as a poly(dimethylsiloxane) (PDMS) film (e.g., as a silicone transfer film adhesive that can be applied using a polyester release liner, such as ARseal™8026 (Adhesives Research, Glen Rock, Pa. (USA)). The adhesive layer is preferably an adhesive that is both gas-permeable and has good adhesive qualities with respect to the material of the base (e.g., glass, silicone, quartz, sapphire, polymer materials) and the material of the sheet (e.g., polymers described below). In this configuration, air flow may be permitted through the uneven surface topology (channels 1212) of the base 1210, and through the gas permeable adhesive 1214 and sheet 1220.

Figure 38:
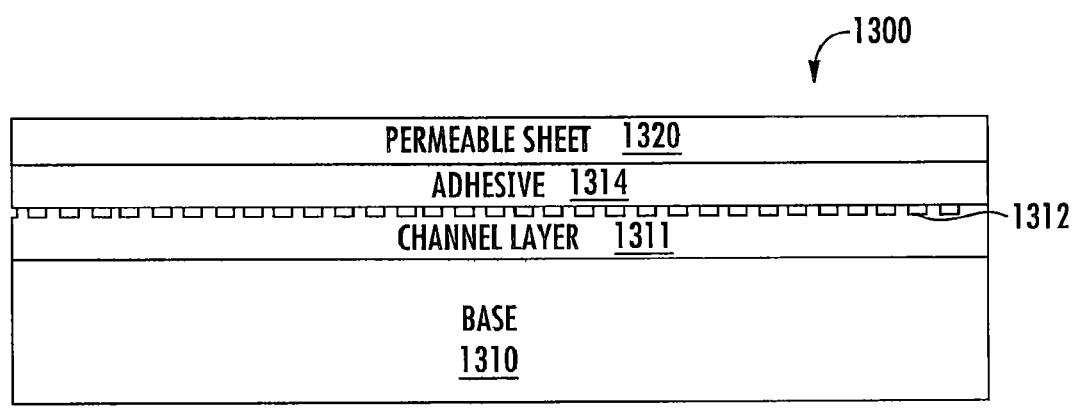

In some embodiments, the build plate may include two or more materials laminated or adhered to form the base/channels. As illustrated in FIG. 38, a build plate 1300 has a bottom support portion or base 1310 formed of a first material and a channel layer 1311 that includes the surface topology (channels) 1312. In some embodiments, the base 1310 and channel layer 1311 are formed of two different materials. For example, the channel layer 1311 may be a patterned rigid polymer that provides the surface topology 1312 and the base 1310 may be formed of glass, silicone, quartz, sapphire or polymer materials that are adhered to the top portion by an adhesive 1314 to a permeable sheet 1320. In this configuration, the base 1310 may be formed of a material that provides additional support, and the channel layer 1311 may be formed of a material that is easily formed to provide the surface topology 1312.

Figure 39:
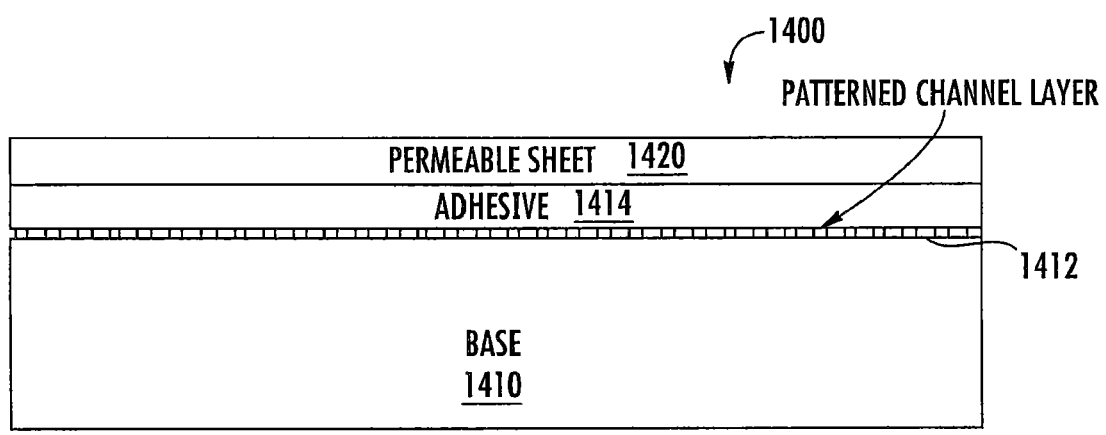

As shown in FIG. 39, a build plate 1500 includes a base 1510, a channel layer 1511 with a surface topology 1512, an adhesive layer 1514 and a permeable sheet 1520. The channel layer surface topology (channels) 1512 faces the base 1510 and may be formed of a gas-permeable material, such as a gas-permeable rigid polymer or other materials that may be molded, for example, by embossing or other suitable patterning techniques. The pattern may be formed by screen printing, etching, photolithography, and the like.

Figure 40:
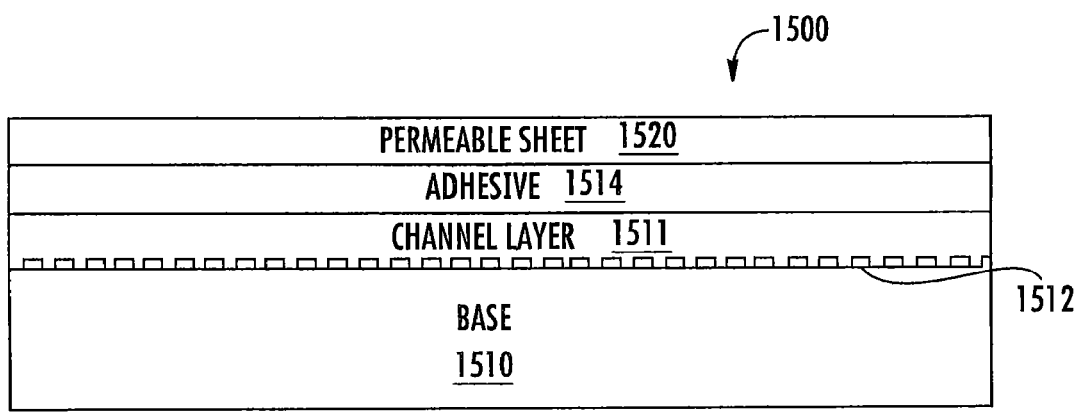

As shown in FIG. 40, a channel layer 1511 may be provided between the base 1510 and the adhesive 1514. The channel layer 1511 and adhesive 1514 may be formed of a gas permeable material, such that oxygen or other polymerization inhibitors may pass through the channels of the surface topology 1512, the gas permeable material of the channel layer 1511, the adhesive 1514 and the permeable sheet 1520 so that the build plate of FIG. 40 permits gas flow to the build plate surface. In some embodiments, the base 1510 may be formed of glass, silicone, quartz, sapphire or polymer materials and may be impermeable, although a permeable base layer may also be used. The channel layer 1511 may be formed of a molded permeable polymer, such as poly(dimethylsiloxane) (PDMS), including porous and composite PDMS materials.

Figure 41A:
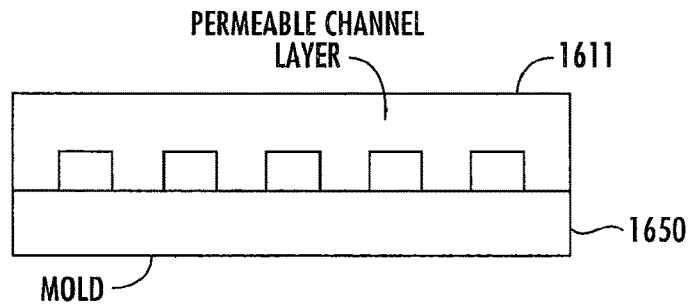
FIGS. 41A-41C are cross sectional side views illustrating methods of forming a build plate having a channel layer according to some embodiments.
Figure 41B:
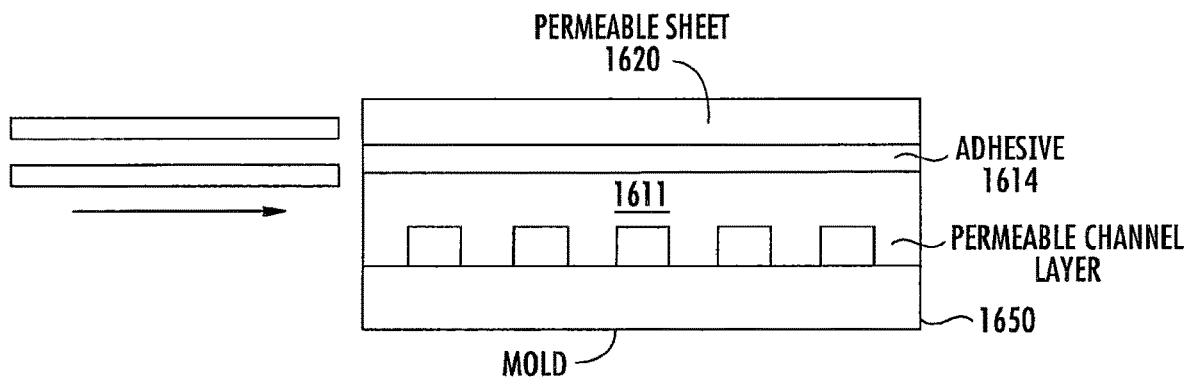
Figure 41C:
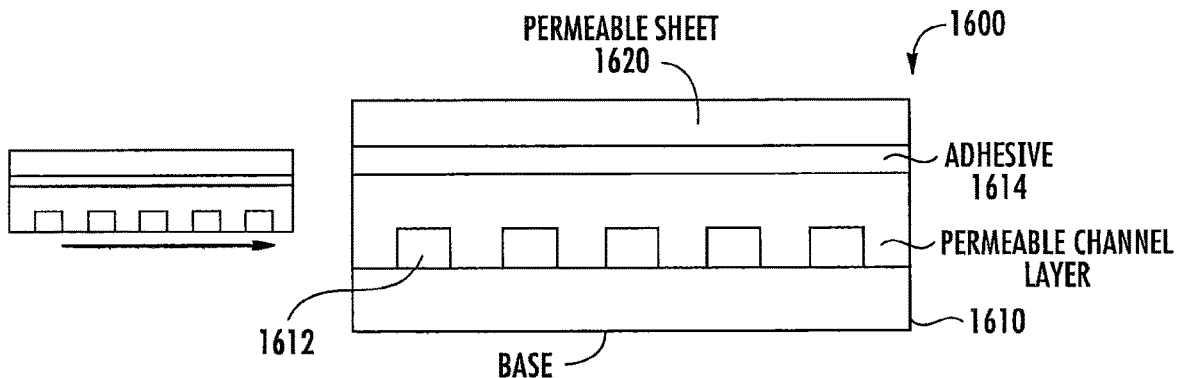

For example, as illustrated in FIGS. 41A-41C, a permeable channel layer 1611, such as a PDMS layer, may be pressed against or laminated on a channel mold 1650 (FIG. 41A) to form the channels 1612 on one side of the permeable channel layer 1611. An adhesive layer 1614 and a permeable sheet 1620 may be laminated on the permeable channel layer 1611 (FIG. 41B). As shown in FIG. 41B, the permeable channel layer 1611 is attached to the mold 1650 during lamination of the permeable sheet 1620 and adhesive layer 1614, which may reduce or prevent deformation or folding/wrinkling of the permeable channel layer 1611 when the permeable sheet 1620 and adhesive layer 1614 are attached. The mold 1650 may then be removed and the permeable channel layer 1611/adhesive 1614/permeable sheet 1620 may be attached to a base 1612 (FIG. 41C). In some embodiments, the permeable channel layer 1611 may be bonded to the base 1610 as shown in FIG. 41C by a chemical bonding method. For example, the channel layer 1611 may be formed of PDMS and may have an oxidative treatment to activate the PDMS surface and create a chemical bond to a base 1610, such as a glass base. Example bonding techniques include oxygen plasma treatments, UV ozone treatments and/or wet chemical treatments of the channel layer surface to create a bond with the base 1610. As illustrated, the channel layer 1611 includes channels on a bottom surface thereof; however, it should be understood that the channels may be formed at the top surface opposite the base.

Figure 42:
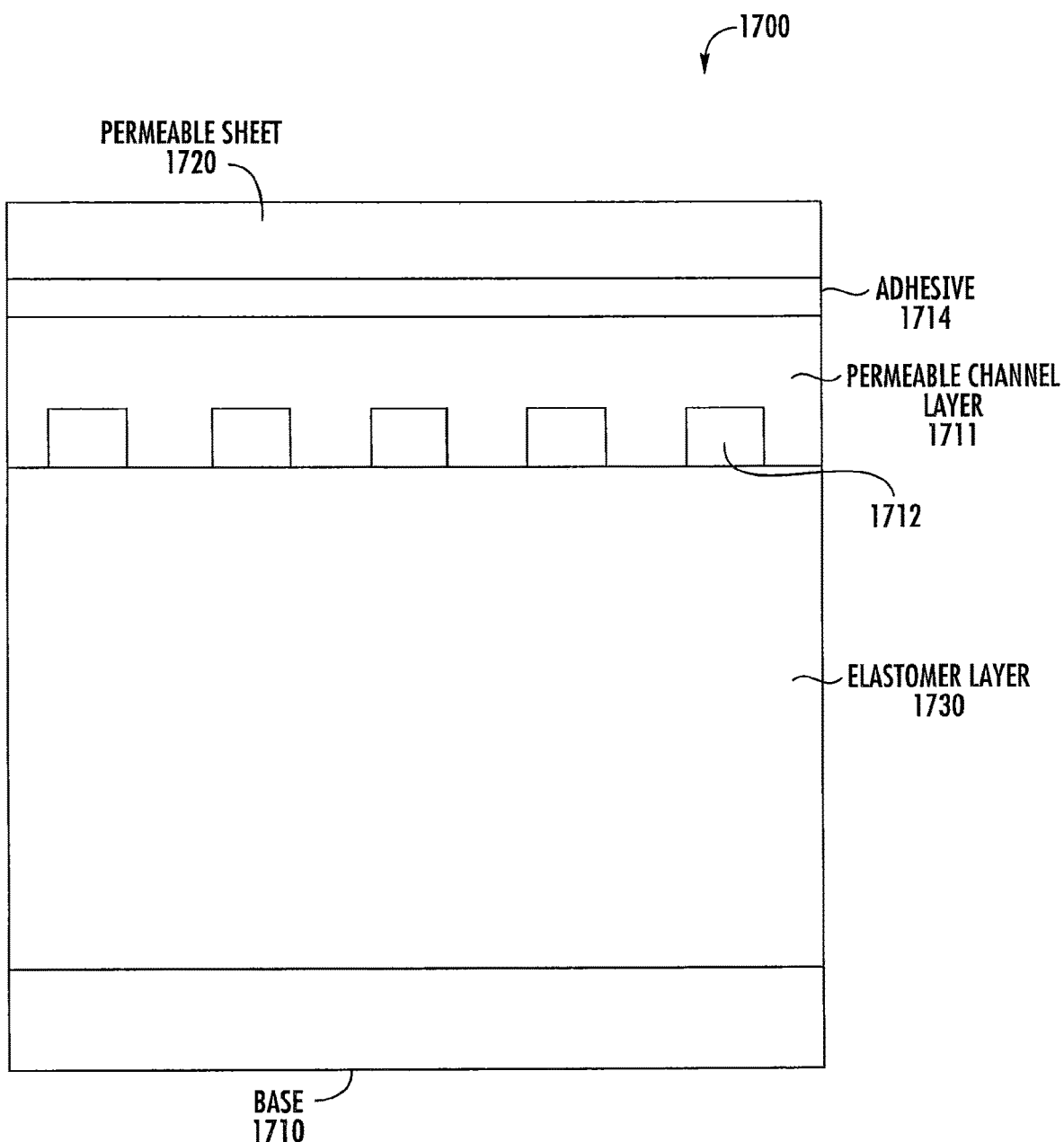
FIG. 42 is a cross sectional side view of a build plate according to some embodiments.

As illustrated in FIG. 42, in some embodiments, a build plate 1700 includes a base 1710, a permeable sheet 1720, a permeable channel layer 1711 having a surface topography 1712 and an adhesive 1714 that adheres the sheet 1720 to the channel layer 1711. An additional elastomer layer 1730 may be added between the base 1710 and the permeable channel layer 1711 to increase an elasticity of the build surface. The additional elastomer layer 1730 may be permeable or impermeable, and in some embodiments, the elastomer layer may be formed of a material that is less rigid than the base layer, such as silicone elastomer (Sylgard® 184 (Dow Corning, Midland, Mich., USA)) or PDMS used with a glass or quartz base. Without wishing to be bound by any particular theory, a mechanically responsive, pliant material (elastomer layer) may reduce pressure differentials caused by moving the build platform. In some embodiments, the build surface of the build plate 1700 may be pliant such that it oscillates up and down as the build platform and/or carrier is moved. The resulting movement may reduce or prevent the window surface from building up a large pressure differential as the three-dimensional object and/or carrier advances away from the build platform. In addition, the oscillation may facilitate flow of the resin to the build surface. It should be understood that the additional elastomer layer 1730 may be integrated together with the permeable channel layer 1711 and/or have channels at the top or bottom of the layer; however, a separate channel layer 1711 may provide channels in closer proximity to the build surface and consequently increase oxygen flow. Moreover, the elastomer layer may be made out of any suitable material, including impermeable layers and the channel layer 1711 may be formed of a gas permeable material as described herein. It should also be understood that the dimensions (thickness) of the additional elastomer layer 1711 may be selected to provide a desired mechanical elasticity at the build surface. For example, a thicker, harder material may respond similarly to thinner, softer elastomer layers. In some embodiments, the additional elastomer layer is 0.1, 0.5, 1, 3, 5, 6, 10 to 20, 50, or 100 mm thick and has a Young's modulus of about 0.5, 1.0 to 2.0, 2.5, 3.0 to 5.0, 10, 50 or 100 MPa.

In some embodiments, transparent, composite materials (e.g., composite elastomer/PDMS layers) may be used in one or more layers (the permeable sheet, the adhesive, the permeable channel layer, the elastomer layer and/or the base) to provide additional functionality. For example, luminescence-based oxygen sensing particles may be interspersed in one of the gas permeable layers to sense an oxygen concentration therein. The oxygen concentration at one of the layers may be used to estimate or extrapolate a concentration of oxygen in the resin. Examples of oxygen-sensitive indicators include fluorophores that include ruthenium-based molecules, metallo-porphyrin-type molecules, fluorescein compounds, polycyclic aromatic hydrocarbons and other organic compounds. See, e.g., S. M. Grist, L. Chrostowski, K. C. Cheung, *Optical Oxygen Sensors for Applications in Microfluidic Cell Culture*, Sensors, 10, 9286-9316 (2010) and U.S. Pat. No. 8,398,922, the disclosure of which is hereby incorporated by reference in its entirety. Accordingly, fluorescent oxygen sensing materials may be incorporated into the build plate and excited by either the radiation source (e.g., the radiation source 11 of FIG. 2) or by a separately provided radiation source. The amount of oxygen, for example, in the resin, may be based on a lifetime of the luminescence of the sensing material and/or an intensity of the luminescence of the sensing material. Moreover, the sensing material may be incorporated into the build plate or a portion of the build plate at a concentration that is sufficiently low so as to maintain sufficient transparency of the build plate.

As another example, conductive materials such as conductive nanoparticles may be used in one or more layers (the permeable sheet, the adhesive, the permeable channel layer, the elastomer layer and/or the base) to provide active heating of the build plate. Heating of the build plate may in turn heat the resin and reduce the viscosity of the resin. A voltage may be applied to the conductive, transparent material to drive a current, and the conductive material may function as a resistive heater. See X. Gong, W. Wen, *Polydimethylsiloxane-based Conducting Composites and their Applications in Microfluidic Chip Fabrication*, Biomicrofluidics, 3, 012007 (2009) and U.S. Pat. No. 8,243,358, the disclosure of which is hereby incorporated by reference in its entirety.

The rigid base and flexible sheet can be made of any suitable material that is optically transparent at the relevant wavelengths (or otherwise transparent to the radiation source, whether or not it is visually transparent as perceived by the human eye—i.e., an optically transparent window may in some embodiments be visually opaque). In some embodiments, the rigid base is impermeable with respect to the polymerization inhibitor.

In some embodiments, the flexible sheet may be formed from a thin film or sheet of material which is flexible when separated from the apparatus of the invention, but which is clamped and tensioned when installed in the apparatus (e.g., with a tensioning ring) so that it is rendered rigid in the apparatus. Polymer films are preferably fluoropolymer films, such as an amorphous thermoplastic fluoropolymer, in a thickness of 0.01 or 0.05 millimeters to 0.1 or 1 millimeters, or more. In some embodiments, Biogeneral Teflon AF 2400 polymer film, which is 0.0035 inches (0.09 millimeters) thick, and Random Technologies Teflon AF 2400 polymer film, which is 0.004 inches (0.1 millimeters) thick may be used. Tension on the film is preferably adjusted with a tension ring to about 10 to 100 pounds, depending on operating conditions such as fabrication speed.

Particular materials include TEFLON AF® fluoropolymers, commercially available from DuPont. Additional materials include perfluoropolyether polymers such as described in U.S. Pat. Nos. 8,268,446; 8,263,129; 8,158,728; and 7,435,495. For example, the sheet may include an amorphous thermoplastic fluoropolymer like TEFLON AF 1600™ or TEFLON AF 2400™ fluoropolymer films, or perfluoropolyether (PFPE), particularly a crosslinked PFPE film, or a crosslinked silicone polymer film. Many other materials are also possible to use, as long as the flux of the polymerization inhibitor is adequate to attenuate the photopolymerization to create the dead zone. Other materials could include semicrystalline fluoropolymers, such as thin films (10-50 microns thick) of fluorinated ethylene propylene (FEP), paraformaldehyde (PFA), polyvinylidene fluoride (PVDF) or other materials known in the art. The permeability of these materials (FEP, PFA, PVDF) to the polymerization inhibitor oxygen may be lower than TEFLON AF, but with the attenuation of oxygen concentration, oxygen pressure, temperature, and light characteristics (wavelength, intensity), adequate creation of the dead zone may be achieved.

It will be appreciated that essentially all solid materials, and most of those described above, have some inherent "flex" even though they may be considered "rigid," depending on factors such as the shape and thickness thereof and environmental factors such as the pressure and temperature to which they are subjected. In addition, the terms "stationary" or "fixed" with respect to the build plate is intended to mean that no mechanical interruption of the printing process occurs, or no mechanism or structure for mechanical interruption of the process (as in a layer-by-layer method or apparatus) is provided, even if a mechanism for incremental adjustment of the build plate (for example, adjustment that does not lead to or cause collapse of the gradient of polymerization zone) is provided.

The build plates, e.g., including the base and the sheet, has, in some embodiments, a total thickness of from 0.01, 0.1 or 1 millimeters to 10 or 100 millimeters, or more (depending upon the size of the item being fabricated, whether or not it is laminated to or in contact with an additional supporting plate such as glass, etc.).

The permeability of the build plates described herein, via the sheet and the channels or other gas flow enhancing feature, to the polymerization inhibitor will depend upon conditions such as the pressure of the atmosphere and/or inhibitor, the choice of inhibitor, the rate or speed of fabrication, etc. In general, when the inhibitor is oxygen, the permeability of the semipermeable member to oxygen may be from 10 or 20 Barrers, up to 1000 or 2000 Barrers, or more. For example, a semipermeable sheet with a permeability of 10 Barrers used with a pure oxygen, or highly enriched oxygen, atmosphere under a pressure of 150 PSI may perform substantially the same as a semipermeable member with a permeability of 500 Barrers when the oxygen is supplied from the ambient atmosphere under atmospheric conditions.

In some embodiments, the build plate comprises: (i) a polymer film layer such as the sheets (having any suitable thickness, e.g., from 0.001, 0.01, 0.1 or 1 millimeters to 5, 10 or 100 millimeters, or more), having a top surface positioned for contacting said polymerizable liquid and a bottom surface, and (ii) a rigid, impermeable, optically transparent supporting base, such as the base (having any suitable thickness, e.g., from 0.01, 0.1 or 1 millimeters to 10, 100, or 200 millimeters, or more), contacting said film layer bottom surface. The base may be formed of glass, silicone, quartz, sapphire, polymer materials or other optically transparent materials in the desired optical range.

Because an advantage of some embodiments of the present invention is that the size of the build surface on the build plate may be reduced due to the absence of a requirement for extensive lateral "throw" as in the Joyce or Chen devices noted above, in the methods, systems and apparatus of the present invention lateral movement (including movement in the X and/or Y direction or combination thereof) of the carrier and object (if such lateral movement is present) is preferably not more than, or less than, 80, 70, 60, 50, 40, 30, 20, or even 10 percent of the width (in the direction of that lateral movement) of the build region.

While in some embodiments the carrier is mounted on an elevator to advance up and away from a stationary build plate, on other embodiments the converse arrangement may be used: That is, the carrier may be fixed and the build plate lowered to thereby advance the carrier away therefrom. Numerous different mechanical configurations will be apparent to those skilled in the art to achieve the same result, in all of which the build plate is "stationary" in the sense that no lateral (X or Y) movement is required to replenish the inhibitor thereon, or no elastic build plate that must be stretched and then rebound (with associated over-advance, and back-up of, the carrier) need be employed.

Figure 43:
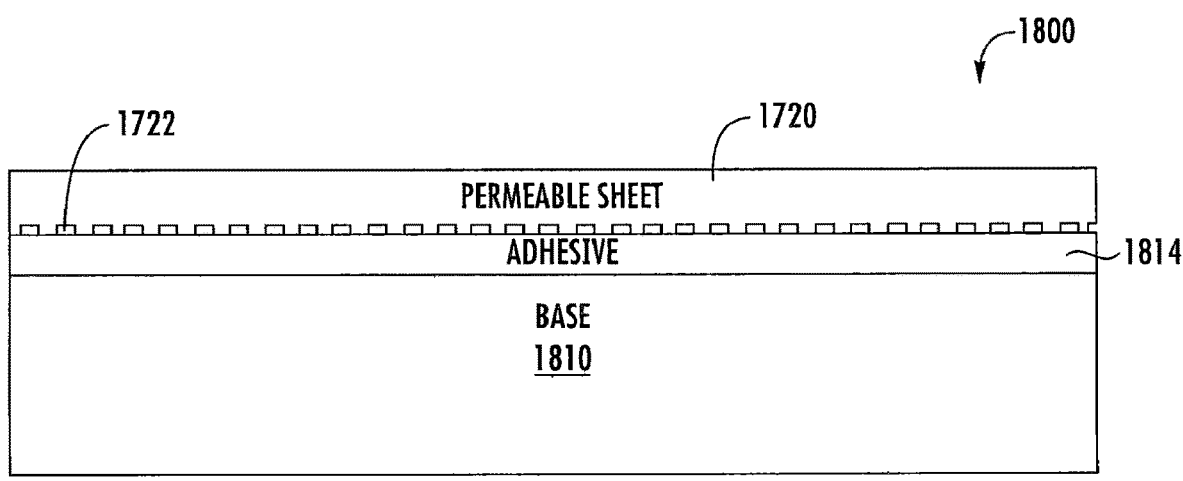
FIGS. 43-45 are cross sectional side views of build plates having an adhesive layer according to some embodiments.

In some embodiments, an adhesive layer may be used to secure a patterned permeable sheet to the base, for example, as illustrated in FIG. 43. As illustrated in FIG. 43, the build plate 1800 may include a rigid, optically transparent, gas-impermeable planar base 1810 having an upper surface and a lower surface with an adhesive layer 1814 on the upper surface of the base 1810. A permeable sheet 1720 has an upper surface that includes the build surface for forming a three-dimensional object. The lower surface of the permeable sheet 1720 includes an uneven surface topology or channels 1822 1722 and is positioned on the adhesive layer opposite the base 1810. In this configuration, the build plate 1800 permits gas flow to the build surface, e.g., via the surface topology channels 1722 of the permeable sheet 1720. In this configuration, air flow may be permitted through the uneven surface topology of the sheet, and through the gas permeable adhesive and sheet and/or fluid blockage may be reduced.

It should be understood that, although the surface topology shown in FIGS. 36-48 is illustrated as a regular pattern, additional patterned surface may be used, including random etched surfaces, such as those shown in FIGS. 31-35. Moreover, additional layers may be added to the build plates. For example, embodiments are illustrated as an adhesive layer and a permeable sheet on the base; however, an additional adhesive layer may be applied to the permeable sheet and an additional permeable sheet may be positioned on the additional adhesive layer in a stacked configuration. Three or more adhesive/sheet layers may be used. The additional permeable sheets may or may not include a surface topology for increasing air flow to the build surface.

Figure 44:
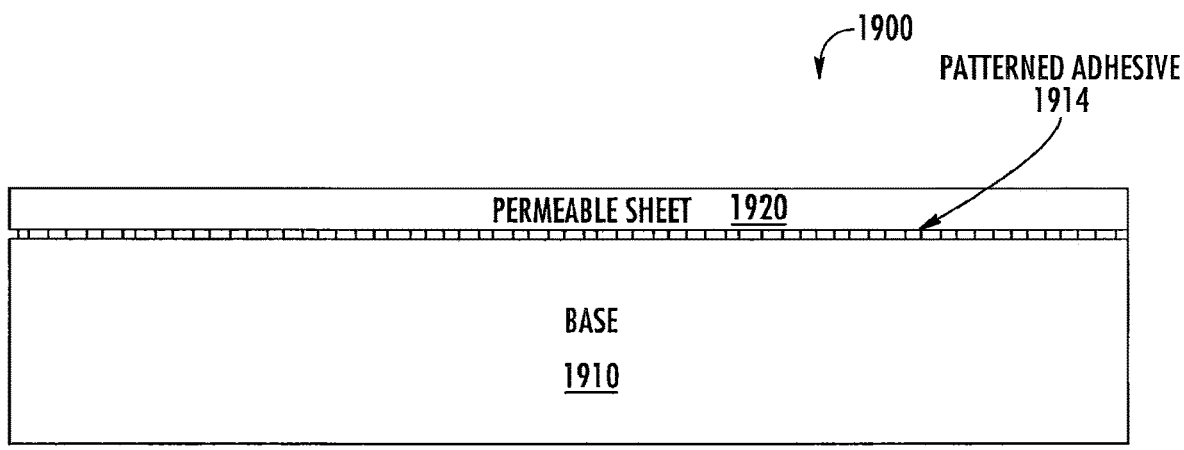
Figure 45:
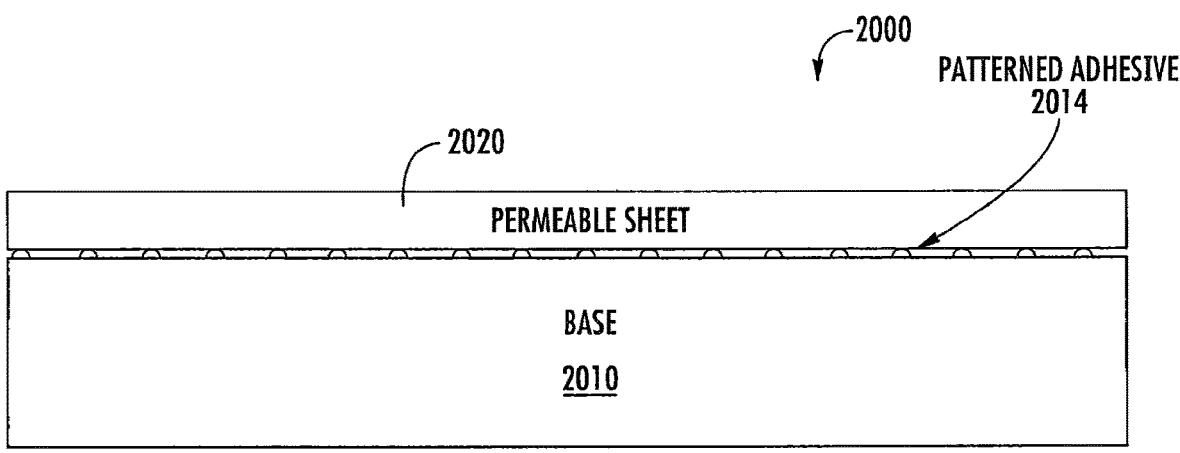

In some embodiments, a patterned adhesive layer may be used to secure the permeable sheet to the base, for example, as illustrated in FIGS. 44-46. As illustrated in FIG. 44, the build plate 1900 may include a rigid, optically transparent, gas-impermeable planar base 1910 having an upper surface and a lower surface. The adhesive layer 1914 is on the upper surface of the base 1910. The permeable sheet 1920 has an upper surface that includes the build surface for forming a three-dimensional object. The lower surface of the permeable sheet 1920 is positioned on the adhesive layer 1914 opposite the base. In this configuration, the build plate 1900 permits gas flow to the build surface, for example through the channels or gaps between the adhesive portions the form the patterned adhesive layer 1914. As shown in FIG. 45, the patterned adhesive 2014 of the build plate 2000 may be drops or beads of adhesive that may be deposited by a spray nozzle or pipette droplet dispenser in a pattern between the base 2010 and the sheet 2020.

Figure 46A:
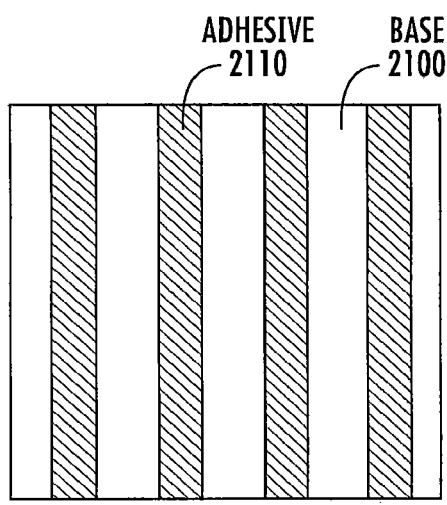
FIGS. 46A-46C are top views of the base of a build plate having an adhesive layer according to some embodiments illustrating examples of adhesive patterns.
Figure 46B:
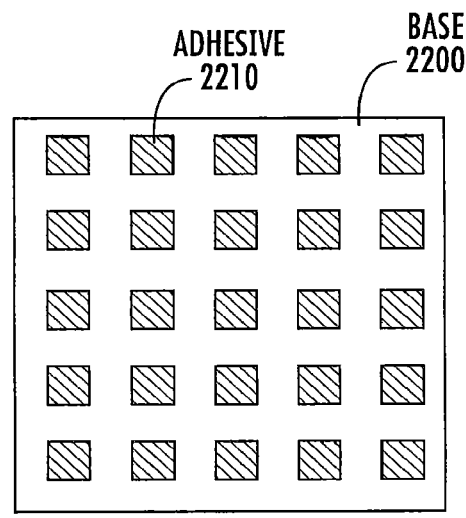
Figure 46C:
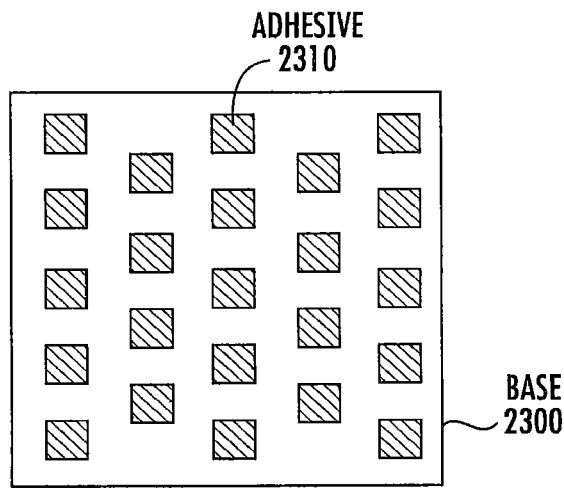

The adhesive pattern layer may be any suitable pattern that permits sufficient air/gas flow to the built surface of the build plate. For example, as shown in FIG. 46A, the adhesive pattern may be in strips 2110 that form gas channels therebetween and are positioned on the base 2100. In FIG. 46B the adhesive pattern is in the form of squares 2210 on the base, and in FIG. 46C, the adhesive pattern is in the form of an alternative pattern of squares 2310 on the base 2300. The longitudinal profile of the adhesive may also be in any suitable shape (rectangles, rounded edges, etc.).

The adhesive layer may be a gas-permeable adhesive, such as a poly(dimethylsiloxane) (PDMS) film (e.g., a silicon transfer film adhesive that is applied using a polyester release liner, such as ARseal™8026 (Adhesives Research, Glen Rock, Pa. (USA)). The adhesive layer is preferably an adhesive that is both gas-permeable and has good adhesive qualities with respect to the material of the base (e.g., glass, silicon, quartz, sapphire, polymer materials) and the material of the sheet (e.g., polymers described below). However, in some embodiments, the adhesive in not necessarily gas-permeable, and sufficient gas flow may be obtained through the gaps or channels between the adhesive portions. Moreover, the adhesive may be sprayed on the base in a random pattern, for example that may be sprayed onto the top surface of the base. Any suitable technique may be used to form the adhesive pattern, including screen printing, etching, photolithography and the like.

The patterned adhesive may be applied to a smooth base and/or permeable sheet as illustrated in FIGS. 44-45 or the base and/or permeable sheet may also have a pattern, such as those shown in FIGS. 31-35. Moreover, additional layers may be added to the build plates. For example, although FIGS. 44-45 illustrate an adhesive layer and a permeable sheet on the base, an additional adhesive layer may be applied to the permeable sheet and an additional permeable sheet may be positioned on the additional adhesive layer in a stacked configuration. Three or more adhesive/sheet layers may be used. The additional adhesive layers may be patterned adhesive layers or may be a substantially continuous adhesive sheet (such as a gas-permeable adhesive sheet). The dimensions of the adhesive pattern may be similar or the same as those described above with respect to a patterned base or permeable sheet.

Figure 47:
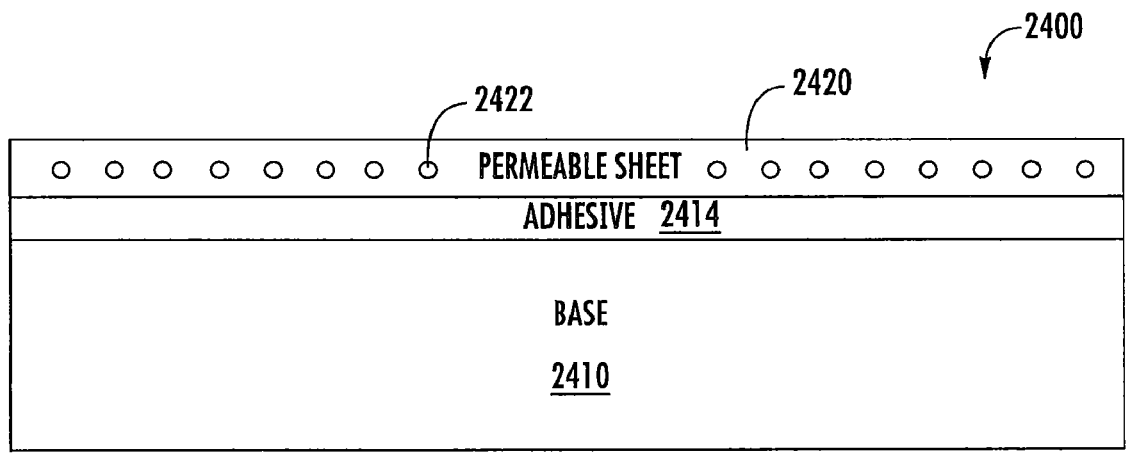
FIGS. 47-48 are cross sectional side views of build plates having a permeable sheet having channels therein according to some embodiments.
Figure 48:
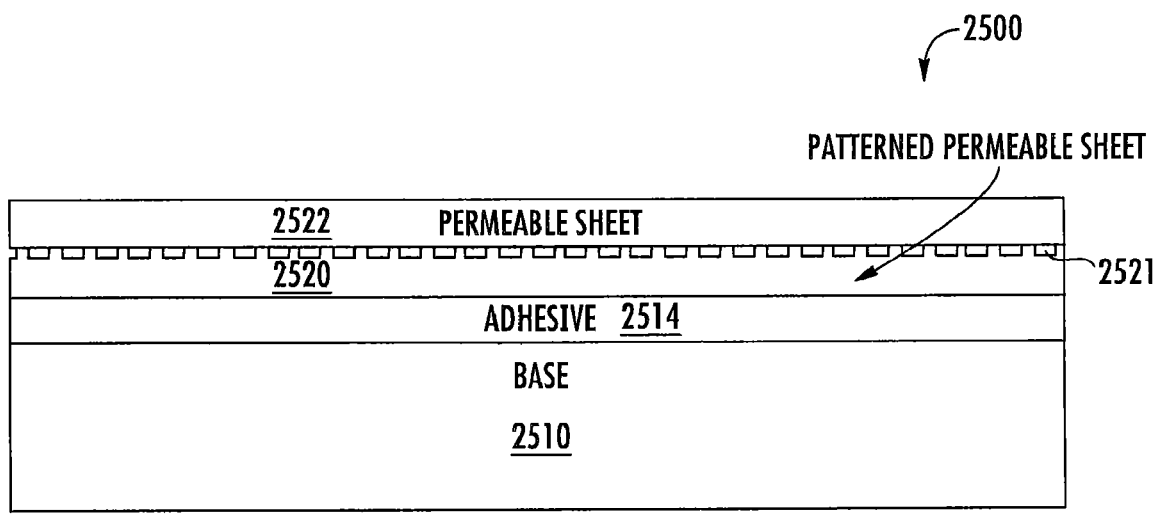

In some embodiments, an adhesive layer may be used to secure the permeable sheet to the base and the permeable sheet may include channels, for example, as illustrated in FIGS. 47 and 48. As illustrated in FIG. 47, the build plate 2400 may include a rigid, optically transparent, gas-impermeable planar base 2410 having an upper surface and a lower surface with an adhesive layer 2414 on the upper surface of the base 2410. The permeable sheet 2420 has an upper surface that includes the build surface for forming a three-dimensional object. Channels 2422 may be formed in the sheet 2420 to increase the gas flow to the build surface. As shown in FIG. 48, a build plate 2500 includes a patterned permeable sheet 2420 that is adhered (e.g., by lamination or by an adhesive) to another permeable sheet 2522 to form channels 2521. The sheet 2420 is mounted on the base 2510 by an adhesive 2514.

The channels of FIGS. 47 and 48 may be formed by any suitable technique. For example, two or more permeable sheet layers may be laminated together. In some embodiments, a spacer, such as a plurality of tubes, may be positioned between the layers during lamination. When the spacers are removed, the resulting laminated sheet includes apertures or channels where the spacers were positioned. In some embodiments, such as shown in FIG. 48, the permeable sheet may include a patterned sheet 2520 and an unpatterned sheet 2522 that are laminated to one another, such as through thermal lamination. The surface topology of pattern on the patterned sheet layer 2520 thus provides the channels 2521 in the resulting laminated sheet. The surface topology may include a rough surface having irregular and/or random features; however, in some embodiments, the surface topology may be molded or otherwise formed in a regular or somewhat regular pattern. The surface topology and/or the channels may dimensions of between about 10-25 µm wide and about 50-100 µm deep. The surface topology of the patterned sheet 2520 may be formed by a mechanical abrasive, chemical, etching and/or laser cutting.

Figure 49:
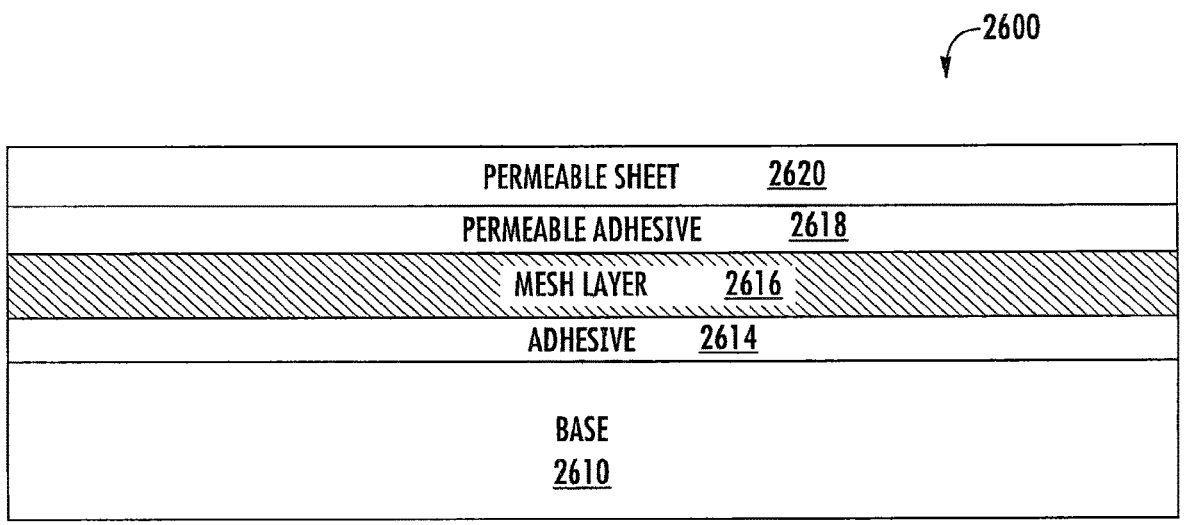
FIG. 49 is a cross sectional side view of a build plate having a mesh layer according to some embodiments.

In some embodiments, the channel layer may be provided by a mesh layer that may be used to increase gas flow to the build plate surface. As illustrated in FIG. 49, a build plate 2600 includes a rigid, optically transparent planar base 2610 having an upper surface and an opposing lower surface, a first adhesive layer 2614 on the base upper surface, and a mesh layer 2616 on the adhesive layer 2614 opposite the base 2610. A second gas permeable adhesive layer 2618 is on the mesh layer 2616 opposite the base 2610. A flexible, optically transparent, gas-permeable sheet 2620 is on the second adhesive layer 2618 opposite the base. The sheet 2620 has upper and lower surfaces and includes a build surface for forming a three-dimensional object on the upper surface. The build plate 2600 is configured to permit gas flow to the build surface via the mesh layer 2616, the permeable adhesive 2618 and the permeable sheet 2620.

The mesh layer 2616 may include a polyester screen mesh, or a fiberglass fabric. The mesh layer 2616 may be optically transparent. In some embodiments, the mesh layer has cross-linked fibers or other materials having a thickness of about 10-50 microns or, more preferably, 25 microns. The spacing or pitch between the fibers may be between about 50-500 microns.

The first adhesive layer 2614 may be gas permeable or gas impermeable. The first and/or second adhesive layers 2614, 2618 may be formed of a poly(dimethylsiloxane) (PDMS) film (e.g., a silicon transfer film adhesive).

In this configuration, the mesh layer 2616 provides a plurality of channels that increase gas flow to the build surface. The mesh layer 2616 may have any suitable thickness or dimensions for increasing gas flow to the build surface of the sheet; however, in some embodiments, the mesh layer 2616 has a thickness in a vertical direction of about 10-50 microns.

It should be understood that additional mesh layers may be provided. For example, two or more mesh layers may be adhered to one another by an adhesive layer.

It should be understood that additional layers may be added to the build plates. For example, an additional adhesive layer may be applied to the permeable sheet and an additional permeable sheet may be positioned on the additional adhesive layer in a stacked configuration. Three or more adhesive/sheet layers may be used. Two or more mesh layers may also be used. An elastomer layer analogous to the elastomer layer 1730 may also be included between the base and the mesh layer 2616.

12. Alternate Methods and Apparatus.

While the present invention is preferably carried out by continuous liquid interphase polymerization, as described in detail above and in further detail below, in some embodiments alternate methods and apparatus for bottom-up three-dimension fabrication may be used, including layer-by-layer fabrication. Examples of such methods and apparatus include, but are not limited to, those described in U.S. Pat. No. 5,236,637 to Hull, U.S. Pat. No. 7,438,846 to John and U.S. Pat. No. 8,110,135 to El-Siblani, and in U.S. Patent Application Publication Nos. 2013/0292862 to Joyce and 2013/0295212 to Chen et al. The disclosures of these patents and applications are incorporated by reference herein in their entirety.

The present invention is explained in greater detail in the following non-limiting Examples, and features which may be incorporated in carrying out the present invention are further explained in PCT Applications Nos. PCT/US2014/015486 (also published as US 2015/0102532); PCT/US2014/015506 (also published as US 2015/0097315), PCT/US2014/015497 (also published as US 2015/0097316), and in J. Tumbleston, D. Shirvanyants, N. Ermoshkin et al., *Continuous liquid interface production of 3D Objects*, Sciencexpress (16 Mar. 2015).

Example 1

High Aspect Ratio Adjustable Tension Build Plate Assembly

Figure 7:
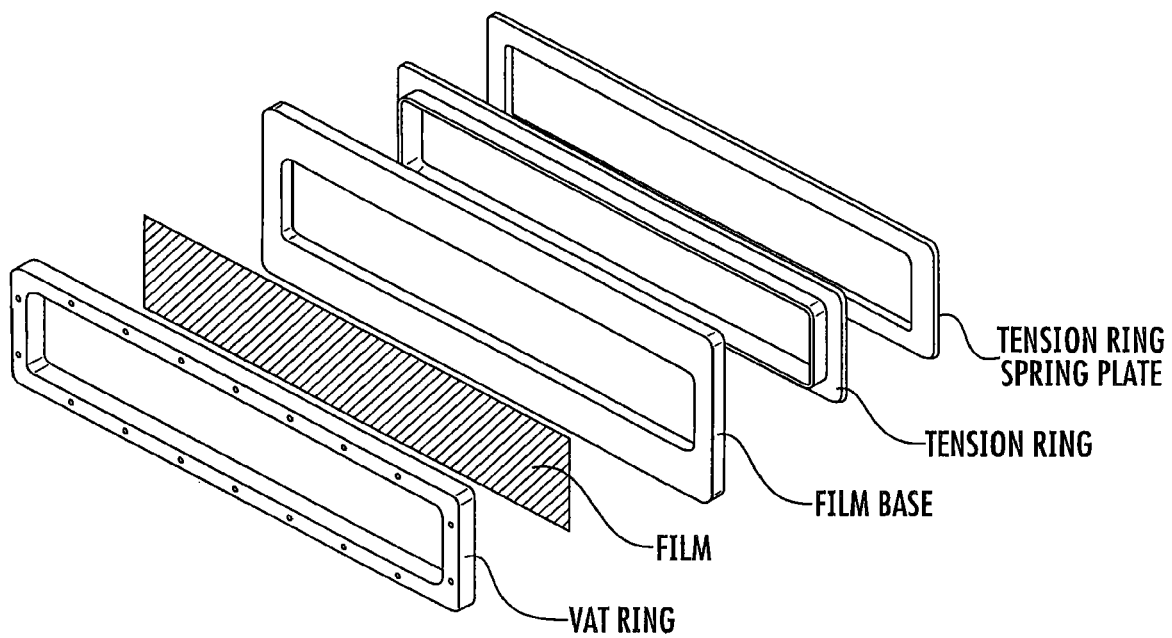
FIG. 7 is an exploded view of the build plate of FIG. 6, showing the tension ring and tension ring spring plate.

FIG. 6 is a top view and FIG. 7 is an exploded view of a 3 inch by 16 inch "high aspect" rectangular build plate (or "window") assembly of the present invention, where the film dimensions are 3.5 inches by 17 inches. The greater size of the film itself as compared to the internal diameter of vat ring and film base provides a peripheral or circumferential flange portion in the film that is clamped between the vat ring and the film base, as shown in side-sectional view in FIG. 8. One or more registration holes (not shown) may be provided in the polymer film in the peripheral or circumferential flange portion to aid in aligning the polymer film between the vat ring and film base, which are fastened to one another with a plurality of screws (not shown) extending from one to the other (some or all passing through holes in the peripheral edge of the polymer film) in a manner that rigidly and securely clamps the polymer film therebetween, while optionally allowing some flexibility to contribute to embodiments employing vertical reciprocation, as noted above.

Figure 8:
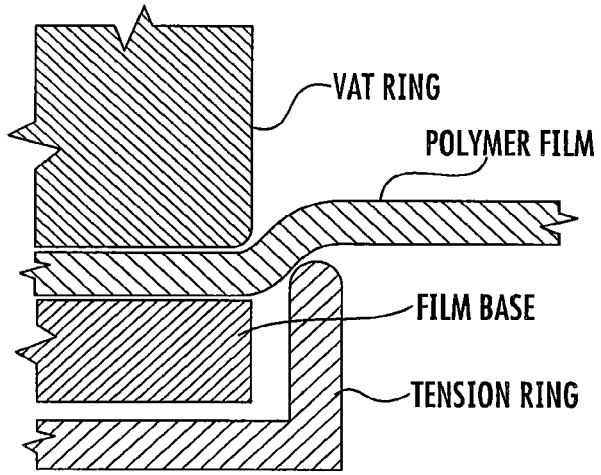
FIG. 8 is a side sectional view of the build plates of FIGS. 6-9, showing how the tension member tensions and fixes or rigidifies the polymer film.

As shown in FIGS. 7-8 a tension ring is provided that abuts the polymer film and stretches the film to fix or rigidify the film. The tension ring may be provided as a pre-set member, or may be an adjustable member. Adjustment may be achieved by providing a spring plate facing the tension ring, with one or more compressible elements such as polymer cushions or springs (e.g., flat springs, coil springs, wave springs etc.) therebetween, and with adjustable fasteners such as screw fasteners or the like passing from the spring plate through (or around) the tension ring to the film base.

Polymer films are preferably fluoropolymer films, such as an amorphous thermoplastic fluoropolymer, in a thickness of 0.01 or 0.05 millimeters to 0.1 or 1 millimeters, or more. In some embodiments we use Biogeneral Teflon AF 2400 polymer film, which is 0.0035 inches (0.09 millimeters) thick, and Random Technologies Teflon AF 2400 polymer film, which is 0.004 inches (0.1 millimeters) thick.

Tension on the film is preferably adjusted with the tension ring to about 10 to 100 pounds, depending on operating conditions such as fabrication speed.

The vat ring, film base, tension ring, and tension ring spring plate may be fabricated of any suitable, preferably rigid, material, including metals (e.g., stainless steel, aluminum and aluminum alloys), carbon fiber, polymers, and composites thereof.

Registration posts and corresponding sockets may be provided in any of the vat ring, film base, tension ring and/or spring plate, as desired.

Example 2

Round Adjustable Tension Round Build Plate Assembly

Figure 9:
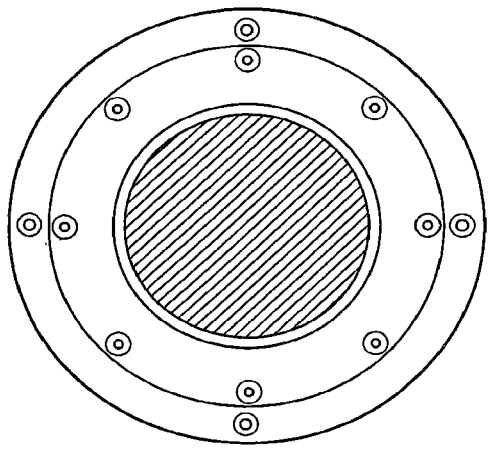
FIG. 9 is a top view of a 2.88 inch diameter round build plate of the invention, where the film dimension may be 4 inches in diameter.
Figure 10:
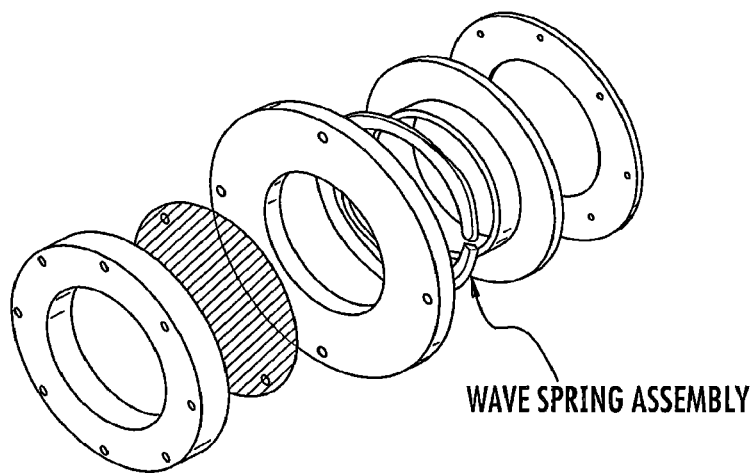
FIG. 10 is an exploded view of the build plate of FIG. 8.

FIG. 9 is a top view and FIG. 10 is an exploded view of a 2.88 inch diameter round build plate of the invention, where the film dimension may be 4 inches in diameter. Construction is in like manner to that given in Example 1 above, with a circumferential wave spring assembly shown in place. Tension on the film preferably adjusted to a like tension as given in Example 1 above (again depending on other operating conditions such as fabrication speed).

FIG. 10 is an exploded view of the build plate of FIG. 8.

Example 3

Additional Embodiments of Adjustable Build Plates

Figure 11:
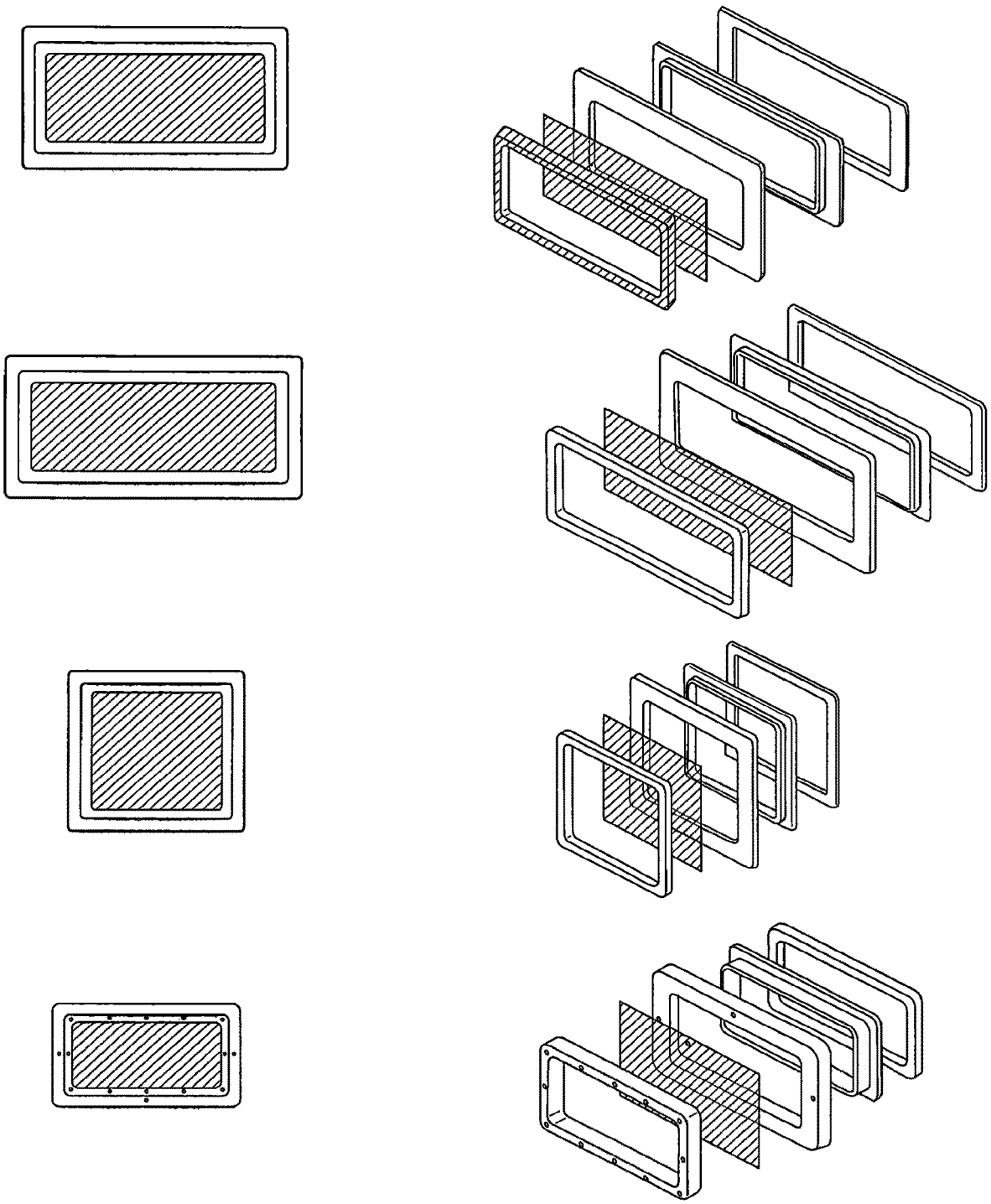
FIG. 11 shows various alternate embodiments of the build plates of FIGS. 7-10.

FIG. 11 shows various alternate embodiments of the build plates of FIGS. 7-10. Materials and tensions may be in like manner as described above.

Example 4

Example Embodiment of an Apparatus

Figure 12:
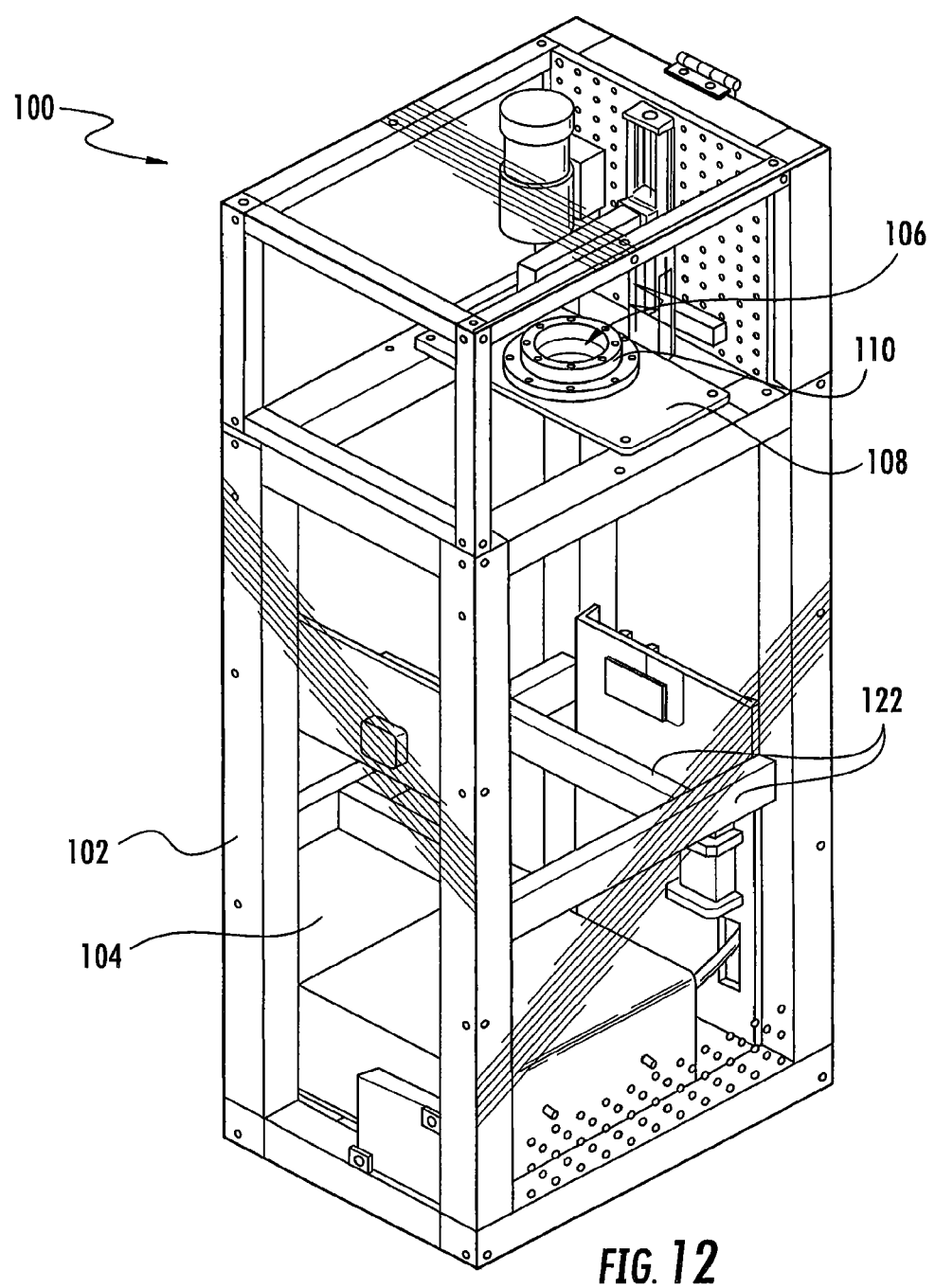
FIG. 12 is a front perspective view of an apparatus according to an exemplary embodiment of the invention.
Figure 13:
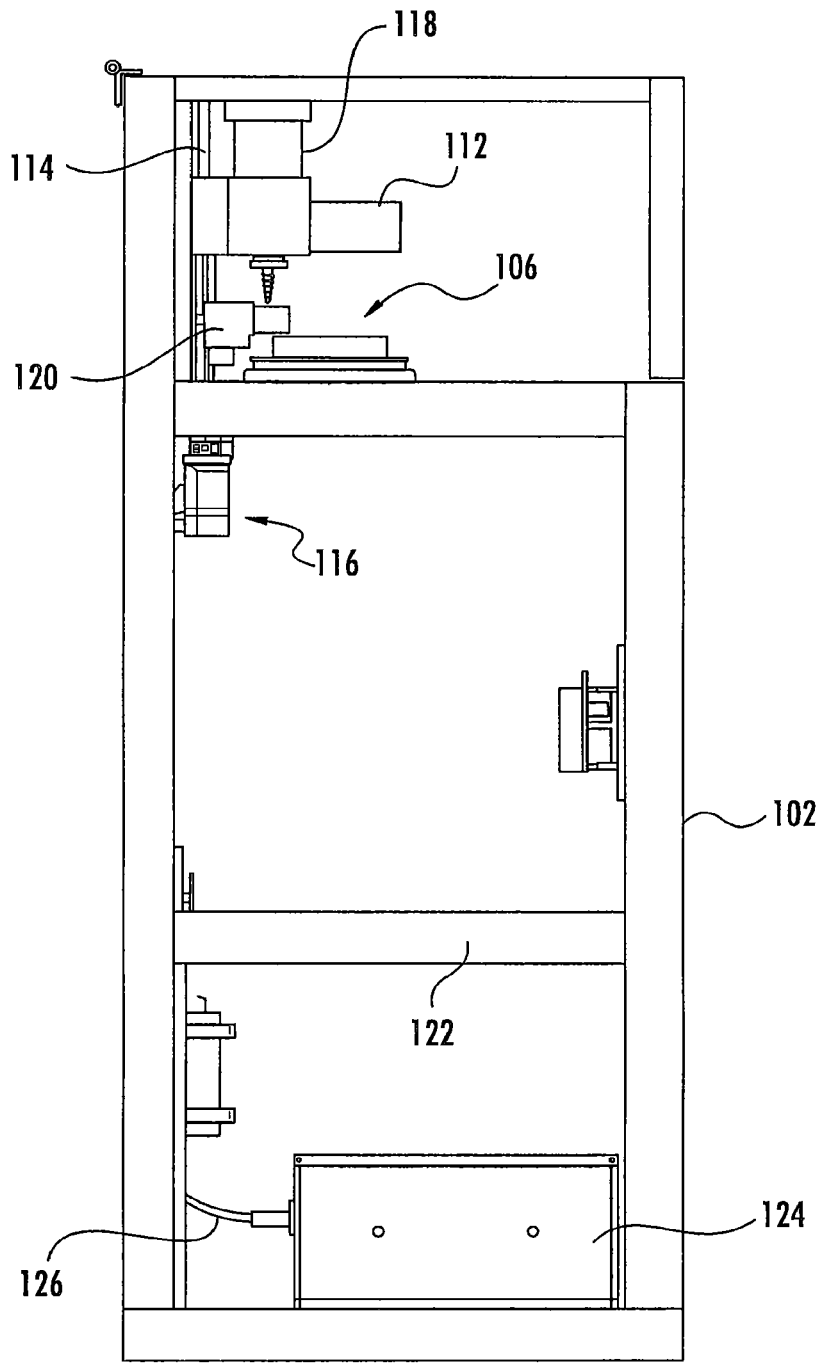
FIG. 13 is a side view of the apparatus of FIG. 12.
Figure 14:
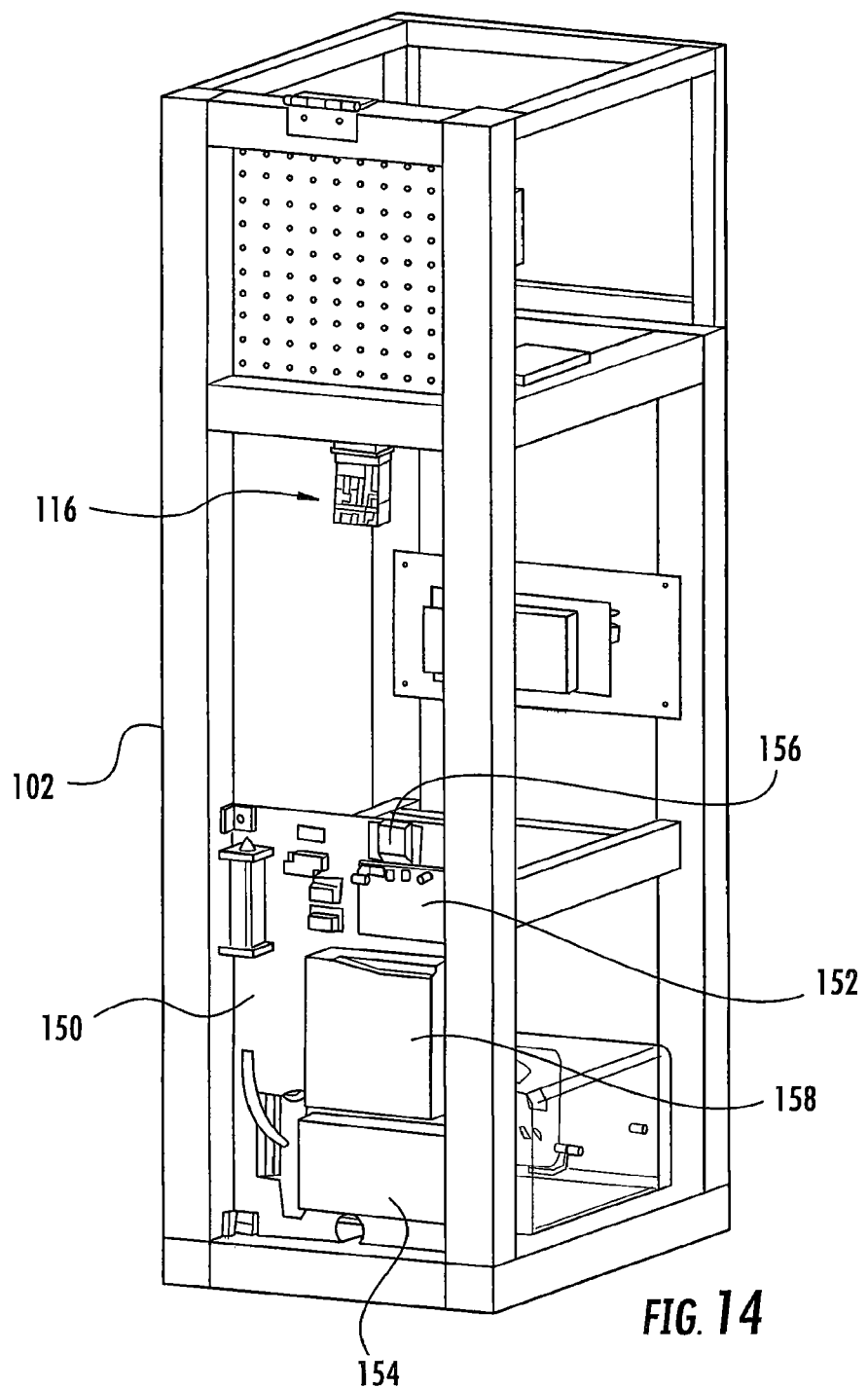
FIG. 14 is a rear perspective view of the apparatus of FIG. 12.

FIG. 12 is a front perspective view, FIG. 13 is a side view and FIG. 14 is a rear perspective view of an apparatus 100 according to an exemplary embodiment of the invention. The apparatus 100 includes a frame 102 and an enclosure 104. Much of the enclosure 104 is removed or shown transparent in FIGS. 12-14.

The apparatus 100 includes several of the same or similar components and features as the apparatus described above in reference to FIG. 2. Referring to FIG. 12, a build chamber 106 is provided on a base plate 108 that is connected to the frame 102. The build chamber 106 is defined by a wall or vat ring 110 and a build plate or "window" such as one of the windows described above in reference to FIGS. 2 and 6-11.

Turning to FIG. 13, a carrier 112 is driven in a vertical direction along a rail 114 by a motor 116. The motor may be any suitable type of motor, such as a servo motor. An exemplary suitable motor is the NXM45A motor available from Oriental Motor of Tokyo, Japan.

A liquid reservoir 118 is in fluid communication with the build chamber 106 to replenish the build chamber 106 with liquid resin. For example, tubing may run from the liquid reservoir 118 to the build chamber 106. A valve 120 controls the flow of liquid resin from the liquid reservoir 118 to the build chamber 106. An exemplary suitable valve is a pinch-style aluminum solenoid valve for tubing available from McMaster-Carr of Atlanta, Ga.

The frame 102 includes rails 122 or other some other mounting feature on which a light engine assembly 130 (FIG. 15) is held or mounted. A light source 124 is coupled to the light engine assembly 130 using a light guide entrance cable 126. The light source 124 may be any suitable light source such as a BlueWave® 200 system available from Dymax Corporation of Torrington, Conn.

Figure 15:
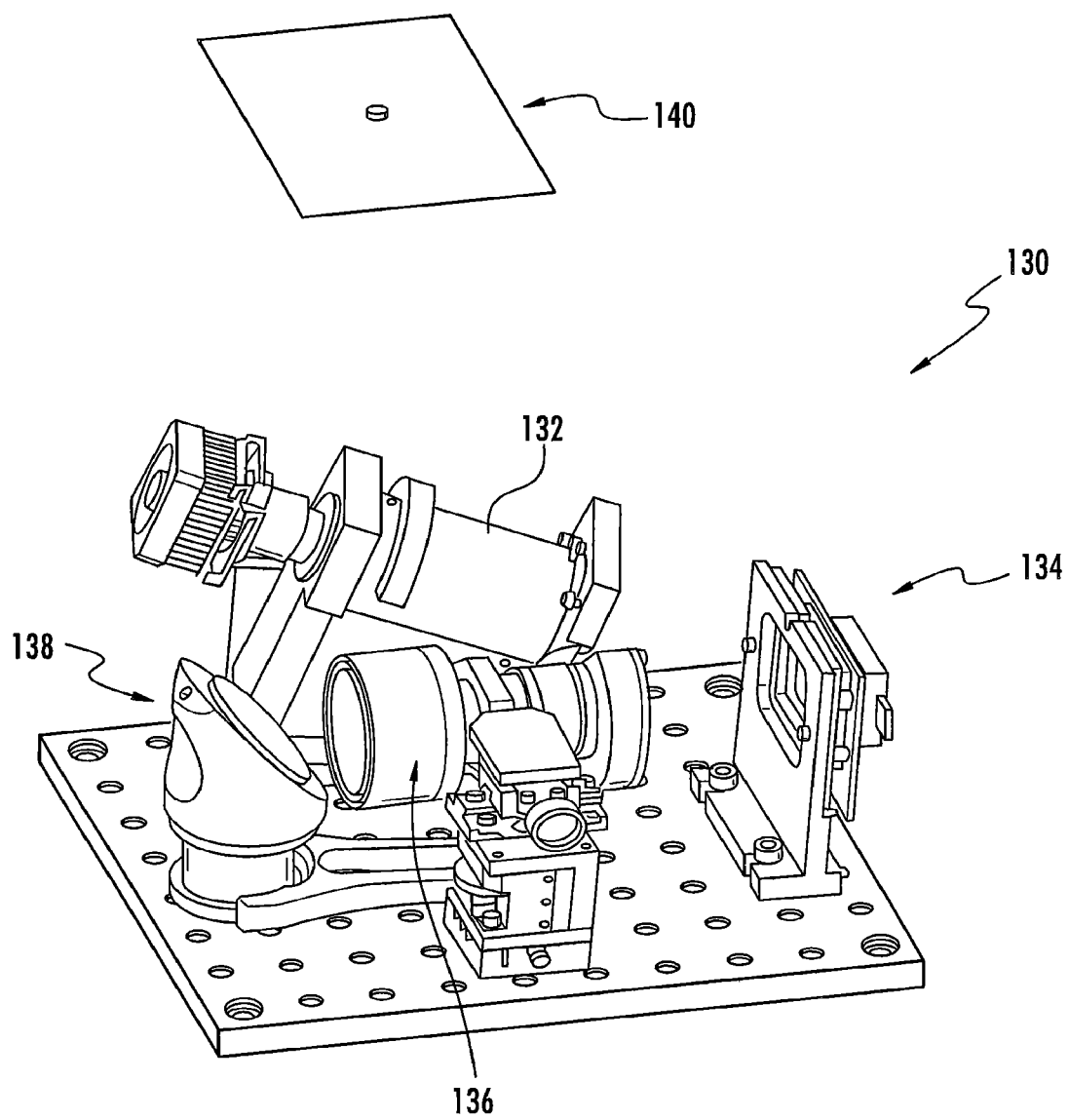
FIG. 15 is a perspective view of a light engine assembly used with the apparatus of FIG. 12.

Turning to FIG. 15, the light engine or light engine assembly 130 includes condenser lens assembly 132 and a digital light processing (DLP) system including a digital micromirror device (DMD) 134 and an optical or projection lens assembly 136 (which may include an objective lens). A suitable DLP system is the DLP Discovery™ 4100 system available from Texas Instruments, Inc. of Dallas, Tex. Light from the DLP system is reflected off a mirror 138 and illuminates the build chamber 106. Specifically, an "image" 140 is projected at the build surface or window.

Referring to FIG. 14, an electronic component plate or breadboard 150 is connected to the frame 102. A plurality of electrical or electronic components are mounted on the breadboard 150. A controller or processor 152 is operatively associated with various components such as the motor 116, the valve 120, the light source 124 and the light engine assembly 130 described above. A suitable controller is the Propeller Proto Board available from Parallax, Inc. of Rocklin, Calif.

Other electrical or electronic components operatively associated with the controller 152 include a power supply 154 and a motor driver 158 for controlling the motor 116. In some embodiments, an LED light source controlled by pulse width modulation (PWM) driver 156 is used instead of a mercury lamp (e.g., the Dymax light source described above).

A suitable power supply is a 24 Volt, 2.5 A, 60W, switching power supply (e.g., part number PS1-60W-24 (HF60W-SL-24) available from Marlin P. Jones & Assoc, Inc. of Lake Park, Fla.). If an LED light source is used, a suitable LED driver is a 24 Volt, 1.4 A LED driver (e.g., part number 788-1041-ND available from Digi-Key of Thief River Falls, Minn.). A suitable motor driver is the NXD20-A motor driver available from Oriental Motor of Tokyo, Japan.

The apparatus of FIGS. 12-15 has been used to produce an "image size" of about 75 mm by 100 mm with light intensity of about 5 mW/cm$^2$. The apparatus of FIGS. 12-15 has been used to build objects at speeds of about 100 to 500 mm/hr. The build speed is dependent on light intensity and the geometry of the object.

Example 5

Another Example Embodiment of an Apparatus

Figure 16:
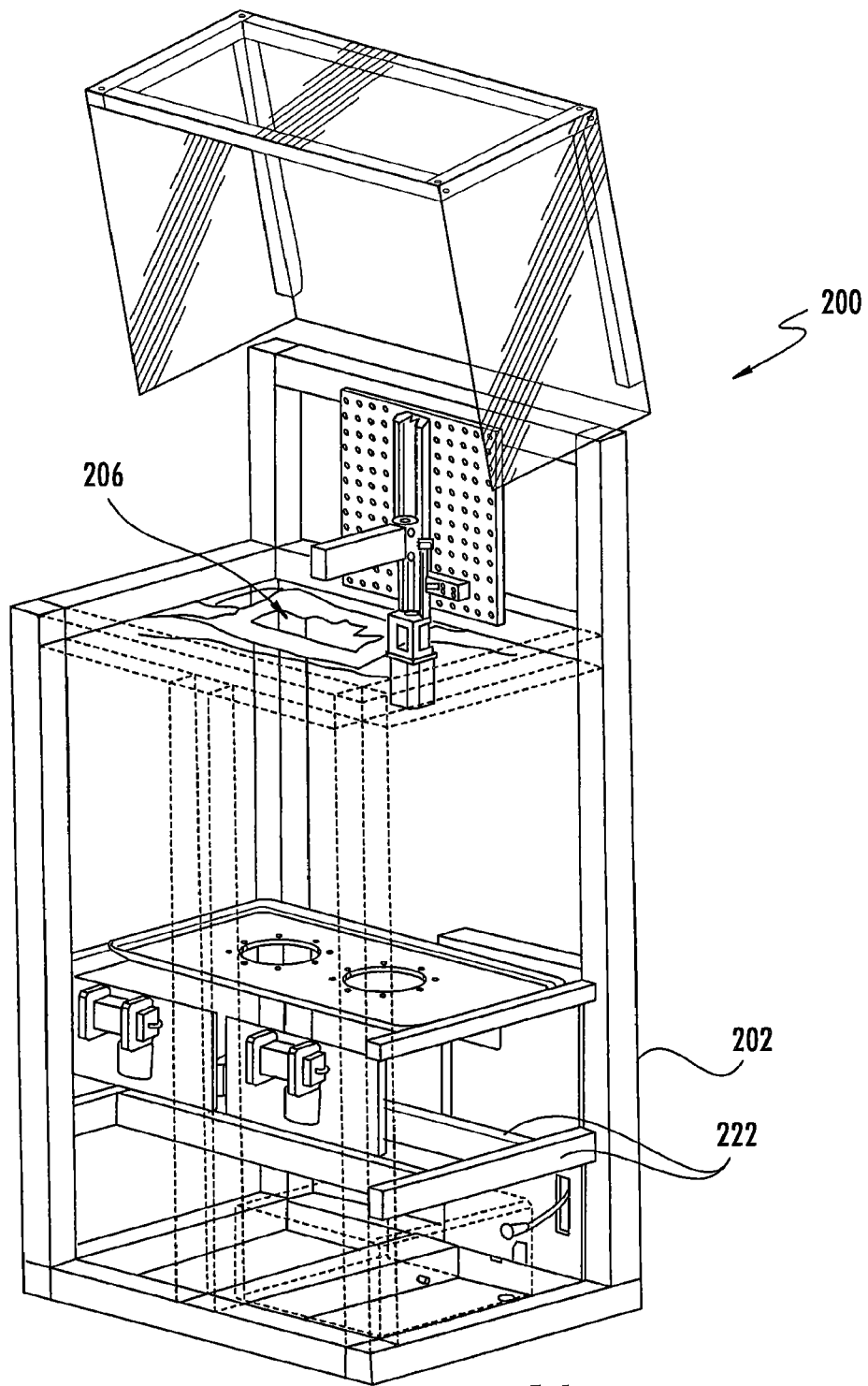
FIG. 16 is a front perspective view of an apparatus according to another exemplary embodiment of the invention.

FIG. 16 is a front perspective view of an apparatus 200 according to another exemplary embodiment of the invention. The apparatus 200 includes the same components and features of the apparatus 100 with the following differences.

The apparatus 200 includes a frame 202 including rails 222 or other mounting feature at which two of the light engine assemblies 130 shown in FIG. 15 may be mounted in a side-by-side relationship. The light engine assemblies 130 are configured to provide a pair of "tiled" images at the build station 206. The use of multiple light engines to provide tiled images is described in more detail above.

The apparatus of FIG. 16 has been used to provide a tiled "image size" of about 150 mm by 200 mm with light intensity of about 1 mW/cm$^2$. The apparatus of FIG. 16 has been used to build objects at speeds of about 50 to 100 mm/hr. The build speed is dependent on light intensity and the geometry of the object.

Example 6

Another Example Embodiment of an Apparatus

Figure 18:
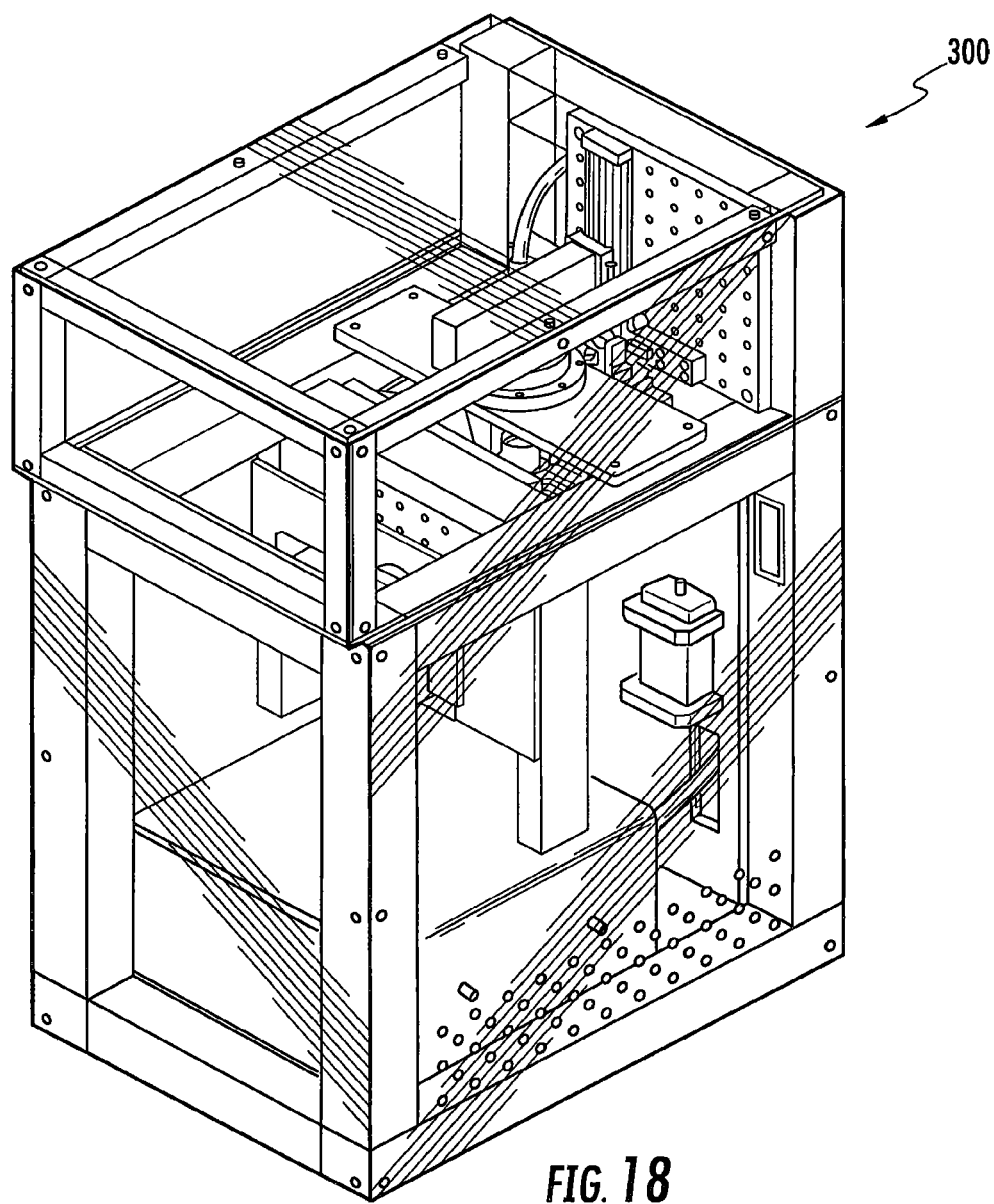
FIG. 18 is a front perspective view of an apparatus according to another exemplary embodiment of the invention.
Figure 19:
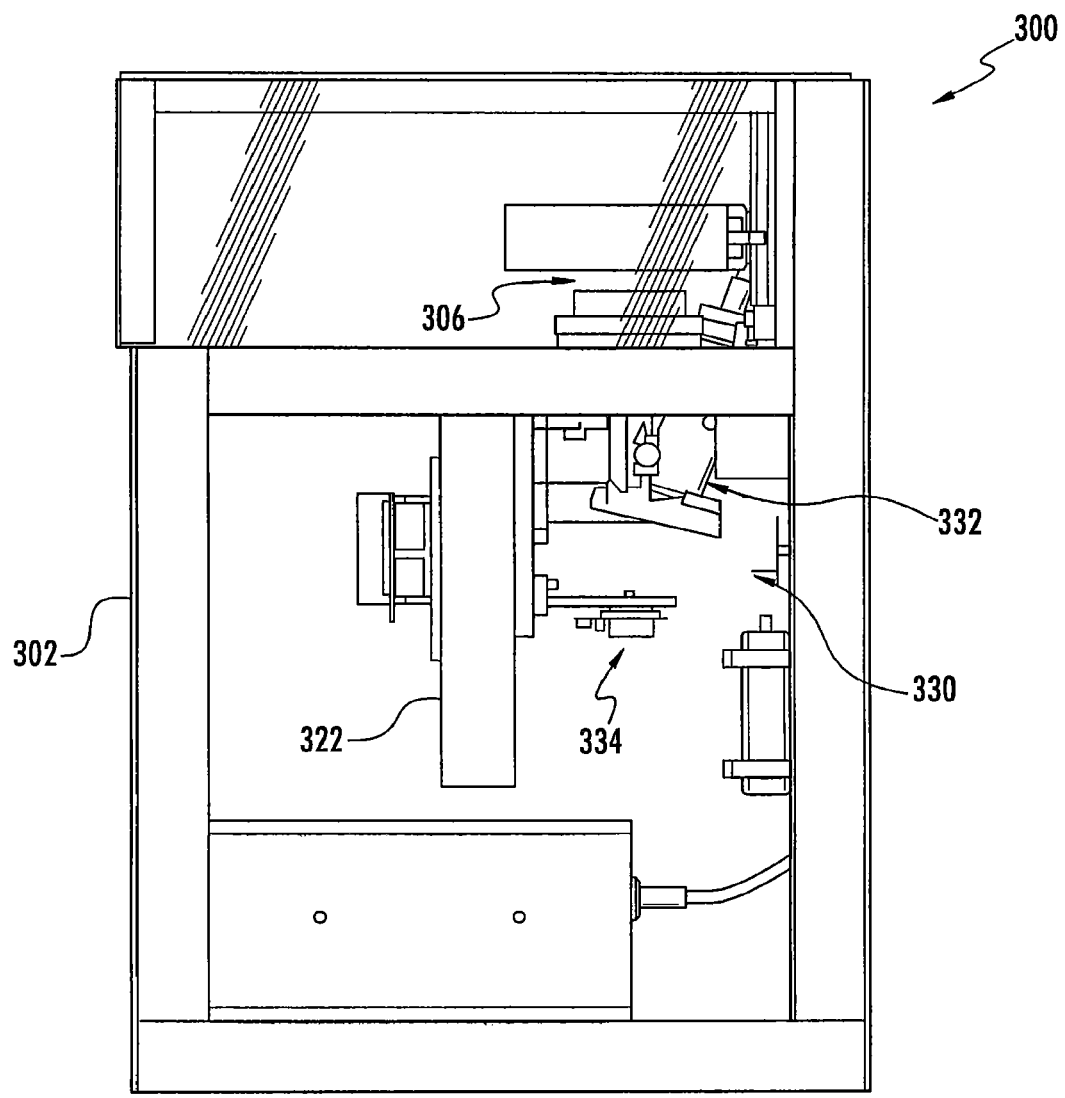
FIG. 19 is a side view of the apparatus of FIG. 18.

FIG. 18 is a front perspective view and FIG. 19 is a side view of an apparatus 300 according to another exemplary embodiment of the invention. The apparatus 300 includes the same components and features of the apparatus 100 with the following differences.

Figure 20:
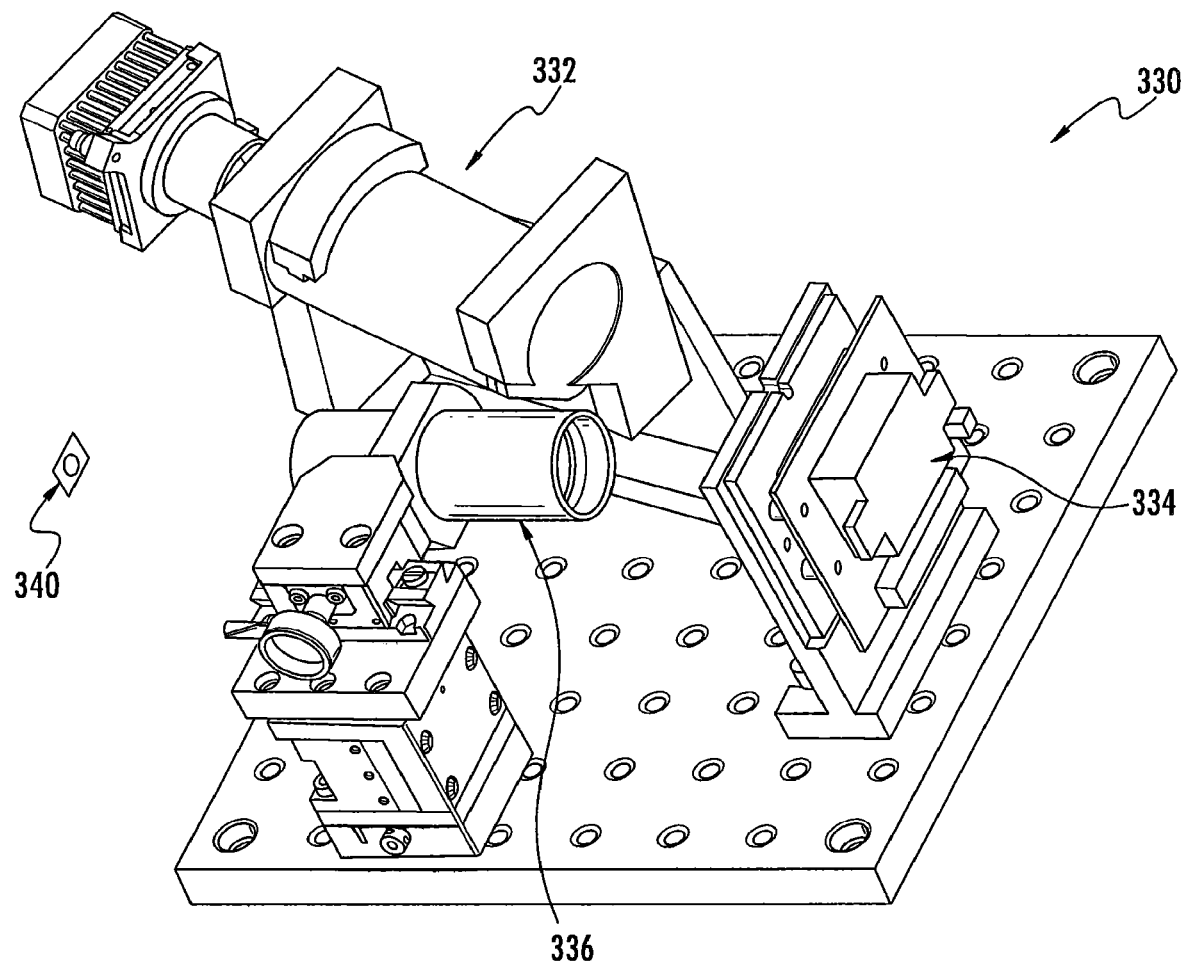
FIG. 20 is a perspective view of a light engine assembly used with the apparatus of FIG. 18.

The apparatus 300 includes a frame 302 including rails 322 or other mounting feature at which a light engine assembly 330 shown in FIG. 20 may be mounted in a different orientation than the light assembly 130 of the apparatus 100. Referring to FIGS. 19 and 20, the light engine assembly 330 includes a condenser lens assembly 332 and a digital light processing (DLP) system including a digital micromirror device (DMD) 334 and an optical or projection lens assembly 336 (which may include an objective lens). A suitable DLP system is the DLP Discovery™ 4100 system available from Texas Instruments, Inc. of Dallas, Tex. Light from the DLP system illuminates the build chamber 306. Specifically, an "image" 340 is projected at the build surface or window. In contrast to the apparatus 100, a reflective mirror is not used with the apparatus 300.

The apparatus of FIGS. 18-20 has been used to provide "image sizes" of about 10.5 mm by 14 mm and about 24 mm by 32 mm with light intensity of about 200 mW/cm$^2$ and 40 mW/cm$^2$ The apparatus of FIGS. 18-20 has been used to build objects at speeds of about 10,000 and 4,000 mm/hr. The build speed is dependent on light intensity and the geometry of the object.

Example 7

Control Program with Lua Scripting

Current printer technology requires low level control in order to ensure quality part fabrication. Physical parameters such as light intensity, exposure time and the motion of the carrier should all be optimized to ensure the quality of a part. Utilizing a scripting interface to a controller such as the Parallax PROPELLER™ microcontroller using the programming language "Lua" provides the user with control over all aspects of the printer on a low level. See generally R. Ierusalimschy, Programming in Lua (2013) (ISBN-10: 859037985X; ISBN-13: 978-8590379850).

This Example illustrates the control of a method and apparatus of the invention with an example program written utilizing Lua scripting. Program code corresponding to such instructions, or variations thereof that will be apparent to those skilled in the art, is written in accordance with known techniques based upon the particular microcontroller used.

Concepts. A part consists of slices of polymer which are printed continuously. The shape of each slice is defined by the frame that is being displayed by the light engine.

Frame. The frame represents the final output for a slice. The frame is what manifests as the physical geometry of the part. The data in the frame is what is projected by the printer to cure the polymer.

Slice. All the 2D geometry that will be outputted to a frame should be combined in a Slice. Slices can consist of procedural geometry, Slices of a 3D model or any combination of the two. The slice generating process allows the user to have direct control over the composition of any frame.

Slice of a 3D Model. A slice is a special type of 2D geometry derived from a 3D model of a part. It represents the geometry that intersects a plane that is parallel to the window. Parts are usually constructed by taking 3D models and slicing them at very small intervals. Each slice is then interpreted in succession by the printer and used to cure the polymer at the proper height.

Procedural Geometry. Procedurally generated geometry can also be added to a slice. This is accomplished by invoking shape generation functions, such as "addcircle", "addrectangle", and others. Each function allows projection of the corresponding shape onto the printing window. A produced part appears as a vertically extruded shape or combination of shapes.

Coordinate spaces: Stage. The coordinate system that the stage uses is usually calibrated such that the origin is 1-20 microns above the window.

Coordinate spaces: Slice. Coordinate system of the projected slice is such that origin is located at the center of the print window.

Quick Start.

The following is the most basic method of printing a part from a sliced 3D model. Printing a sliced model consists of 4 main parts: Loading the data, preparing the printer, printing, and shutdown.

Loading Data. In this section of the code the sliced model data is loaded into memory. The file path to the model is defined in the Constants section of the code. See the full code below for details.

```
--Loading Model
modelFilePath = "Chess King.svg"
numSlices = loadslices(modelFilePath)
```

Preparing the printer it is important to do two things before printing. You must first turn on the light engine with the relay function, and if applicable, the desired fluid height should be set.

```
--Prepare Printer
relay(true)--turn light on
showframe(-1) --ensure nothing is exposed durring setup
setlevels(.55, .6)--if available, printer set fluid pump to maintain about 55% fill
```

Printing. The first step of the printing process is to calibrate the system and set the stage to its starting position by calling gotostart. Next we begin a for loop in which we print each slice. The first line of the for loop uses the infoline command to display the current slice index in the sidebar. Next we determine the height at which the next slice should be cured. That value is stored to nextHeight. Following this we move the stage to the height at which the next slice needs to be cured. To ensure a clean print it can sometimes be necessary to wait for oxygen to diffuse into the resin. Therefore we call sleep for a half second (the exact time for preExposureTime is defined in the constants section as well). After this it's time to actually cure the resin so we call showframe and pass it the index of the slice we want to print, which is stored in sliceIndex by the for loop. We sleep again after this for exposureTime seconds in order to let the resin cure. Before moving on to the next frame, we call showframe (−1) in order to prevent the light engine from curing any resin while the stage is moving to the next height.

```
--Execute Print
gotostart( )--move stage to starting position
for sliceIndex =0,numSlices-1 do
  infoline(5, string.format("Current Slice: %d", sliceIndex))
  nextHeight = sliceheight(sliceIndex)--calculate the height that the stage
  should be at to expose this frame
  moveto(nextHeight, stageSpeed)--move to nextHeight
  sleep(preExposureTime)--wait a given amount of time for oxygen to diffuse into
  resin , prepExposureTime is predefined in the Constants section
  showframe(sliceIndex)--show frame to expose
  sleep(exposureTime)--wait while frame exposes, exposureTime is predefined
  in the Constants section
  showframe(-1)-- show nothing to ensure no exposure while stage is moving
  to next position
end
```

Shutdown. The final step in the printing process is to shut down the printer. Call relay(false) to turn the light engine off. If you are using fluid control, call setlevels(0,0) to ensure the valve is shut off. Finally it is a good idea to move the stage up a bit after printing to allow for easy removal of the part.

```
--Shutdown
relay(false)
setlevels(0,0)
--Lift stage to remove part
moveby(25, 16000)
```

Fully completed code implementing instructions based on the above is set forth below.

```
--Constants
exposureTime = 1.5-- in seconds
preExposureTime = 0.5 -- in seconds
stageSpeed = 300 --in mm/hour
--Loading Model
modelFilePath = "Chess King.svg"
numSlices = loadslices(modelFilePath)
--calculating parameters
maxPrintHeight = sliceheight(numSlices-1)--find the highest point in the print, this is the
same as the height of the last slice. Slices are 0 indexed, hence the -1.
infoline(1, "Current Print Info:")
infoline(2, string.format("Calculated Max Print Height: %dmm", maxPrintHeight))
```

```
infoline(3, string.format("Calculated Est. Time: %dmin", (maxPrintHeight/stageSpeed)*60
+ (preExposureTime+exposureTime)*numSlices/60))
infoline(4, string.format("Number of Slices: %d", numSlices))
--Prepare Printer
relay(true)--turn light on
showframe(-1) --ensure nothing is exposed durring setup
setlevels(.55, .6)--if available, printer set fluid pump to maintain about 55% fill
--Execute Print
gotostart( )--move stage to starting position
for sliceIndex =0,numSlices-1 do
    infoline(5, string.format("Current Slice: %d", sliceIndex))
    nextHeight = sliceheight(sliceIndex)--calculate the height that the stage
    should be at to expose this frame
    moveto(nextHeight, stageSpeed)--move to nextHeight
    sleep(preExposureTime)--wait a given amount of time for oxygen to diffuse
    into resin , prepExposureTime is predefined in the Constants section
    showframe(sliceIndex)--show frame to expose
    sleep(exposureTime)--wait while frame exposes, exposureTime is predefined
    in the Constants section
        showframe(-1)-- show nothing to ensure no exposure while stage is moving to next
    position
end
--Shutdown
relay(false)
setlevels(0,0)
--Lift stage to remove part
moveby(25, 16000)
```

Gotostart. The main purpose of gotostart is to calibrate the stage. This function resets the coordinate system to have the origin at the lowest point, where the limit switch is activated. Calling this command will move the stage down until the limit switch in the printer is activated; this should occur when the stage is at the absolute minimum height.

```
gotostart( ) moves stage to start at the maximum speed which varies from printer to printer.
gotostart( )--moving to origin at default speed
gotostart(number speed) moves stage to start at speed given in millimeters/hour.
gotostart(15000)--moving stage to origin at 15000mm/hr
``` speed: speed, in mm/hour, at which the stage will move to the start position.

MOVETO moveto allows the user to direct the stage to a desired height at a given speed.

Safe upper and lower limits to speed and acceleration are ensured internally.

moveto(number targetHeight, number speed)

```
moveto(25, 15000)--moving to 25mm at 15,000mm/hr
moveto(number targetHeight, number speed, number acceleration)
This version of the function allows an acceleration to be defined as well as speed. The stage
starts moving at initial speed and then increases by acceleration.
moveto(25, 20000, 1e7)--moving the stage to 25mm at 20,000mm/hr while accelerating at 1
million mm/hr^2
``` moveto(number targetHeight, number speed, table controlPoints, function callback)

This function behaves similar to the basic version of the function. It starts at its initial speed and position and moves to the highest point on the control point table. callback is called when the stage passes each control point.

```
function myCallbackFunction(index)--defining the callback function
print("hello")
end
moveto(25, 20000, slicecontrolpoints( ), myCallbackFunction)--
moving the stage to 25mm at 20,000mm/hr while calling
myCallbackFunction at the control points generated by
slicecontrolpoints( )
``` moveto(number targetHeight, number speed, number acceleration, table
controlPoints, function callback) This function is the same as above except the user can pass an acceleration. The stage accelerates from its initial position continuously until it reaches the last control point.

```
function myCallbackFunction(index)--defining the callback function
print("hello")
end
moveto(25, 20000, 0.5e7, slicecontrolpoints( ), myCallbackFunction)--
    moving the stage to 25mm at 20,000mm/hr while accelerating at 0.5
million mm/hr^2 and also calling myCallbackFunction at the control
points generated by slicecontrolpoints( )
``` targetHeight: height, in mm from the origin, that the stage will move to.

initialSpeed: initial speed, in mm/hour, that the stage will start moving at.
acceleration: rate, in mm/hour², that the speed of the stage will increase from initial speed.
controlPoints: a table of target heights in millimeters. After the stage reaches a target height, it calls the function callback.
callback: pointer to a function that will be called when the stage reaches a control point. The callback function should take one argument which is the index of the control point the stage has reached.

moveby moveby allows the user to change the height of the stage by a desired amount at a given speed. Safe upper and lower limits to speed and acceleration are ensured internally.
moveby(number dHeight, number initalSpeed)
   1 moveby(-2, 15000)—moving down 2 mm at 15,000 mm/hr
moveby(number dHeight, number initialSpeed, number acceleration)
   This version of the function allows an acceleration to be defined as well as speed. The stage starts moving at initial speed and then increases by acceleration until it reaches its destination.

---

1 moveby(25, 15000, 1e7)--moving up 25mm at 15,000mm/hr while accelerating 1e7mm/hr^2

--- moveby(number dHeight, number initialSpeed, table controlPoints, function callback)
   This function usage allows the user to pass the function a table of absolute height coordinates. After the stage reaches one of these target heights, it calls the function 'callback.' Callback should take one argument which is the index of the control point it has reached.

--- function myCallbackFunction(index)--defining the callback function
   print("hello")
end
moveby(25, 20000, slicecontrolpoints( ), myCallbackFunction)--moving the stage up 25mm at 20,000mm/hr while calling myCallbackFunction at the control points generated by slicecontrolpoints( )

--- moveby(number dHeight, number initialSpeed, number acceleration, table
   controlPoints, function callback) This function is the same as above except the user can pass an acceleration. The stage accelerates from its initial position continuously until it reaches the last control point.

--- function myCallbackFunction(index)--defining the callback function
     print("hello")
   end
  moveby(25, 20000, 1e7,slicecontrolpoints( ), myCallbackFunction)--moving the stage up 25mm at 20,000mm/hr while calling myCallbackFunction at the control points generated by slicecontrolpoints( ) and accelerating at 1e7mm/hr^2

--- dHeight: desired change in height, in millimeters, of the stage.
initialSpeed: initial speed, in mm/hour, at which the stage moves.
acceleration: rate, in mm/hour², that the speed of the stage will increase from initial speed.
controlPoints: a table of target heights in millimeters. After the stage reaches a target height, it calls the function callback.
callback: pointer to a function that will be called when the stage reaches a control point. The callback function should take one argument which is the index of the control point the stage has reached.

Light Engine Control light relay is used to turn the light engine on or off in the printer. The light engine must be on in order to print. Make sure the relay is set to off at the end of the script.
   relay(boolean lightOn)
   relay(true)—turning light on
   lightOn: false turns the light engine off, true turns the light engine on.

Adding Procedural Geometry

Functions in this section exist to project shapes without using a sliced part file.
   Every function in this section has an optional number value called figureIndex
   Each figure in a slice has its own index. The figures reside one on top of another.
   Figures are drawn so that the figure with the highest index is 'on top' and will therefore not be occluded by anything below it. By default indexes are assigned in the order that they are created so the last figure created will be rendered on top.
   One can, however, change the index by passing the desired index into figureIndex.
   Every function in this section requires a sliceIndex argument. This value is the index of the slice that the figure will be added to.
   Note that generating this procedural geometry does not guarantee that it will be visible or printable. One must use one of the functions such as fillmask or linemask outlined below.

addcircle addcircle(number x, number y, number radius, number sliceIndex) addcircle draws a circle in the specified slice.
   addCircle(0,0, 5, 0)—creating a circle at the origin of the first slice with a radius of 5 mm
     x: is the horizontal distance, in millimeters, from the center of the circle to the origin.
     y: is the vertical distance, in millimeters, from the center of the circle to the origin.
     radius: is the radius of the circle measured in millimeters.
     sliceIndex: index of the slice to which the figure will be added.
     Returns: figure index of the figure.

addrectangle addrectangle(number x, number y, number width, number height number sliceIndex)
   addrectangle draws a rectangle in the specified slice.

addrectangle(0,0, 5,5, 0)--creating a 5mm x 5mm square with its top left corner at the origin.

x: horizontal coordinate, in millimeters, of the top left corner of the rectangle.
y: vertical coordinate, in millimeters, of the top left corner of the rectangle.
width: width of the rectangle in millimeters.
height: height of the rectangle in millimeters.
sliceIndex: index of the slice to which the figure will be added.
Returns: figure index of the figure.
addline
 addline(number x0, number y0, number x1, number y1, number sliceIndex) addline draws a line segment.

addLine(0,0, 20,20, 0)--creating a line from the origin to 20mm along the x and y axis on the first slice.

x0: horizontal coordinate of the first point in the segment, measured in millimeters.
y0: vertical coordinate of the first point in the segment, measured in millimeters.
x1: horizontal coordinate of the second point in the segment, measured in millimeters.
y2: vertical coordinate of the second point in the segment, measured in millimeters.
sliceIndex: index of the slice to which the figure will be added. Returns: figure index of the figure.
addtext
 text(number x, number y, number scale, string text, number sliceIndex) addtext draws text on the specified slice starting at position 'x, y' with letters of size 'scale'.
addtext(0,0, 20, "Hello world", 0)—writing Hello World at the origin of the first slice
 x: horizontal coordinate, measured in millimeters, of the top left corner of the bounding box around the text.
 y: vertical coordinate, measured in millimeters, of the top left corner of the bounding box around the text.
 scale: letter size in millimeters, interpretation may vary depending on the underlying operating system (Windows, OSX, Linux, etc).
 text: the actual text that will be drawn on the slice.
 sliceIndex: index of the slice to which the
 figure will be added. Returns: figure index
 of the figure.
2.4 Fill & Line Control
2.4.1 fillmask
fillmask(number color, number sliceIndex, number figureIndex) fillmask is used to control how the procedural geometry is drawn. fillmask tells the figure in question to fill the entirety of its interior with color.
 color: can be any number on the range 0 to 255. Where 0 is black and 255 is white, any value in between is a shade of grey interpolated linearly between black and white based on the color value. Any value less than 0 will produce a transparent color.

myCircle = addCircle(0,0,5,0)--creating the circle to fill
fillmask(255, 0, myCircle)--Creating a white filled circle sliceIndex: the index of the slice that should be modified.
figureIndex: the is used to determine which figure on the slice should be filled. Each figure has its own unique index. If no figureIndex is passed, the fill applies to all figures in the slice.
2.4.2 linemask
linemask(number color, number sliceIndex, number figureIndex) linemask is used to control how the procedural geometry is drawn. linemask tells a figure to draw its outline in a specific color. The width of the outline is defined by the function linewidth.

myCircle = addCircle(0,0,20,0)--creating the circle to fill
linemask(255, 0, myCircle)-setting the outline of the circle to be white
fillmask(150,0, myCircle)--setting the fill of the circle to be grey color: can be any number on the range 0 to 255. Where 0 is black and 255 is white, any value in between is a shade of grey interpolated linearly between black and white based on the color value. Any value less than 0 will produce a transparent color.
 sliceIndex: the index of the slice that should be modified.
 figureIndex: is used to determine which figure on the slice should be filled.
 Each figure has its own unique index. If no figureIndex is passed, the fill applies to all figures in the slice.
2.4.3 linewidth
linewidth(number width, number sliceIndex, number figureIndex) linewidth is used to set the width of the line that linemask will use to outline the figure.
linewidth(2,0)—setting the line width for every figure on the first slice to 2 mm
 sliceIndex: the index of the slice that should be modified.
 figureIndex: is used to determine which figure on the slice should have its outline changed. Each figure has its own unique index, see section 2.3 (Pg. 10) for more details. If no figureIndex is passed, the fill applies to all figures in the slice.
loadmask
 loadmask(string filepath) loadmask allows for advanced fill control. It enables the user to load a texture from a bitmap file and use it to fill the entirety of a figure with the texture.

texture = loadmask("voronoi_noise.png")--loading texture.
voronoi_noise.png is in the same directory as the script.
myCircle = addCircle(0,0,20,0)--creating the circle to fill
fillmask(texture, 0, myCircle)--filling the circle with voronoi noise filepath: file path to image file
Returns: a special data type which can be passed into a fillmask or linemask function as the color argument.
Frames
showframe
 showframe(number sliceIndex) showframe is essential to the printing process.
 This function sends the data from a slice to the printer. Call showframes on a frame that doesn't exist to render a black frame e.g. showframe(-1).
 showframe(2)—showing the 3rd slice
 sliceIndex: the index of the slice to send to the printer.
framegradient
 framegradient(number slope) framegradient is designed to compensate for differences in light intensity.

calcframe
   calcframe( )
   calcframe is designed to analyze the construction of a slice calculates the last frame shown.

---
showframe(0)
calcframe( )
---

Returns: the maximum possible distance between any point in the figure and the edge.
   2.5.4 loadframe
   loadframe(string filepath)
   loadframe is used to load a single slice from a supported bitmap file.
   loadframe("slice.png")—slice.png is in the same directory as the script
   filepath: file path to slice image.
Slices
   addslice
   addslice(number sliceHeight) addslice creates a new slice at a given height at the end of the slice stack.
   addslice(0.05)—adding a slice at 0.05 mm
   addslice(number sliceHeight, number sliceIndex)
   addslice(0.05, 2)—adding a slice at 0.05 mm and at index 2. this pushes all layers 2 and higher up an index.
   addslice creates a new slice at a given height and slice index.
   sliceHeight: height, in millimeters, of the slice.
   sliceIndex: index at which the slice should be added. Returns: slice index.
   loadslices
   loadslices(string filepath) loadslices is used to load all the slices from a 2D slice file.
   loadslices("Chess King.svg")—loading all the slices from the Chess King.svg file
      filepath: file path to the sliced model. Acceptable formats are .cli and .svg. Returns: number of slices.
   sliceheight
      sliceheight(number sliceIndex) sliceheight is used to find the height of a slice in mm off the base ---
addslice(.05,0)--setting the first slice to .05mm
sliceheight(0)--checking the height of slice 0, in this example it should return .05
--- sliceIndex: index of the slice to check. Returns: slice height in mm. 2.6.4 slicecontrolpoints
   slicecontrolpoints( ) slicecontrolpoints is a helper function which creates a control point for each slice of a model. These control points can be passed to the moveto or moveby function to set it to callback when the stage reaches the height of each slice. Make sure loadslices has been called prior to calling this function.

---
loadslices("Chess King.svg")
controlPoints = slicecontrolpoints( )
---

Returns: Lua table of control points.
Timing
Sleep
   sleep(number seconds) sleep allows the user to pause the execution of the program for a set number of seconds.
sleep(0.5)—sleeping for a half second
   seconds: number of seconds to pause script execution.

Clock
   clock( ) clock returns the current time in seconds. It is accurate at least up to the millisecond and should therefore be used instead of Lua's built in clock functionality. clock should be used as a means to measure differences in time as the start time for the second count varies from system to system.

---
t1 = clock( )
loadslices("Chess King.svg")
deltaTime = clock( )−t1
---

Returns: system time in seconds.
Fluid Control
   This set of functions can be used with printer models that support fluid control. Before the script finishes executing, setlevels(0,0) should be called to ensure that the pump stops pumping fluid into the vat.
getcurrentlevel
   getcurrentlevel( ) getcurrentlevel
   returns the percentage of the vat that is full.
   print(string.format("Vat is % d percent full.", getcurrentlevel( )*100))
      Returns: a floating point number on the range 0 to 1 that represents the percentage of the vat that is full.
setlevels
   setlevels(number min, number max) setlevels allows the user to define how much fluid should be in the vat. The fluid height will be automatically regulated by a pump. The difference between min and max should be greater than 0.05 to ensure that the valve is not constantly opening and closing.
   setlevels(0.7,0.75)—keeping vat about 75 percent full
      min: the minim percentage of the vat that should be full. Entered as a floating point number from 0 to 1.
      max: the max percentage of the vat that should be full. Entered as a floating point number from 0 to 1.
User Feedback
   2.9.1 infoline
   infoline(int lineIndex, string text) infoline allows the user to display up to 5 lines of text in a constant position on the sidebar of the Programmable Printer Platform. This function is often used to allow the user to monitor several changing variables at once.
   infoline(1, string.format("Vat is % d percent full.", getcurrentlevel( )*100))
      lineIndex: the index of the line. Indexes should be in the range 1 to 5, 1 being the upper most line. -text: text to be displayed at line index.
Global Configuration Table.
Before a print script is executed, all global variables are loaded into a configuration table called cfg. Most of the data in this table has already been read by the Programmable Printer Platform by the time the users script executes, therefore, changing them will have no effect. However, writing to the xscale, yscale, zscale, xorig and yorig fields of the cfg, will effect all the loadslices and addlayer calls that are made afterwards. If the users script is designed to be run at a specific scale and/or position, it is good practice to override the cfg with the correct settings to ensure the scale and position can't be accidentally changed by the Programmable Printer Platform.

```
cfg.xscale = 3 --overriding global settings to set scale on the x axis to 3
cfg.yscale = 2 --overriding global settings to set scale on the y axis to 2
cfg.zscale = 1 --overriding global settings to set scale on the z axis to 1
cfg.xorig = -2.0 --overriding global settings to set the origin on the x
    axis 2mm left
cfg.yorig = 0.25 --overriding global settings to set the origin on the y
    axis .25mm in the positive direction
```

Fields in cfg:
- serial port: name of serial port (changing this variable wont effect code)
- xscale: x scale -yscale: y scale
- zscale: z scale
- xorig: x origin -yorig: y origin
- hw xscale: pixel resolution in x direction (changing this variable won't effect code)
- hw yscale: pixel resolution in y direction (changing this variable won't effect code)

Useful Lua Standard Libraries.

The math standard library contains several different functions that are useful in calculating geometry. The string object is most useful in printing for manipulating info strings. For details contact LabLua at Departamento de Informática, PUC-Rio, Rua Marquês de São Vicente, 225; 22451-900 Rio de Janeiro, RJ, Brazil Example 8

Lua Script Program for Continuous Print

This example shows a Lua script program corresponding to Example 7 above for continuous three dimension printing.

```
--Constants
sliceDepth = .05--in millimeters
exposureTime = .225-- in seconds
--Loading Model
modelFilePath = "Chess King.svg"
numSlices = loadslices(modelFilePath)
    controlPoints = slicecontrolpoints( )--Generate Control Points
    --calculating parameters
    exposureTime = exposureTime/(60*60)--converted to hours
    stageSpeed = sliceDepth/exposureTime--required distance/required time
    maxPrintHeight = sliceheight(numSlices-1)--find the highest point in the print,
    this is the same as the height of the last slice. Slices are 0 indexed, hence the -1.
    infoline(1, "Current Print Info:")
    infoline(2, string.format("Calulated Stage Speed: %dmm/hr\n", stageSpeed))
    infoline(3, string.format("Calculated Max Print Height: %dmm", maxPrintHeight))
    infoline(4, string.format("Calculated Est. Time: %dmin",
        (maxPrintHeight/stageSpeed)*60))
    --Create Callback Function for use with moveto
    function movetoCallback(controlPointIndex)
        showframe(controlPointIndex)
    end
    --Prepare Printer
    relay(true)--turn light on
    setlevels(.55, .6)--if available, printer set fluid pump to maintain about 50% fill
    --Execute Print
    gotostart( )--move stage to starting position
    moveto(maxPrintHeight, stageSpeed, controlPoints, movetoCallback)
    --Shutdown
    relay(false)
    setlevels(0,0)
    --Lift stage to remove part
    moveby(25, 160000)
```

Example 9

Lua Script Program for Cylinder and Buckle

This example shows a Lua script program for two fitted parts that use procedural geometry.
Cylinder:

```
--Constants
exposureTime = 1.5-- in seconds
preExposureTime = 1 -- in seconds
stageSpeed = 300 --in mm/hour
sliceDepth = .05
numSlices = 700
--Generating Model
radius = 11
thickness = 4
smallCircleRad = 1.4
for sliceIndex = 0,numSlices-1 do
        addlayer(sliceDepth*(sliceIndex+1), sliceIndex)--the depth of a slice*its index =
            height of slice
        largeCircle = addcircle(0,0,radius, sliceIndex)
        linewidth(thickness, sliceIndex, largeCircle)
```

-continued

```
            linemask(255, sliceIndex, largeCircle)
            for i=0,2*math.pi, 2*math.pi/8 do
                    addcircle(math.cos(i)*radius, math.sin(i)*radius, smallCircleRad,
                        sliceIndex)
            end
            fillmask(0,sliceIndex)
end
    --calculating parameters
  maxPrintHeight = sliceheight(numSlices-1)--find the highest point in the print, this is the
      same as the height of the last slice. Slices are 0 indexed, hence the -1.
  infoline(1, "Current Print Info:")
  infoline(2, string.format("Calculated Max Print Height: %dmm", maxPrintHeight))
  infoline(3, string.format("Calculated Est. Time: %dmin",
          (maxPrintHeight/stageSpeed)*60 +
          (preExposureTime+exposureTime)*numSlices/60))
  infoline(4, string.format("Number of Slices: %d", numSlices))
    --Prepare Printer
    relay(true)--turn light on
    showframe(-1) --ensure nothing is exposed durring setup
    setlevels(.55, .6)--if available, printer set fluid pump to maintain about 55% fill
    --Execute Print
    gotostart( )--move stage to starting position
    for sliceIndex =0,numSlices-1 do
            infoline(5, string.format("Current Slice: %d", sliceIndex))
            nextHeight = sliceheight(sliceIndex)--calculate the height that the stage
            should be at to expose this frame
            moveto(nextHeight, stageSpeed)--move to nextHeight
            sleep(preExposureTime)--wait a given amount of time for oxygen to diffuse into
            resin , prepExposureTime is predefined in the Constants section
            showframe(sliceIndex)--show frame to expose
            sleep(1.5)--wait while frame exposes, exposureTime is predefined in the
            Constants section
            showframe(-1)-- show nothing to ensure no exposure while stage is moving to
            next position
    end
    --Shutdown
    relay(false)
    setlevels(0,0)
    --Lift stage to remove part
    moveby(25, 160000)
```

Buckle:

```
    --Constants
    exposureTime = 1.5-- in seconds
    preExposureTime = 0.5 -- in seconds
    stageSpeed = 300 --in mm/hour
    sliceDepth = .05
    numSlices = 900
        --Generating Model
        baseRadius = 11
        thickness = 3
        innerCircleRad = 7.5
    for sliceIndex = 0,numSlices-1 do
          addlayer(sliceDepth*(sliceIndex+1))--the depth of a slice*its index = height
    of slice
            if(sliceIndex < 100) then --base
                addcircle(0,0, baseRadius, sliceIndex)
                fillmask(255, sliceIndex)
            else -- inner circle
                innerCircle = addcircle(0,0, innerCircleRad, sliceIndex)
                linewidth(thickness, sliceIndex, innerCircle)
                linemask(255, sliceIndex, innerCircle)
            for i = 0,4*2*math.pi/8, 2*math.pi/8 do
                    x = math.cos(i)*(innerCircleRad+thickness)
                    y = math.sin(i)*(innerCircleRad+thickness)
                    cutLine = addline(x,y, -x,-y, sliceIndex)
                    linewidth(3, sliceIndex, cutLine)
                    linemask(0, sliceIndex, cutLine)
            end
                if (sliceIndex > 800) then --tips
                    r0 = innerCircleRad +2
                    if(sliceIndex < 850) then
r0 = innerCircleRad + (sliceIndex-800)*(2/50)
                    end
                    for i = 0,4*2*math.pi/8, 2*math.pi/8 do
```

```
ang = i + (2*math.pi/8)/2
x = math.cos(ang)*(r0)
y = math.sin(ang)*(r0)
nubLine = addline(x,y, -x,-y, sliceIndex)
linewidth(2, sliceIndex, nubLine)
linemask(255, sliceIndex, nubLine)
                end
                fillmask(0,sliceIndex, addcircle(0,0, innerCircleRad-(thickness/2),
            sliceIndex))
        end
end
showframe(sliceIndex)
sleep(.02)
end
--calculating parameters
maxPrintHeight = sliceheight(numSlices-1)--find the highest point in the print, this is the
same as the height of the last slice. Slices are 0 indexed, hence the -1.
infoline(1, "Current Print Info:")
infoline(2, string.format("Calculated Max Print Height: %dmm", maxPrintHeight))
infoline(3, string.format("Calculated Est. Time: %dmin", (maxPrintHeight/stageSpeed)*60
+ (preExposureTime+exposureTime)*numSlices/60))
infoline(4, string.format("Number of Slices: %d", numSlices))
--Prepare Printer
relay(true)--turn light on
showframe(-1) --ensure nothing is exposed durring setup
setlevels(.55, .6)--if available, printer set fluid pump to maintain about 55% fill
--Execute Print
gotostart( )--move stage to starting position
for sliceIndex =0,numSlices-1 do
        infoline(5, string.format("Current Slice: %d", sliceIndex))
        nextHeight = sliceheight(sliceIndex)--calculate the height that the stage
        should be at to expose this frame
        moveto(nextHeight, stageSpeed)--move to nextHeight
        sleep(preExposureTime)--wait a given amount of time for oxygen to diffuse into
        resin, prepExposureTime is predefined in the Constants section
         showframe(sliceIndex)--show frame to expose
         sleep(1.5)--wait while frame exposes, exposureTime is predefined in the Constants
section
            showframe(-1)-- show nothing to ensure no exposure while stage is moving to next
position
end
--Shutdown
relay(false)
setlevels(0,0)
--Lift stage to remove part
moveby(25, 160000)
```

Example 10

Continuous Fabrication with Intermittent Irradiation and Advancing

Figure 21:
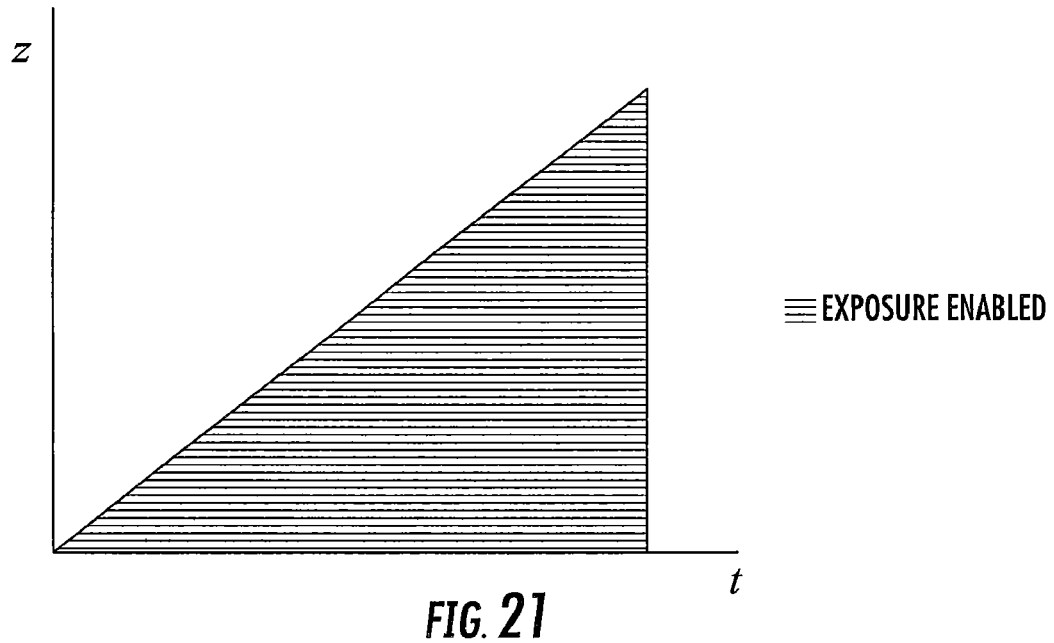
FIG. 21 is a graphic illustration of a process of the invention indicating the position of the carrier in relation to the build surface or plate, where both advancing of the carrier and irradiation of the build region is carried out continuously. Advancing of the carrier is illustrated on the vertical axis, and time is illustrated on the horizontal axis.

A process of the present invention is illustrated in FIG. 21, where the vertical axis illustrates the movement of the carrier away from the build surface. In this embodiment, the vertical movement or advancing step (which can be achieved by driving either the carrier or the build surface, preferably the carrier), is continuous and unidirectional, and the irradiating step is carried out continuously. Polymerization of the article being fabricated occurs from a gradient of polymerization or active surface, and hence creation of "layer by layer" fault lines within the article is minimized.

Figure 22:
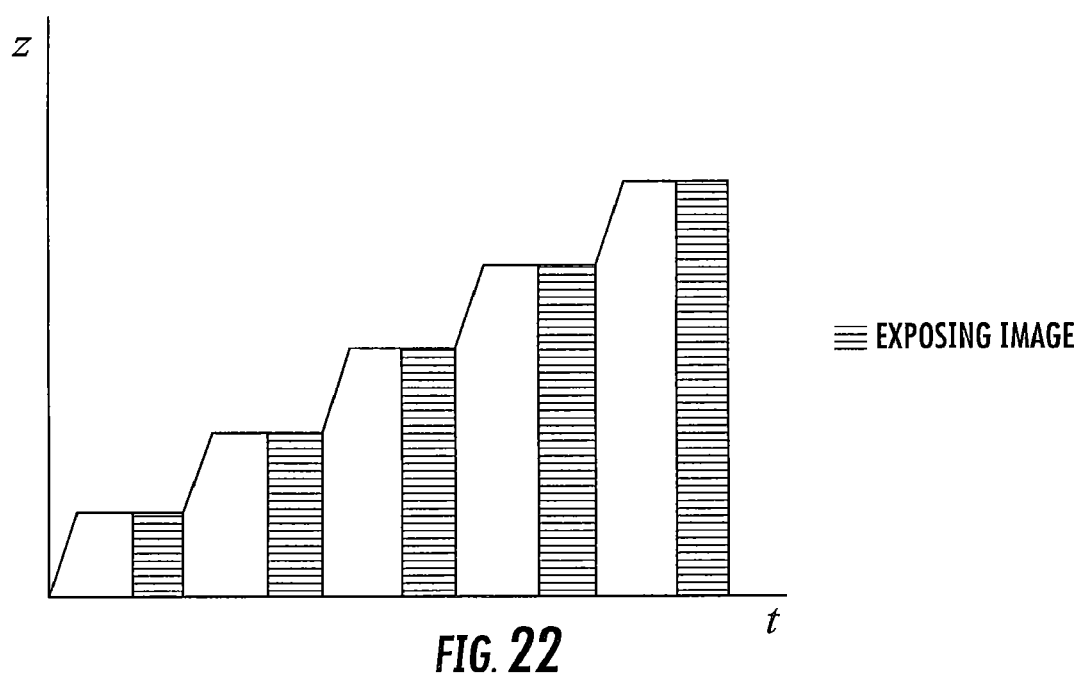
FIG. 22 is a graphic illustration of another process of the invention indicating the position of the carrier in relation to the build surface or plate, where both advancing of the carrier and irradiation of the build region is carried out stepwise, yet the dead zone and gradient of polymerization are maintained. Advancing of the carrier is again illustrated on the vertical axis, and time is illustrated on the horizontal axis.

An alternate embodiment of the present invention is illustrated in FIG. 22. In this embodiment, the advancing step is carried out in a step-by-step manner, with pauses introduced between active advancing of the carrier and build surface away from one another. In addition, the irradiating step is carried out intermittently, in this case during the pauses in the advancing step. We find that, as long as the inhibitor of polymerization is supplied to the dead zone in an amount sufficient to maintain the dead zone and the adjacent gradient of polymerization or active surface during the pauses in irradiation and/or advancing, the gradient of polymerization is maintained, and the formation of layers within the article of manufacture is minimized or avoided. Stated differently, the polymerization is continuous, even though the irradiating and advancing steps are not. Sufficient inhibitor can be supplied by any of a variety of techniques, including but not limited to: utilizing a transparent member that is sufficiently permeable to the inhibitor, enriching the inhibitor (e.g., feeding the inhibitor from an inhibitor-enriched and/or pressurized atmosphere), etc. In general, the more rapid the fabrication of the three-dimensional object (that is, the more rapid the cumulative rate of advancing), the more inhibitor will be required to maintain the dead zone and the adjacent gradient of polymerization.

Example 11

Figure 23:
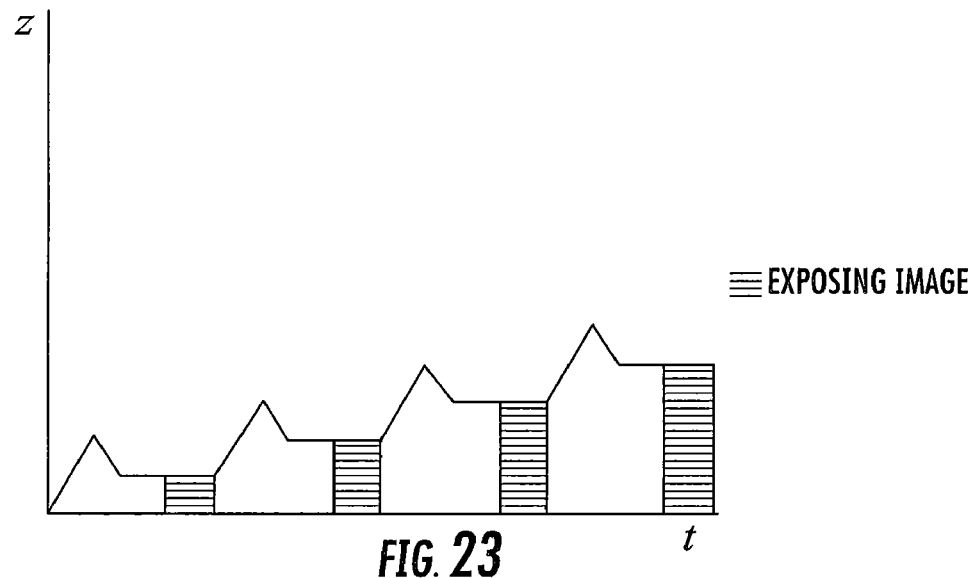
FIG. 23 is a graphic illustration of still another process of the invention indicating the position of the carrier in relation to the build surface or plate, where both advancing of the carrier and irradiation of the build region is carried out stepwise, the dead zone and gradient of polymerization are maintained, and a reciprocating step is introduced between irradiation steps to enhance the flow of polymerizable liquid into the build region. Advancing of the carrier is again illustrated on the vertical axis, and time is illustrated on the horizontal axis.

Continuous Fabrication with Reciprocation During Advancing to Enhance Filling of Build Region with Polymerizable Liquid A still further embodiment of the present invention is illustrated in FIG. 23. As in Example 10 above, this embodiment, the advancing step is carried out in a step-by-step manner, with pauses introduced between active advancing of the carrier and build surface away from one another. Also as in Example 10 above, the irradiating step is carried out intermittently, again during the pauses in the advancing step. In this example, however, the ability to maintain the dead zone and gradient of polymerization during the pauses in advancing and irradiating is taken advantage of by introducing a vertical reciprocation during the pauses in irradiation.

We find that vertical reciprocation (driving the carrier and build surface away from and then back towards one another), particularly during pauses in irradiation, serves to enhance the filling of the build region with the polymerizable liquid, apparently by pulling polymerizable liquid into the build region. This is advantageous when larger areas are irradiated or larger parts are fabricated, and filling the central portion of the build region may be rate-limiting to an otherwise rapid fabrication.

Reciprocation in the vertical or Z axis can be carried out at any suitable speed in both directions (and the speed need not be the same in both directions), although it is preferred that the speed when reciprocating away is insufficient to cause the formation of gas bubbles in the build region.

While a single cycle of reciprocation is shown during each pause in irradiation in FIG. 23, it will be appreciated that multiple cycles (which may be the same as or different from one another) may be introduced during each pause.

As in Example 10 above, as long as the inhibitor of polymerization is supplied to the dead zone in an amount sufficient to maintain the dead zone and the adjacent gradient of polymerization during the reciprocation, the gradient of polymerization is maintained, the formation of layers within the article of manufacture is minimized or avoided, and the polymerization/fabrication remains continuous, even though the irradiating and advancing steps are not.

Example 12

Figure 24:
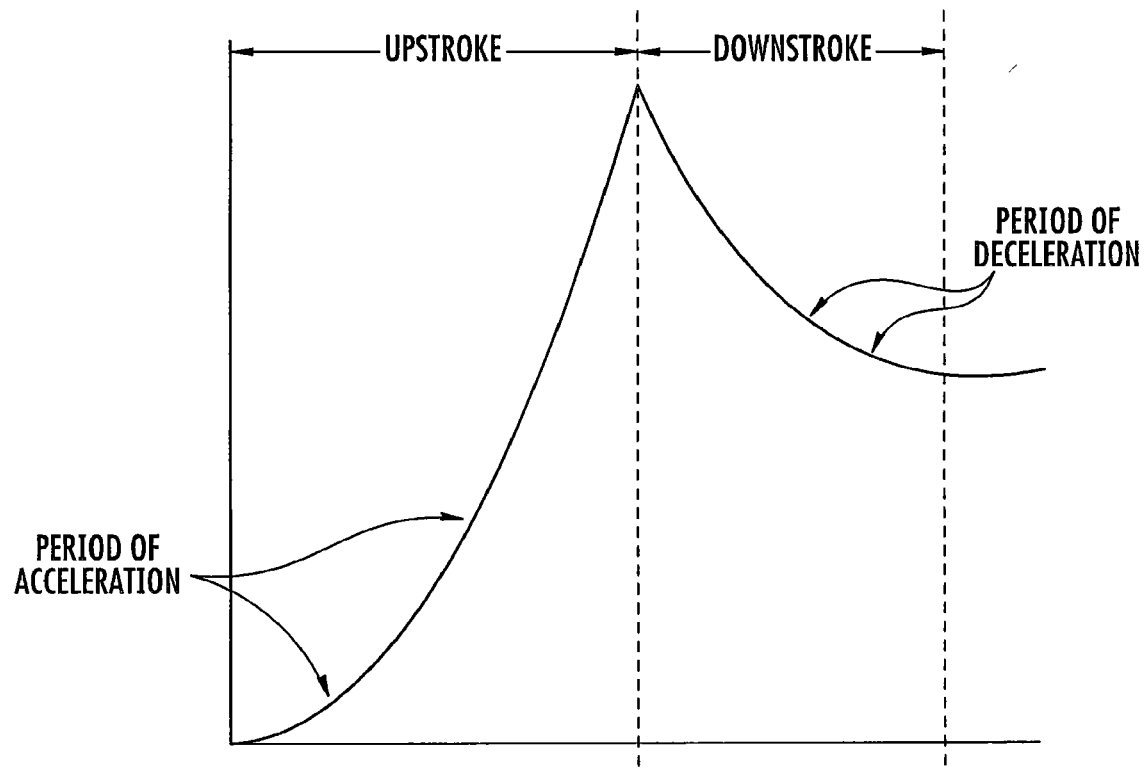
FIG. 24 is a detailed illustration of a reciprocation step of FIG. 23, showing a period of acceleration occurring during the upstroke (i.e., a gradual start of the upstroke) and a period of deceleration occurring during the downstroke (i.e., a gradual end to the downstroke).

Acceleration During Reciprocation Upstroke and Deceleration During Reciprocation Downstroke to Enhance Part Quality We observe that there is a limiting speed of upstroke, and corresponding downstroke, which if exceeded causes a deterioration of quality of the part or object being fabricated (possibly due to degradation of soft regions within the gradient of polymerization caused by lateral shear forces a resin flow). To reduce these shear forces and/or enhance the quality of the part being fabricated, we introduce variable rates within the upstroke and downstroke, with gradual acceleration occurring during the upstroke and gradual deceleration occurring during the downstroke, as schematically illustrated in FIG. 24.

Example 13

Fabrication in Multiple Zones

FIG. 25 schematically illustrates the movement of the carrier (z) over time (t) in the course of fabricating a three-dimensional object by methods as described above, through a first base (or "adhesion") zone, an optional second transition zone, and a third body zone. The overall process of forming the three-dimensional object is thus divided into three (or two) immediately sequential segments or zones. The zones are preferably carried out in a continuous sequence without pause substantial delay (e.g., greater than 5 or 10 seconds) between the three zones, preferably so that the gradient of polymerization is not disrupted between the zones.

The first base (or "adhesion") zone includes an initial light or irradiation exposure at a higher dose (longer duration and/or greater intensity) than used in the subsequent transition and/or body zones. This is to obviate the problem of the carrier not being perfectly aligned with the build surface, and/or the problem of variation in the positioning of the carrier from the build surface, at the start of the process, by insuring that the resin is securely polymerized to the carrier. Note an optional reciprocation step (for initial distributing or pumping of the polymerizable liquid in or into the build region) is shown before the carrier is positioned in its initial, start, position. Note that a release layer (not shown) such as a soluble release layer may still be included between the carrier and the initial polymerized material, if desired. In general, a small or minor portion of the three-dimensional object is produced during this base zone (e.g., less than 1, 2 or 5 percent by volume). Similarly, the duration of this base zone is, in general, a small or minor portion of the sum of the durations of the base zone, the optional transition zone, and the body zone (e.g., less than 1, 2 or 5 percent).

Immediately following the first base zone of the process, there is optionally (but preferably) a transition zone. In this embodiment, the duration and/or intensity of the illumination is less, and the displacement of the oscillatory step less, compared to that employed in the base zone as described above. The transition zone may (in the illustrated embodiment) proceed through from 2 or 5, up to 50 or more oscillatory steps and their corresponding illuminations. In general, an intermediate portion (greater than that formed during the base zone, but less than that formed of during the body zone), of the three dimensional object is produced during the transition zone (e.g., from 1, 2 or 5 percent to 10, 20 or 40 percent by volume). Similarly, the duration of this transition zone is, in general, greater than that of the base zone, but less than that of the body zone (e.g., a duration of from 1, 2 or 5 percent to 10, 20 or 40 percent that of the sum of the durations of the base zone, the transition zone, and the body zone (e.g., less than 1, 2 or 5 percent).

Immediately following the transition zone of the process (or, if no transition zone is included, immediately following the base zone of the process), there is a body zone, during which the remainder of the three-dimensional object is formed. In the illustrated embodiment, the body zone is carried out with illumination at a lower dose than the base zone (and, if present, preferably at a lower dose than that in the transition zone), and the reciprocation steps are (optionally but in some embodiments preferably) carried out at a smaller displacement than that in the base zone (and, if present, optionally but preferably at a lower displacement than in the transition zone). In general, a major portion, typically greater than 60, 80, or 90 percent by volume, of the three-dimensional object is produced during the transition zone. Similarly, the duration of this body zone is, in general, greater than that of the base zone and/or transition zone (e.g., a duration of at least 60, 80, or 90 percent that of the sum of the durations of the base zone, the transition zone, and the body zone).

Note that, in this example, the multiple zones are illustrated in connection with an oscillating mode of fabrication, but the multiple zone fabrication technique described herein may also be implemented with other modes of fabrication as illustrated further in the examples below (with the transition zone illustrated as included, but again being optional).

Example 14

Fabrication with Intermittent (or "Strobe") Illumination

The purpose of a "strobe" mode of operation is to reduce the amount of time that the light or radiation source is on or active (e.g., to not more than 80, 70, 60, 50, 40, or 30 percent of the total time required to complete the fabrication of the three-dimensional object), and increase the intensity thereof (as compared to the intensity required when advancing is carried out at the same cumulative rate of speed without such reduced time of active illumination or radiation), so that the overall dosage of light or radiation otherwise remains substantially the same. This allows more time for resin to flow into the build region without trying to cure it at the same time. The strobe mode technique can be applied to any of the existing general modes of operation described herein above, including continuous, stepped, and oscillatory modes, as discussed further below.

Figure 26A:
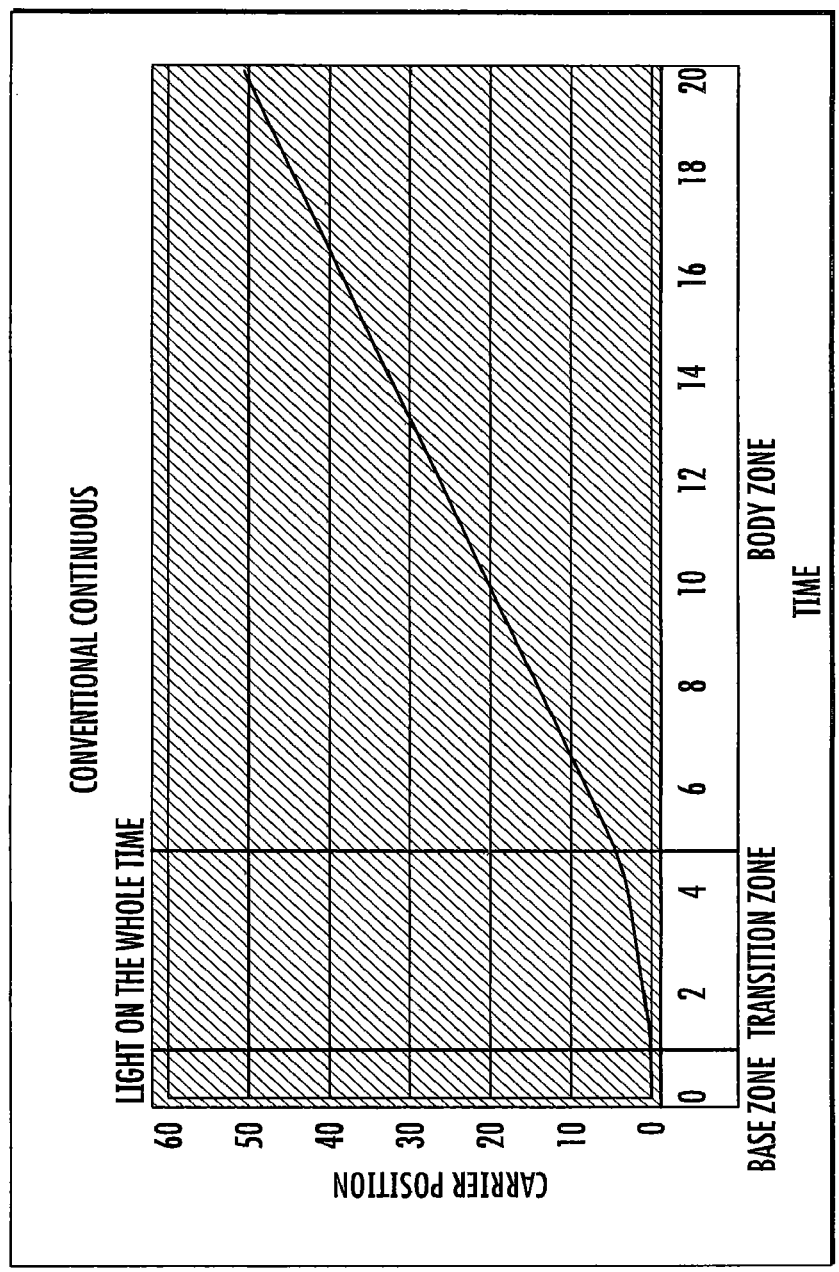
FIG. 26A schematically illustrates the movement of the carrier (z) over time (t) in the course of fabricating a three-dimensional object by continuous advancing and continuous exposure.

FIG. 26A schematically illustrates one embodiment of continuous mode. In the conventional continuous mode, an image is projected and the carrier starts to move upwards. The image is changed at intervals to represent the cross section of the three-dimensional object being produced corresponding to the height of the build platform. The speed of the motion of the build platform can vary for a number of reasons. As illustrated, often there is a base zone where the primary goal is to adhere the object to the build platform, a body zone which has a speed which is suitable for the whole object being produced, and a transition zone which is a gradual transition from the speed and/or dosages of the base zone to the speeds and/or dosages of the body zone. Note that cure is still carried out so that a gradient of polymerization, which prevents the formation of layer-by-layer fault lines, in the polymerizable liquid in the build region, is preferably retained, and with the carrier (or growing object) remaining in liquid contact with the polymerizable liquid, as discussed above.

Figure 26B:
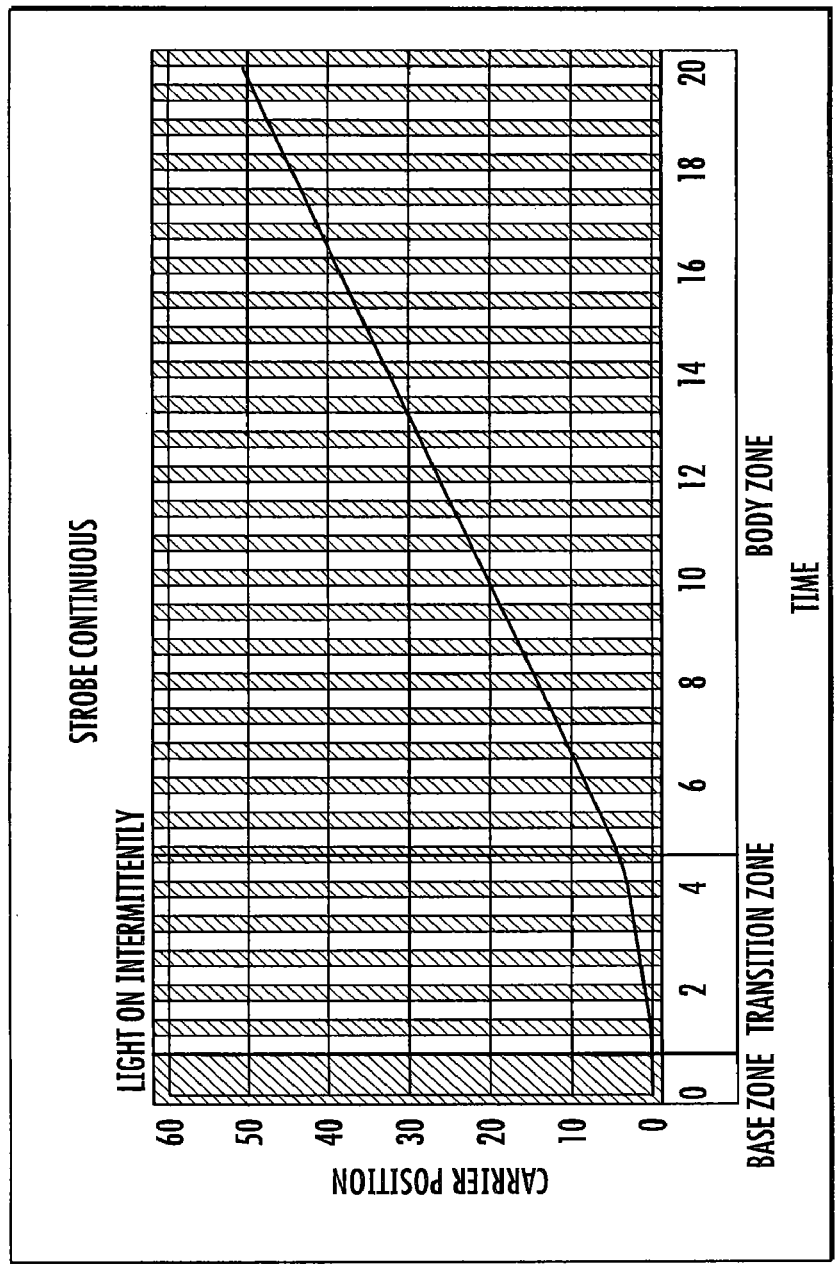
FIG. 26B illustrates the fabrication of a three-dimensional object in a manner similar to FIG. 26A, except that illumination is now in an intermittent (or "strobe") pattern.

FIG. 26B schematically illustrates one embodiment of strobe continuous mode. In strobe continuous the light intensity is increased but the image is projected in short flashes or intermittent segments. The increased intensity allows the resin to cure more quickly so that the amount of flow during cure is minimal. The time between flashes lets resin flow without being cured at the same time. This can reduce problems caused by trying to cure moving resin, such as pitting.

In addition, the reduced duty cycle on the light source which is achieved in strobe mode can allow for use of increased intermittent power. For example: If the intensity for the conventional continuous mode was 5 mW/cm$^2$ the intensity could be doubled to 10 mW/cm$^2$ and the time that the image is projected could be reduced to half of the time, or the intensity could be increased 5-fold to 25 mW/cm$^2$ and the time could be reduced to $\frac{1}{5}^{th}$ of the previous light on time.

Figure 27A:
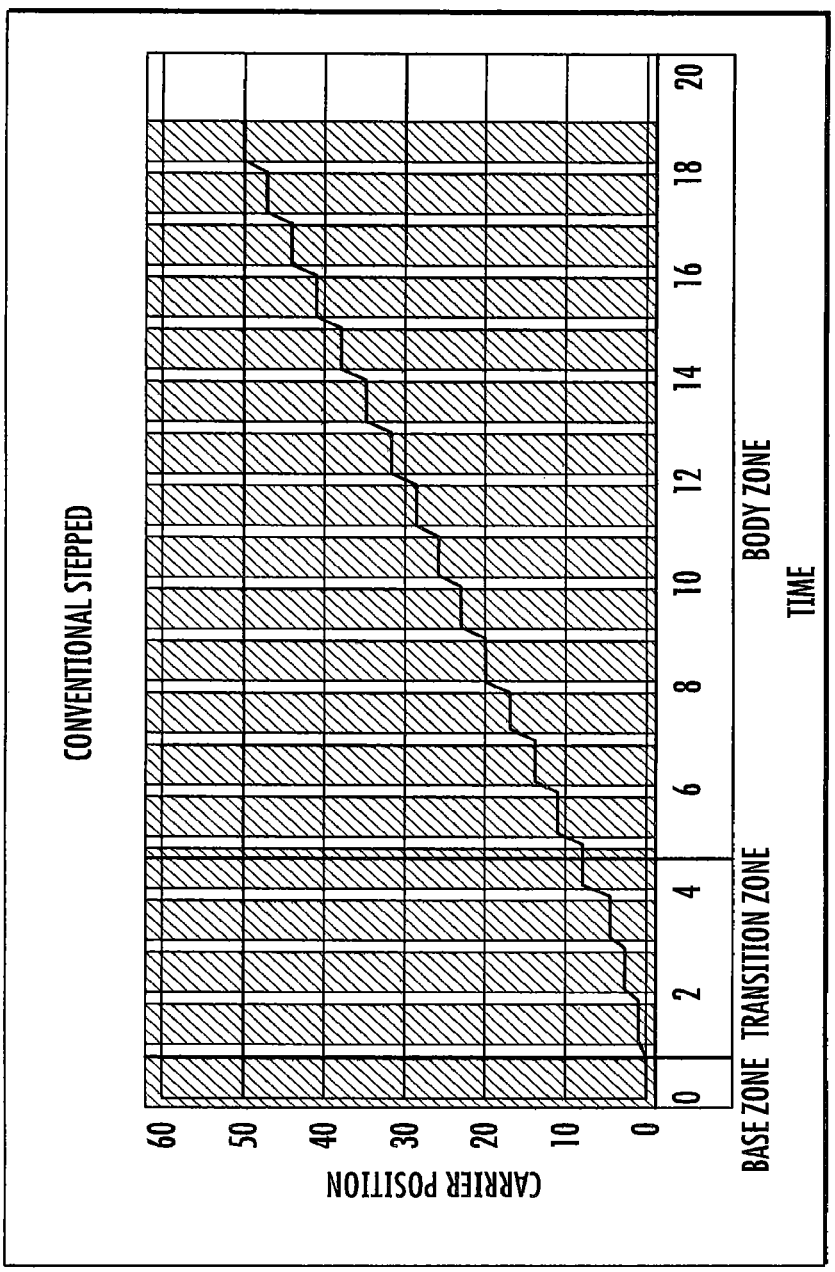
FIG. 27A schematically illustrates the movement of the carrier (z) over time (t) in the course of fabricating a three-dimensional object by intermittent (or "stepped") advancing and intermittent exposure.

FIG. 27A schematically illustrates one embodiment of stepped mode: In the conventional stepped mode an image is projected while the build platform is stationary (or moving slowly as compared to more rapid movement in between illumination). When one height increment is sufficiently exposed the image is turned off and the build platform is moved upwards by some increment. This motion can be at one speed or the speed can vary such as by accelerating from a slow speed when the thickness of uncured resin is thin to faster as the thickness of the uncured resin is thicker. Once the build platform is in the new position the image of the next cross section is projected to sufficiently expose the next height increment.

Figure 27B:
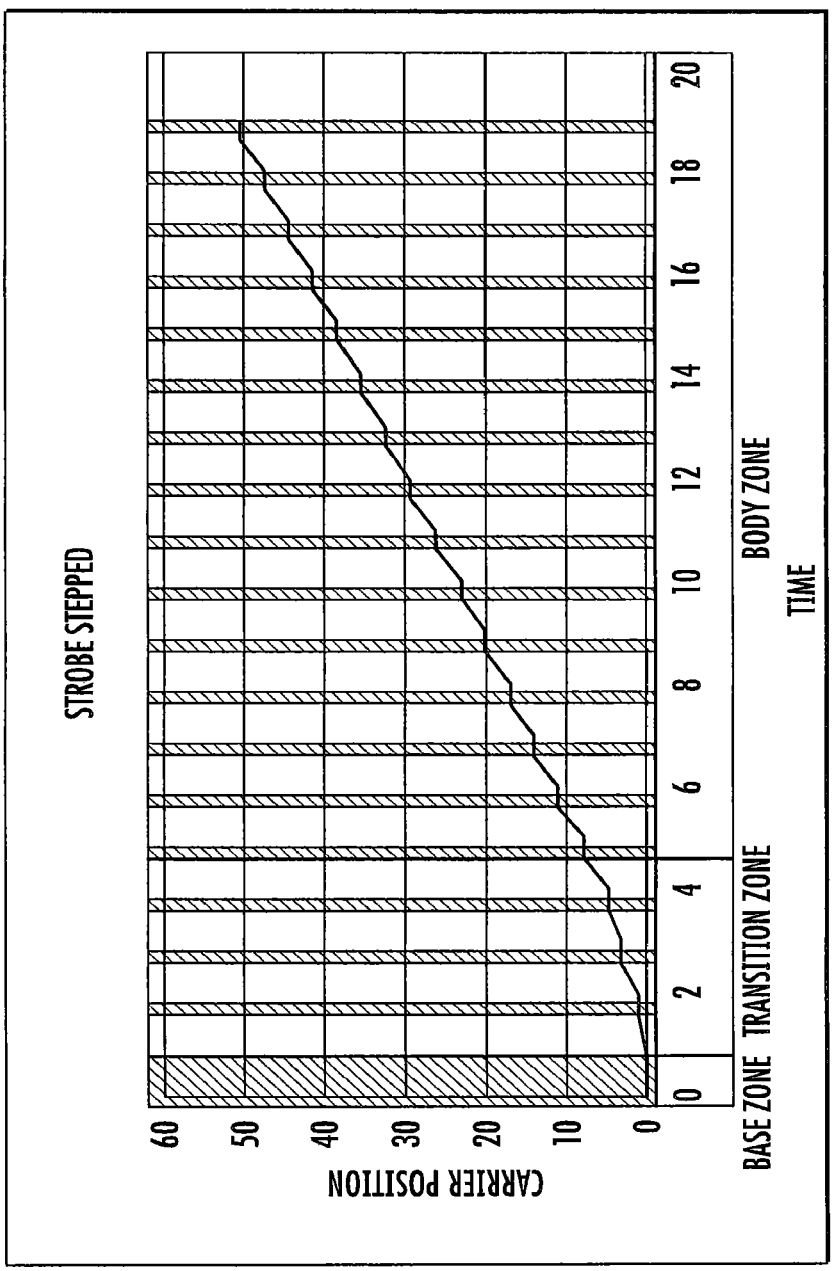
FIG. 27B illustrates the fabrication of a three-dimensional object in a manner similar to FIG. 27A, except that illumination is now in a shortened intermittent (or "strobe") pattern.

FIG. 27B schematically illustrates one embodiment of strobe stepped mode: In the strobe stepped mode the light intensity is increased and the amount of time that the image is projected is reduced. This allows more time for resin flow so the overall speed of the print can be reduced or the speed of movement can be reduced. For example: If the intensity for the conventional stepped mode was 5 mW/cm$^2$ and the build platform moves in increments of 100 um in 1 second and the image is projected for 1 second the intensity could be doubled to 10 mW/cm$^2$, the time that the image is projected could be reduced to 0.5 seconds, and the speed of movement could be reduced to 50 um/second, or the time that the stage is moving could be reduced to 0.5 seconds. The increased intensity could be as much as 5 fold or more allowing the time allotted for image projection to be reduced to $\frac{1}{5}^{th}$ or less.

Figure 28A:
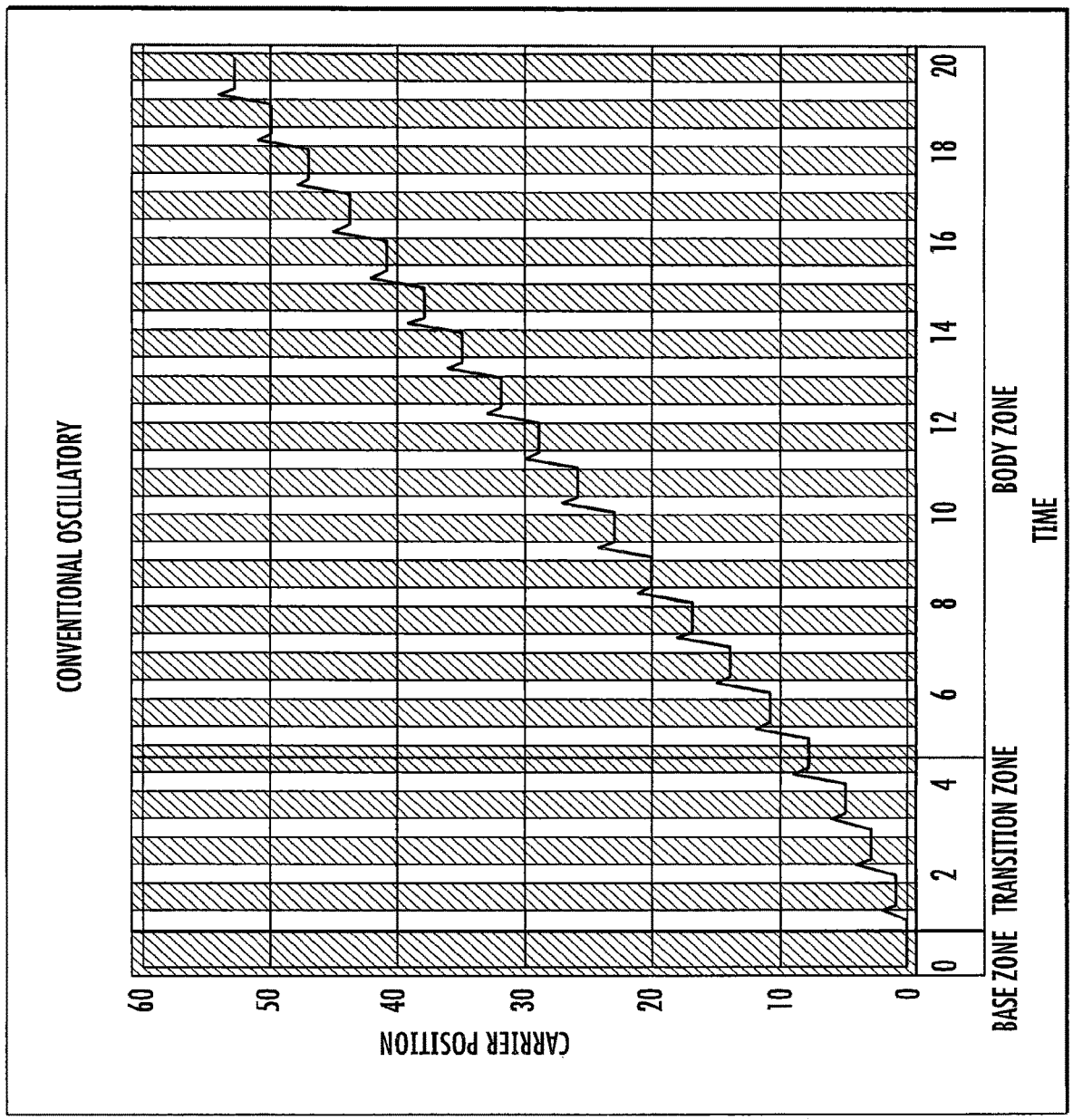
FIG. 28A schematically illustrates the movement of the carrier (z) over time (t) in the course of fabricating a three-dimensional object by oscillatory advancing and intermittent exposure.

FIG. 28A schematically illustrates one embodiment of oscillatory mode: In the oscillatory mode an image is again projected while the build platform is stationary (or moving slowly as compared to more rapid movement in-between illuminations). When one height increment is cured the image is turned off and the build platform is moved upwards to pull additional resin into the build zone and then moved back down to the next height increment above the last cured height. This motion can be at one speed or the speed can vary such as by accelerating from a slow speed when the thickness of uncured resin is thin to faster as the thickness of the uncured resin is thicker. Once the build platform is in the new position the image of the next cross section is projected to cure the next height increment.

Figure 28B:
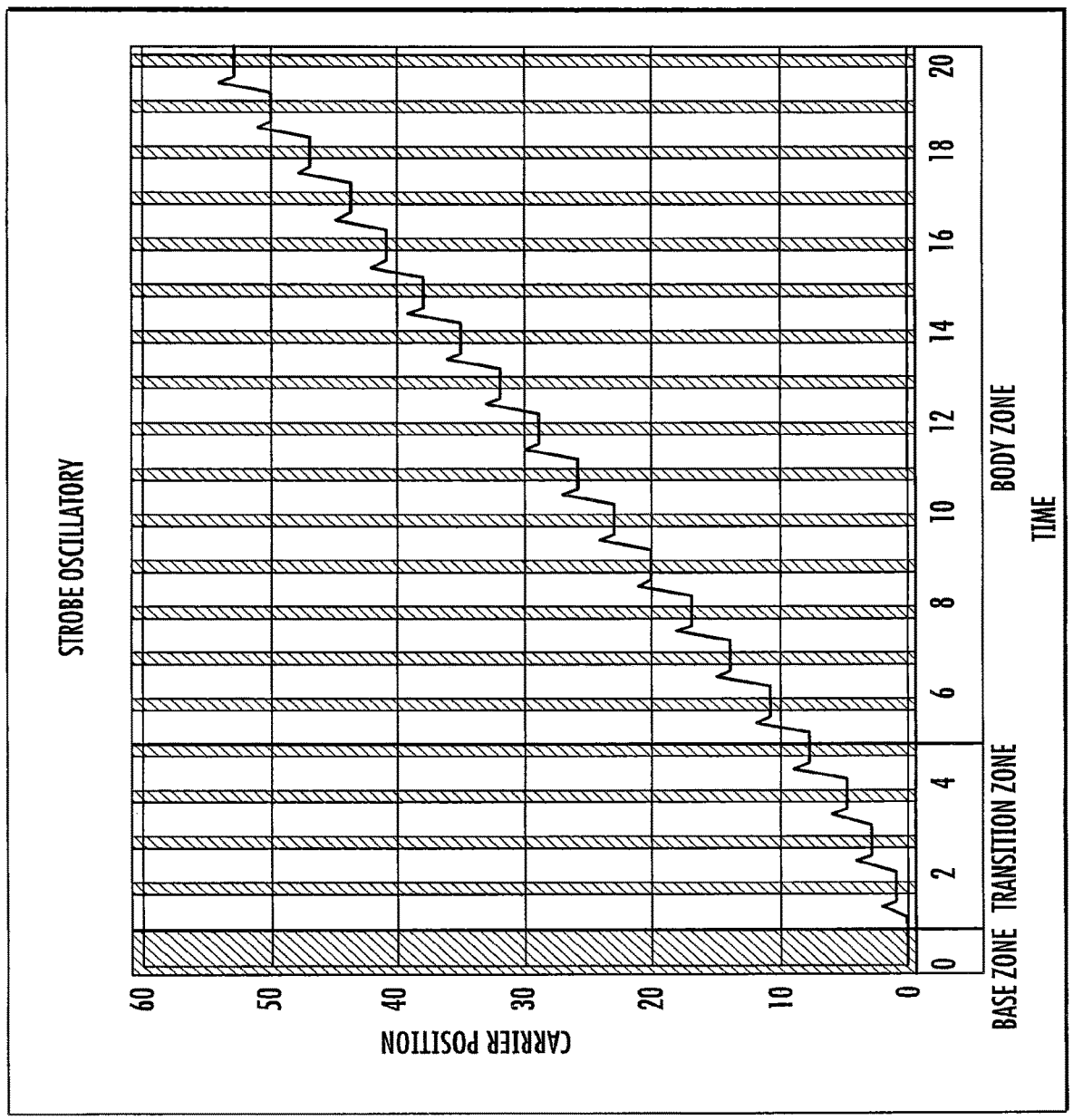
FIG. 28B illustrates the fabrication of a three-dimensional object in a manner similar to FIG. 28A, except that illumination is now in a shortened intermittent (or "strobe") pattern.

FIG. 28B illustrates one embodiment of strobe oscillatory mode. In the strobe oscillatory mode the light intensity is increased and the amount of time that the image is projected is reduced. This allows more time for resin flow so the overall speed of the print can be reduced or the speed of movement can be reduced. For example: If the intensity for the conventional oscillatory mode was 5 mW/cm$^2$ and the build platform moves up by 1 mm and back down to an increment of 100 um above the previous height in 1 second and the image is projected for 1 second the intensity could be doubled to 10 mW/cm$^2$, the time that the image is projected could be reduced to 0.5 seconds, and the speed of movement could be reduced to by half or the time that the stage is moving could be reduced to 0.5 seconds. The increased intensity could be as much as 5 fold or more allowing the time allotted for image projection to be reduced to $\frac{1}{5}^{th}$ or less. Segment "A" of FIG. 29 is discussed further below.

Figure 29B:
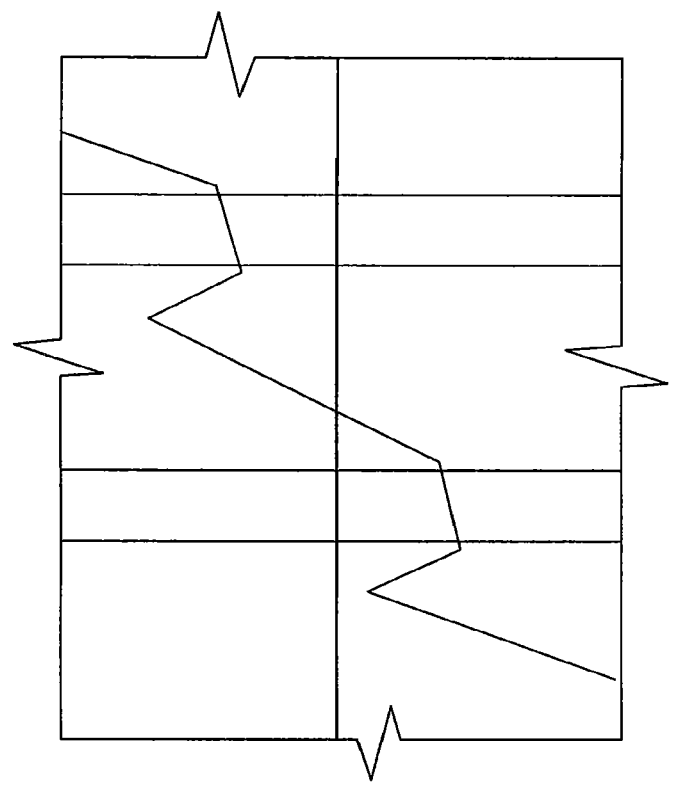
FIG. 29A schematically illustrates one segment of a "strobe" pattern of fabrication, where the duration of the static portion of the carrier has been shortened to near the duration of the "strobe" exposure.
Figure 29A:
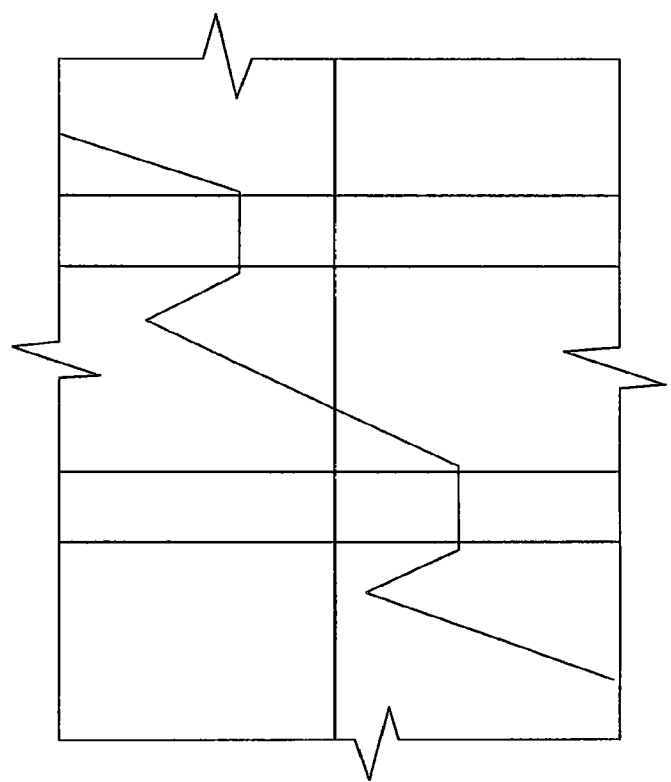

FIG. 29A illustrates a segment of a fabrication method operated in another embodiment of strobe oscillatory mode. In this embodiment, the duration of the segment during which the carrier is static is shortened to close that of the duration of the strobe illumination, so that the duration of the oscillatory segment may—if desired—be lengthened without changing the cumulative rate of advance and the speed of fabrication.

FIG. 29B illustrates a segment of another embodiment of strobe oscillatory mode, similar to that of FIG. 29, except that the carrier is now advancing during the illumination segment (relatively slowly, as compared to the upstroke of the oscillatory segment).

Example 15

Varying of Process Parameters During Fabrication

In the methods of Example 13-14, the operating conditions during the body zone are shown as constant throughout that zone. However, various parameters can be altered or modified in the course of the body zone, as discussed further below.

A primary reason for altering a parameter during production would be variations in the cross section geometry of the three-dimensional object; that is, smaller (easier to fill), and larger (harder to fill) segments or portions of the same three-dimensional object. For easier to fill segments (e.g., 1-5 mm diameter equivalents), the speed of upwards movement could be quick (up to 50-1000m/hr) and/or the pump height could be minimal (e.g., as little at 100 to 300 um). For larger cross sectional segments (e.g., 5-500 mm diameter equivalents) the speed of upward movement can be slower (e.g., 1-50 mm/hr) and/or the pump height can be larger (e.g., 500 to 5000 um). Particular parameters will, of course, vary depending on factors such as illumination intensity, the particular polymerizable liquid (including constituents thereof such as dye and filler concentrations), the particular build surface employed, etc.

In some embodiments, the overall light dosage (determined by time and intensity) may be reduced as the "bulk" of the cross section being illuminated increases. Said another way, small points of light may need higher per unit dosage than larger areas of light. Without wishing to be bound to any specific theory, this may relate to the chemical kinematics of the polymerizable liquid. This effect could cause us to increase the overall light dosage for smaller cross sectional diameter equivalents.

In some embodiments, vary the thickness of each height increment between steps or pumps can be varied. This could be to increase speed with decreased resolution requirements (that is, fabricating a portion that requires less precision or permits more variability, versus a portion of the object that requires greater precision or requires more precise or narrow tolerances). For example, one could change from 100 um increments to 200 um or 400 um increments and group all the curing for the increased thickness into one time period. This time period may be shorter, the same or longer than the combined time for the equivalent smaller increments.

In some embodiments, the light dosage (time and/or intensity) delivered could be varied in particular cross sections (vertical regions of the object) or even in different areas within the same cross section or vertical region. This could be to vary the stiffness or density of particular geometries. This can, for example, be achieved by changing the dosage at different height increments, or changing the grayscale percentage of different zones of each height increment illumination.

The foregoing is illustrative of the present invention, and is not to be construed as limiting thereof. The invention is defined by the following claims, with equivalents of the claims to be included therein.

That which is claimed is:

1. A build plate for a three-dimensional printer comprising:
   a rigid, optically transparent, gas-impermeable planar base having an upper surface and a lower surface;
   a flexible, optically transparent, gas-permeable sheet having an upper and lower surface, the sheet upper surface comprising a build surface for forming a three-dimensional object;
   a gas-permeable adhesive layer positioned between the planar base and the sheet, the adhesive layer configured to adhere the sheet to the planar base; and
   a channel layer between the planar base and the sheet, wherein the channel layer comprises a first material and the base comprises a second material that is different from the first material;
   wherein the channel layer defines channels therein to provide a gas flow enhancing feature configured to increase gas flow to the build surface.

2. The build plate of claim 1, wherein the channel layer is gas permeable, wherein the channel layer comprises a permeable polymer including poly(dimethylsiloxane) (PDMS).

3. The build plate of claim 1, wherein the channel layer defines channels on a bottom surface opposite the adhesive layer.

4. The build plate of claim 1, wherein the channel layer is adhered to the base by chemical bonding including oxidative treatment comprising oxygen plasma treatments, UV ozone treatments and/or wet chemical treatments.

5. The build plate of claim 1, wherein the adhesive layer comprises a gas-permeable adhesive, and wherein the adhesive layer comprises a poly(dimethylsiloxane) (PDMS) film.

6. The build plate of claim 1, wherein the second material comprises sapphire, glass and/or quartz.

7. The build plate of claim 1, further comprising an elastomeric layer between the channel layer and the base configured to increase an elasticity of the build plate.

8. The build plate of claim 1, wherein the gas-permeable sheet and/or channel layer comprises a poly(dimethylsiloxane) (PDMS) composite comprising fluorescent, oxygen-sensing particles for sensing oxygen.

9. The build plate of claim 7, wherein the gas-permeable sheet, elastomeric layer, and/or channel layer comprises a poly(dimethylsiloxane) (PDMS) composite comprising electrically conductive particles for heating a portion of the build plate.

10. The build plate of claim 1, further comprising an additional adhesive layer, wherein the additional adhesive layer is positioned on the base upper surface and the channel layer is a mesh layer positioned on the additional adhesive layer opposite the base, and wherein the adhesive layer is positioned between the sheet lower surface and the mesh layer to adhere the sheet to the mesh layer.

11. The build plate of claim 10, wherein the mesh layer comprises a polyester screen mesh or a fiberglass fabric, wherein the mesh layer is optically transparent.

12. An apparatus for forming a three-dimensional object from a polymerizable liquid, comprising:
   (a) a support;
   (b) a carrier operatively associated with said support on which carrier said three-dimensional object is formed;
   (c) an optically transparent member having a build surface, with said build surface and said carrier defining a build region therebetween;
   (d) a liquid polymer supply operatively associated with said build surface and configured to supply polymerizable liquid into said build region for solidification or polymerization;
   (e) a radiation source configured to irradiate said build region through said optically transparent member to form a solid polymer from said polymerizable liquid;
   (f) optionally at least one drive operatively associated with either said transparent member or said carrier;
   (g) a controller operatively associated with said carrier and said radiation source and configured to control for advancing said carrier away from said build surface to form said three-dimensional object from said solid polymer;

wherein said optically transparent member comprises a build plate comprising:

a rigid, optically transparent, gas-impermeable planar base having an upper surface and a lower surface;

a flexible, optically transparent, gas-permeable sheet having an upper and lower surface, the sheet upper surface comprising a build surface for forming a three-dimensional object;

a gas-permeable adhesive layer positioned between the planar base and the sheet, the adhesive layer configured to adhere the sheet to the planar base; and a channel layer between the planar base and the sheet, wherein the channel layer comprises a first material and the base comprises a second material that is different from the first material;

wherein the channel layer defines channels therein to provide a gas flow enhancing feature configured to increase gas flow to the build surface.

13. The apparatus of claim 12, wherein the channel layer is gas permeable, wherein the channel layer comprises a permeable polymer including poly(dimethylsiloxane) (PDMS).

14. The apparatus of claim 12, wherein the channel layer defines channels on a bottom surface opposite the adhesive layer.

15. The apparatus of claim 12, wherein the channel layer is adhered to the base by chemical bonding including oxidative treatment comprising oxygen plasma treatments, UV ozone treatments and/or wet chemical treatments.

16. The apparatus of claim 12, wherein the adhesive layer comprises a gas-permeable adhesive, and wherein the adhesive layer comprises a poly(dimethylsiloxane) (PDMS) film.

17. The apparatus of claim 12, wherein the second material comprises sapphire, glass and/or quartz.

18. The apparatus of claim 12, further comprising an elastomeric layer between the channel layer and the base configured to increase an elasticity of the build plate.

19. The apparatus of claim 12, wherein the gas-permeable sheet and/or channel layer comprises a poly(dimethylsiloxane) (PDMS) composite comprising fluorescent, oxygen-sensing particles for sensing oxygen.

20. The apparatus of claim 19, wherein the gas-permeable sheet, elastomeric layer, and/or channel layer comprises a poly(dimethylsiloxane) (PDMS) composite comprising electrically conductive particles for heating a portion of the build plate.

21. The apparatus of claim 12, further comprising an additional adhesive layer, wherein the additional adhesive layer is positioned on the base upper surface and the channel layer is a mesh layer positioned on the additional adhesive layer opposite the base, and wherein the adhesive layer is positioned between the sheet lower surface and the mesh layer to adhere the sheet to the mesh layer.

22. The apparatus of claim 21, wherein the mesh layer comprises a polyester screen mesh or a fiberglass fabric, wherein the mesh layer is optically transparent.

* * * * *

UNITED STATES PATENT AND TRADEMARK OFFICE
CERTIFICATE OF CORRECTION

PATENT NO. : 11,518,096 B2
APPLICATION NO. : 17/150102
DATED : December 6, 2022
INVENTOR(S) : Moore et al.

It is certified that error appears in the above-identified patent and that said Letters Patent is hereby corrected as shown below:

On the Title Page

Item (63) Related U.S. Application Data: Please add --Provisional Application No. 62/102,840 filed on January 13, 2015--

In the Specification

Column 6, Line 13: Please add before Fig. 30: --Figure 29B is a schematic illustration of a segment of a strobe pattern of fabrication similar to Figure 29A, except that the carrier is now moving slowly upward during the period of strobe illumination.--

Column 15, Line 25: Please correct "KIS Slicer" to read --KISSlicer--

Column 17, Line 42: Please correct "0.1 1," to read --0.1, 1,--

Column 18, Line 57: Please correct "thereof" to read --thereof.--

Column 22, Line 43: Please correct "0.1 1," to read --0.1, 1,--

Column 28, Line 14: Please correct "(or Strobe")" to read --(or "Strobe")--

Column 29, Lines 20-21: Please remove the paragraph break between "only." and "Maximum"

Column 30, Lines 8-9: Please remove the paragraph break between "sheet." and "In this configuration,"

Column 38, Line 14: Please correct "channels 1822 1722 and" to read --channels 1722 and--

Column 47, Line 6: Please correct "exposed durring setup" to read --exposed during setup--

Signed and Sealed this
Fourth Day of April, 2023

Katherine Kelly Vidal
*Director of the United States Patent and Trademark Office*

CERTIFICATE OF CORRECTION (continued)
U.S. Pat. No. 11,518,096 B2

Column 54, Line 37: Please correct "the minim" to read --the min--

Column 57, Line 19: Please correct "exposed durring setup" to read --exposed during setup--

In the Claims

Column 66, Line 67, Claim 12: Please correct "control for advancing" to read --control advancing--